United States Patent
Barlow et al.

(10) Patent No.: US 9,231,219 B2
(45) Date of Patent: Jan. 5, 2016

(54) N-DOPING OF ORGANIC SEMICONDUCTORS BY BIS-METALLOSANDWICH COMPOUNDS

(75) Inventors: Stephen Barlow, Atlanta, GA (US); Yabing Qi, Plainsboro, NJ (US); Antoine Kahn, Princeton, NJ (US); Seth Marder, Atlanta, GA (US); Sang Bok Kim, Cambridge, MA (US); Swagat K. Mohapatra, Atlanta, GA (US); Song Guo, Atlanta, GA (US)

(73) Assignees: Georgia Tech Research Corporation, Atlanta, GA (US); Princeton University, Princeton, NJ (US)

( * ) Notice: Subject to any disclaimer, the term of this patent is extended or adjusted under 35 U.S.C. 154(b) by 2 days.

(21) Appl. No.: 14/126,319

(22) PCT Filed: Jun. 13, 2012

(86) PCT No.: PCT/US2012/042287
§ 371 (c)(1),
(2), (4) Date: Jun. 23, 2014

(87) PCT Pub. No.: WO2013/055410
PCT Pub. Date: Apr. 18, 2013

(65) Prior Publication Data
US 2014/0302635 A1    Oct. 9, 2014

Related U.S. Application Data

(60) Provisional application No. 61/496,667, filed on Jun. 14, 2011.

(51) Int. Cl.
*H01L 51/40* (2006.01)
*H01L 51/00* (2006.01)

(52) U.S. Cl.
CPC ............ *H01L 51/009* (2013.01); *H01L 51/002* (2013.01); *H01L 51/0002* (2013.01); *H01L 51/0083* (2013.01); *H01L 51/0084* (2013.01); *H01L 51/0085* (2013.01); *H01L 51/0086* (2013.01); *Y02E 10/549* (2013.01)

(58) Field of Classification Search
USPC .......................................................... 438/99
See application file for complete search history.

(56) References Cited

U.S. PATENT DOCUMENTS

| | | |
|---|---|---|
| 2007/0029594 A1 | 2/2007 | Tamura |
| 2007/0278479 A1 | 12/2007 | Werner |
| 2007/0295941 A1 | 12/2007 | Kahn |

FOREIGN PATENT DOCUMENTS

WO    2005036667    4/2005

OTHER PUBLICATIONS

Chan and Kahn, "N-doping of pentacene by decamethylcobaltocene" Appl. Phys. A, 95(1): 7-13 (2009).

(Continued)

*Primary Examiner* — Timor Karimy
(74) *Attorney, Agent, or Firm* — Pabst Patent Group LLP

(57) ABSTRACT

The various inventions disclosed, described, and/or claimed herein relate to the field of methods for n-doping organic semiconductors with certain bis-metallosandwich compounds, the doped compositions produced, and the uses of the doped compositions in organic electronic devices. Metals can be manganese, rhenium, iron, ruthenium, osmium, rhodium, or iridium. Stable and efficient doping can be achieved.

13 Claims, 22 Drawing Sheets

(56) References Cited

OTHER PUBLICATIONS

Chan, et al., "Decamethylcobaltocene as an efficient n-dopant in organic electronic materials and devices", Organic Electronics, 9:575-81 (2008).

Chan, et al., Influence of chemical doping on the performance of organic photovoltaic cells Appl. Phys. Lett., 94:2003306 (2009b).

Chan, et al., "N-type doping of an electron-transport material by controlled gas-phase incorporation of cobaltocene", Chem. Phys Lett., 431:67-71(2006).

Connelly, et al, "Chemical Redox Agents for Organometallic Chemistry", Chem Rev., 96: 877-910 (1996).

Domrachev, et al., "The structure of fullerene films and their metallocene doping", Russ. Chem. Bull., 43(8) 1305-9 (1994).

Fischer, et al., "About aromatenkomplexe metal: LXXXVIII. About monomeric and dimeric dicyclopentadienyl rhodium and dicyclopentadienyliridium and a new method for presentation of uncharged metal-aromatic complex", J Organomet. Chem., 5:559-67 (1966).

Fong, et al., "Hole injection in a model fluorene-triarylamine copolymer", Adv Funct. Mater., 19:304 (2009).

Gusev, et al., "Electrochemical generation of 19- and 20-electron rhodocenium complexes and their properties",J. Orgmet. Chem, 452: 219-22, (1993).

Gusev, et al, "Reduction of iridocenium salts [Ir(•5-C5Me5)(•5-L)]+ (L = C5H5, C5Me5, C9H7); ligand-to-ligand dimerisation induced by electron transfer", J. Organomet. Chem., 531, 95-100 (1997).

Gusev, et al, "Reduction of ruthenium arenecyclopentadienyl complexes reactions induced by electron transfer", J. Organomet. Chem., 534:57-66 (1997b).

Hamilton, et al., "High-Performance Polymer-Small Molecule Blend Organic Transistors", Adv.Mater. 21(10-11): 1166-71 (2009).

Hamon, et al, "Syntheses, characterizations, and stereoelectronic stabilization of organometallic electron reservoirs: the 19-electron d7 redox catalysts .eta.5-C5R5Fe-.eta.6-C6R'6", J.Am. Chem. Soc., 103:758-66 (1981).

Hwang, et al., "Photoelectron Spectroscopic Study of the Electronic Band Structure of Polyfluorene and Fluorene-Arylamine Copolymers at Interfaces", J. Phys. Chem., 111(3): 1378-84 (2007).

Neto, et al., "Improvements in the Preparation of Cyclopentadienyl Thallium andMethylcyclopentadienylthallium and in Their Use in Organometallic Chemistry", Synth. React. Inorg. Met-Org. Chem., 27:1299-1314 (1997).

Qi, et al., "A Molybdenum Dithiolene Complex as p-Dopant for Hole-Transport Materials: A Multitechnique Experimental and Theoretical Investigation", Chem. Mat., 22: 524-31 (2010).

Shirota, et al., "Chargr carrier transporting molecular materials and their applications in devices", Chem Rev., 107:953-1010 (2007).

Steinmetz, et al., "Convenient Synthesis of [(•5-C5Me5)Ru(NCMe)3]PF6 and the Phosphine Derivatives [(•5-C5Me5)Ru(PR3)2(NCMe)]PF6", Organometallics, 18(5):943-6 (1999).

Walzer, et al., "Highly efficient organic devices based on electrically doped transport layers", Chem. Rev., 107:1233-71 (2007).

Wu, et al., "Electron-hole interaction energy in the organic molecular semiconductor PTCDA", Chem. Phys. Lett. 272:43-7 (1997).

Yan, et al., A high-mobility electron-transporting polymer for printed transistors, Nature, 457:679-86 (2009).

Yue, et al., "Novel NIR-absorbing conjugated polymers for efficient polymer solar cells: effect of alkyl chain length on device performance", J. Mater. Chem., 19:2199-206 (2009).

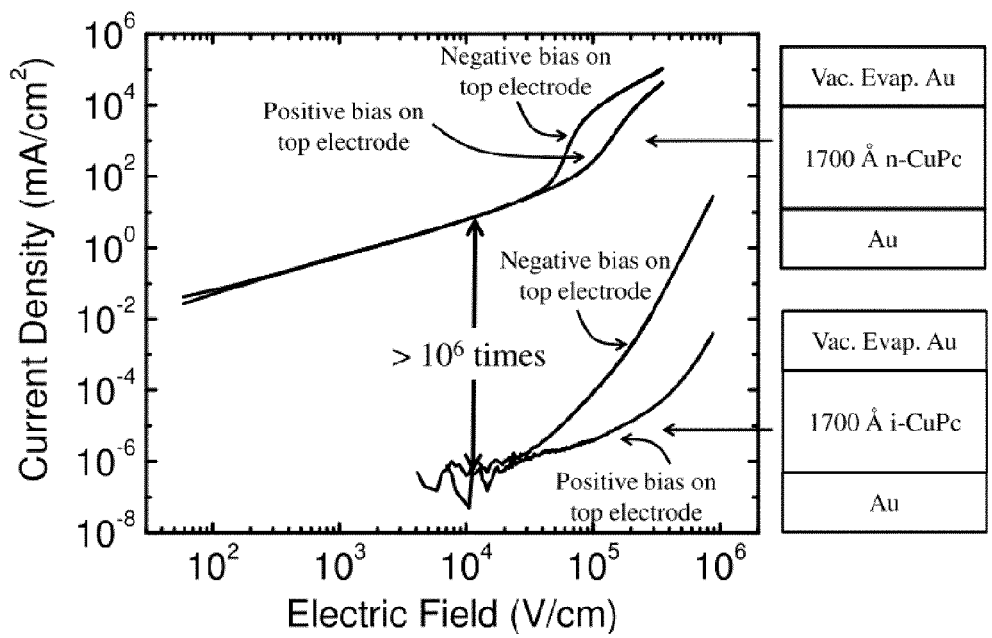
Figure 7c
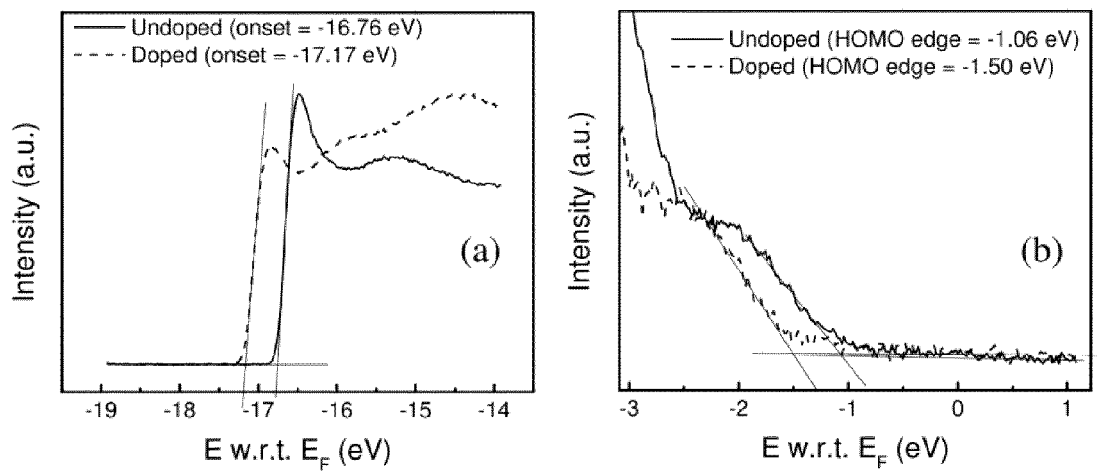
Figure 8a                    Figure 8b

N-DOPING OF ORGANIC SEMICONDUCTORS BY BIS-METALLOSANDWICH COMPOUNDS

RELATED APPLICATIONS

This application claims priority to US provisional application Ser. No. 61/496,667 filed Jun. 14, 2011, the complete disclosure of which is hereby incorporated by reference in its entirety.

STATEMENT OF GOVERNMENT LICENSE RIGHTS

The Princeton inventors received partial funding support through the National Science Foundation under Grant Number DMR-0705920 and the Princeton MRSEC of the National Science Foundation under Grant number DMR-08 19860. The Georgia Tech inventors received partial funding support through the National Science Foundation under Grant Number DMR-0120967, the Department of Energy, Basic Energy Sciences under Grant number DE-FG02-07ER46467, and the Office of Naval Research under Grant number. N00014-11-1-0313. The Federal Government has certain rights in these inventions.

BACKGROUND

Production of components of electronic devices such as transistors, solar cells, light emitting diodes, and similar devices from inorganic semiconductors based on silicon, germanium, or gallium arsenide is very well known in the art, as is the use of dopants in the manufacture of such inorganic semiconductors. Atoms of "n-dopant" inorganic elements that are electrically neutral, but comprise one or more extra valence electrons as compared to the basic inorganic semiconductor material are typically doped directly into the inorganic semiconductor lattice as impurities. and thereby provide potentially current-carrying electrons into the delocalized conduction bands that occur in such "n-type" inorganic semiconductors. Technology for directly "doping" traditional inorganic semiconductors produces electronic semiconductors with very good electrical performance, but the production costs can be very high, and the rigid and expensive inorganic semiconductors are not suitable for some very desirable end use applications of high potential interest.

There has been much recent work directed toward developing large area and/or "printable" electronic components and devices based on organic semiconductors (organic small molecules, oligomers, or polymers) that can potentially be solution processed at much lower cost, perhaps on flexible substrates such as plastic or paper, so that many new potential circuits, electronic devices, or end-use applications can be developed.

There are important differences between the inorganic and organic semiconductors. For example, there are generally not completely delocalized "bands" or "conduction states" for electrons or holes in organic semiconductors that extend throughout the bulk solids. While hole and/or electrons can migrate within the conjugated $\pi$ orbitals of unsaturated organic semiconductor molecules, macroscopic conduction of current is typically limited by quantum mechanical "hopping" of holes or electrons between neighboring but distinct organic molecules in the solid state.

Controlled chemical doping of organic semiconductor materials is known in the art as a technique to improve the electrical conductivity and/or electrical performance of some types of organic semiconducting materials and/or devices. See for example Walzer et al, *Chem. Rev.* 2007, 107, 1233-127, which describes both general principals of doping in organic semiconductors, and many specific applications in organic light emitting diodes ("OLEDs"), and organic photovoltaic cells ("OPV"). In n-type doping of organic semiconductors, the n-type dopants typically reductively donate electrons into the lowest unoccupied molecular orbitals ("LUMO") of the organic semiconductor compounds, to form at least a few anions among the remaining undoped organic semiconductor molecules. and the n-dopant compound is oxidized to a cation in the process. In the presence of an electrical potential difference, the electrons injected into the LUMOs typically "hop" between the n-doped organic semiconductor molecules, to carry the electrical current.

It is believed in the art that two major functions of directly n-doping organic semiconductor compositions, are (i) increasing the density of "free" electron current carriers available for conduction, and/or (ii) preferential filling of deep trap states, a trap typically being associated with an impurity or a defect with a lower lying empty orbital than the semiconductor, or a flaw, i.e. static or dynamic disorder, in the solid state structure, thereby reducing the activation energy required for the "hopping" transport process of the electrons from organic molecule to organic molecule. Additionally, directly doping organic materials at electrode interfaces can reduce contact resistances by providing improved electron or hole tunneling through narrow interface depletion regions, and by manipulating the molecular energy level alignments at organic-organic hetero-junctions; these reductions can sometimes provide orders-of-magnitude increases in the conductivity of organic films. The positively charged cation derived from the n-dopant material may position itself within the semiconductor solid, and/or disrupt its solid state structure in many ways. If the cations derived from an n-dopant molecule are small (such as alkali metal cations), they will be less likely to disrupt the semiconductor's solid structure; however, they may undesirably migrate within the organic lattice and/or between different structures within a doped device, as well as acting as electrostatic traps for electrons on neighboring semiconductor molecules.

Moreover, as noted by Walzer et al, and many others of skill in the art, "In contrast to p-type doping, n-type molecular doping is intrinsically more difficult .... For efficient doping, the HOMO level of the dopant must be energetically above the LUMO level of the matrix material which makes such materials unstable against oxygen. With increasing LUMO energy, the difficulty to find suitable materials is increased." It has indeed proven difficult to identify stable and easily processable n-type dopant molecules that are sufficiently strong reducing agents as to be able to dope electrons into the high lying LUMOs of many organic semiconductors of interest. When sufficiently strong n-dopants have been identified, they have themselves often been chemically unstable, or unstable if exposed to air or water while being processed, or after processing. In many cases the n-doped semiconductors themselves are also unstable to oxidation by air and/or water.

Accordingly, there remains an unmet need in the art for much improved n-dopant materials, and methods for their use, and improved n-doped semiconductor compositions, in order to make improved and economically viable n-doped organic semiconductors devices comprising those n-doped organic semiconductors, for applications in organic field effect transistors, organic solar cells, and organic light emitting diodes. It is to that end that the various embodiments of the inventions described below are directed.

WO 2005/036667 and its US Equivalent US 2007/0278479 disclosed the use of certain highly reducing monomeric and electrochemically generated ruthenium terpyridine and chromium bipyridine complexes as reducing agents for fullerenes, and zinc phthalocyanine.

The cobaltocenium cation (structure shown below) has long been known in the chemical prior art as the cation of stable "18 electron" diamagnetic salts. It has also been known in the art that the cobaltocenium cation can be reduced by one electron, by very strong inorganic reducing agents such as alkali metals, to form a neutral and monomeric "19 electron" monomeric radical compound "cobaltocene" ("Co($C_5H_5$)$_2$"). Decamethylcobaltocene ("Co($C_5Me_5$)2") and the corresponding decamethylcobaltocenium cation are also known in the chemical arts.

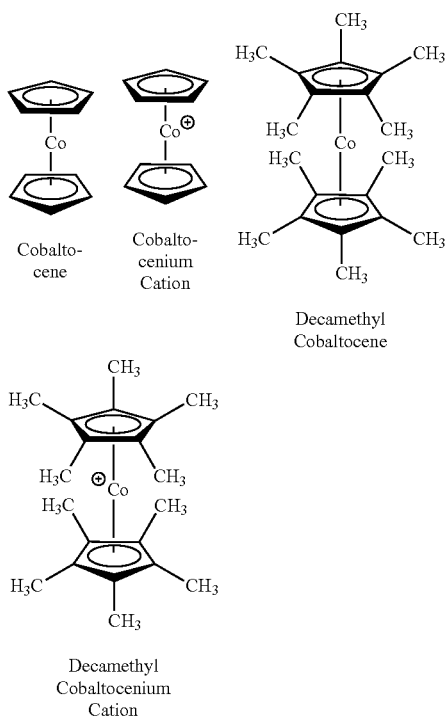

Cobaltocene

Cobaltocenium Cation

Decamethyl Cobaltocene

Decamethyl Cobaltocenium Cation

While such electrically neutral 19 electron cobaltocene compounds can be isolated, they are extremely reactive reductants towards potential oxidants such as oxygen and water, and therefore are difficult to make, handle, store, and use under ambient conditions, or in most industrial processes.

Domrachev et al (*Russ. Chem. Bull.* 43(8) 1305-1309, 1994) reported the use of neutral "19 electron" cobaltocene to reduce and/or n-dope $C_{60}$ and/or $C_{70}$ films, to induce the formation of at least some cobaltocenium fulleride salts in the doped fullerene films.

In recent years, cobaltocene and decamethylcobaltocene were also described as n-dopants for films of organic semiconductor compounds, such as copper phthalocyanine (CuPc) and pentacene. See for example Chan et al, *Chem. Phys. Lett.* 43 1 (2006) 67-71; Chan et al, *Organic Electronics* 9(2008) 575-581, Chan et al, *Appl. Phys. Lett* 94, 2003306 (2009), Chan and Kahn, *Appl. Phys. A* (2009) 95 7-13.

U.S. Patent Publication 2007/029594 disclosed and claimed the use of a variety of organometallic compounds, having a wide range of reducing power, including numerous monomeric metallocenes and other sandwich compounds, as potential n-dopants for organic semiconductors. However, many of the monomeric sandwich compounds disclosed therein are not "19 electron" radical compounds, and are not sufficiently strong reducing agents to effectively n-dope many organic semiconductor compounds or compositions of interest which have relatively low electron affinities. That patent publication more specifically described a few monomeric 19 electron sandwich compounds, such as cobaltocene, decamethyl cobaltocene, and two substituted monomeric iron-based sandwich compounds (Fe($C_5H_5$)($C_6Me_6$), and (Fe($C_5Me_5$)($C_6Me_6$)). US 2007/029594 suggested that those monomeric 19 electron compounds were effective n-dopants, and that such 19 electron metallosandwich n-dopants were superior in some respects to previously known inorganic dopants such as lithium metal, because the larger metal-losandwich cations produced by the disclosed doping processes were more resistant to undesirable mobility of the cations of the dopants within the semiconductor solids. US 2007/029594 did not however disclose or suggest methods of making and using dimeric or oligomeric metallocene compounds in its processes, or that dimeric or oligomeric bis-metallosandwich compounds would be effective n-dopants, or any other advantage of employing bis-metallosandwich compounds as n-dopants.

The literature does disclose a few attempts to reduce certain 18 electron metallosandwich cations to produce highly reducing 19 electron monomeric metallosandwich radicals, but with certain other 18 electron metallosandwich cations those attempts often result in dimerization of the 19 electron monomer, with the formation of a carbon-carbon bond between two 18 electron monomer fragments. For example, Gusev et al (*J. Orgmet. Chem,* 452, 219-222, 1993), which disclosed that an attempt to electrochemically reduce salts of the 18 electron rhodocenium cation, rather than producing a stable and neutral 19 electron rhodocene monomer, actually induced formation of a carbon-carbon bond between the rings of the rhodocene monomers, to form a reasonably chemically and air stable and isolated "rhodocene dimer," as shown below. Similar dimeric iron and iridium based metallocenes derived by reduction of $[Fe(\eta^5-C_5H_5)(\eta^6-C_6Me_nH_{6-n})]^+$ (n=0-5), $[Fe(\eta^5-C_5Me_5)(\eta^6-C_6H_6)]^+$, $[Ru(\eta^5-C_5H_5)\eta^6C_6H_6)]^+$ (R=H, Me), and $[Ir(\eta^5-C_5R'_5)(\eta^5-C_5R''_5)]^+$ (R', R''=H, Me) salts have also been subsequently reported by Gusev et al and others.

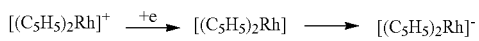

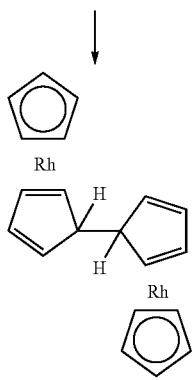

1

However, neither Gusev et al, nor prior art reports (see Gusev, et al, *J. Organomet. Chem.* 1997, 531, 95-100, Hamon, et al,

*Am. Chem. Soc.* 1981, 103, 758-766, Murr et al, *Inorg. Chem.* 1979, 1 8, 1443-1446, and Fischer, et al, *Organomet. Chem.* 1966, 5, 559-567) suggested that such dimeric metallocene compounds, which comprise two 18 electron sandwich compounds linked by a carbon-carbon bond are useful as an n-dopant for organic semiconductors.

Applicants have discovered that some bis-metallosandwich compounds described in the prior art and other bis-metallosandwich compounds described below can unexpectedly serve as unexpectedly strong, yet reasonably air and/or water stable reducing agents and/or n-dopants for a variety of organic semiconductors. Moreover, use of Applicants' methods and/or the bis-metallosandwich n-dopants described below allow the use of solution processing to produce new and unexpectedly useful n-doped compositions and organic electronic devices comprising such n-doped compositions.

SUMMARY

The various inventions and/or their many embodiments disclosed herein relate in some embodiments to a process for n-doping and/or increasing the current carrying capacity of an organic semiconductor composition or organic semiconductor compound, comprising the steps of (a) obtaining of providing an organic semiconductor composition or organic, semiconductor compound that comprises at least two aryl or heteroaryl rings bonded to each other;

(b) obtaining or providing a bis-metallosandwich compound comprising two linked metallosandwich groups, wherein (i) each metallosandwich group comprises a transition metal atom independently selected from manganese, rhenium, iron, ruthenium, osmium, cobalt, rhodium, and iridium, bonded to two aryl or heteroaryl rings that include at least one optionally substituted benzene or cyclopentadienyl ring, and (ii) one benzene or cyclopentadienyl ring from each metallosandwich group is bonded to a benzene or cyclopentadienyl ring from the other metallosandwich group by a carbon-carbon bond, (c) contacting the organic semiconductor composition or organic semiconductor compound with at least some of the bis-metallosandwich compound.

The processes of making such n-doped organic semiconductor compositions or organic semiconductor compounds are novel because of their use of the little known or studied bis-metallosandwich compounds comprising two linked metallosandwich groups as n-dopant materials.

Applicants' bis-metallosandwich compounds, which comprise two linked metallosandwich groups, have much in common with, but are somewhat more broadly defined than the "metallocene" compounds of the prior art. Some, but not all workers in the prior art narrowly define "metallocenes" to be limited to compounds formed from a transition metal atom or ion bound to the two cyclopentadienyl ($C_5H_5$) rings having a delocalized set of it orbitals forming "multi-hapto" bonds between the carbon atoms of the rings and the transition metal.

Applicants' bis-metallosandwich compounds, metallosandwich groups, and/or metallosandwich cations (see further description below) comprise a transition metal atom or ion bonded to two optionally substituted aryl or heteroaryl ring groups in a facial "multi-hapto" fashion. At least one of the two aryl or heteroaryl ring groups comprises at least one "benzene" ($C_6R_6$) or "cyclopentadienyl" ($C_5R_5$) ring that can also potentially form a carbon-carbon bond with a benzene or cyclopentadienyl ring from another metallosandwich group, so as to form the bis-metallosandwich compound. Not all the carbons of the "benzene" or "cyclopentadienyl" rings need be or remain bonded to the transition metal atom or ion, especially if they also form the carbon-carbon bond to another "benzene" or "cyclopentadienyl" ring.

The second aryl or heteroaryl ring bound to each transition metal atom or ion of a bis-metallosandwich compound, metallosandwich group, and/or metallosandwich cation can comprise any 4 to 8 membered ring with at least two multiple bonds in the ring that are also bound to the transition metal atom or ion in a "multi-hapto" fashion. For example, the second aryl or heteroaryl ring could comprise a cyclobutenyl, cyclopentadienyl, cyclohexadienyl, benzenyl, cycloheptadieyl, or cyclooctadienyl ring, or a heterocyclic variation thereof comprising oxygen, nitrogen, or silicon atoms in the ring. Any of the 4-8 membered rings may be optionally substituted with either singly bonded or fused organic or inorganic substitutent groups.

Non-limiting examples of preferred bis-metallosandwich compounds, include compounds having the structures

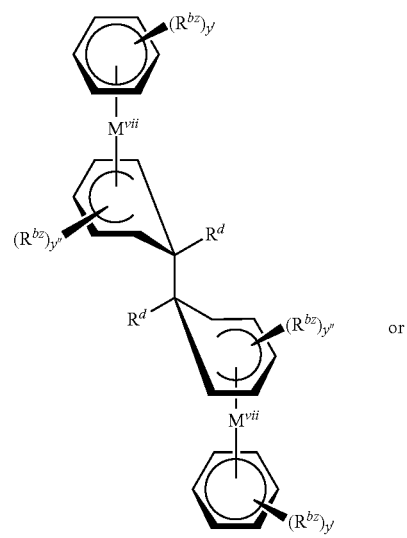

or

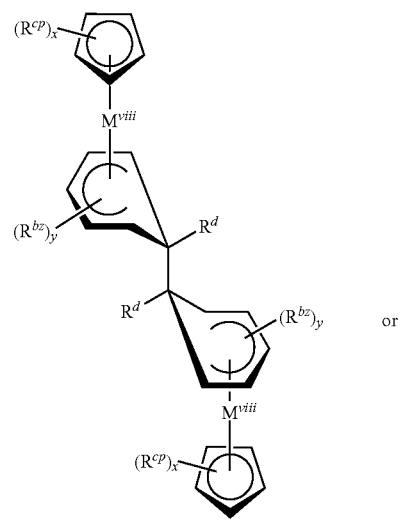

or

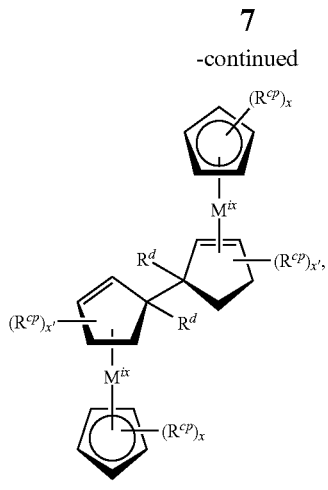

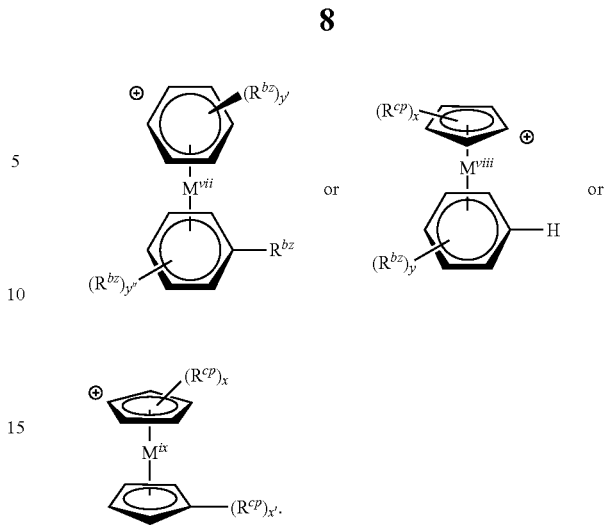

wherein
  a) $M^{vii}$ is manganese or rhenium,
  b) $M^{viii}$ is iron, ruthenium, or osmium,
  c) $M^{ix}$ is rhodium or iridium, and the identities of the various substituent groups will be further described below.

It should be noted that the carbon-carbon bond linking the two metallosandwich groups, to form the bis-metallocene compounds in the drawings shown above would appear (when literally interpreted from the drawings) to be a normal saturated carbon-carbon "single" bond, but such a characterization may not be complete or accurate. Without wishing to be bound by theories, these bonds may be involved in interactions with d-orbitals of the transition metals that affect their actual character. Nevertheless, it seems clear that such "carbon-carbon" bonds are unexpectedly weak and/or reactive, so as to be unexpectedly capable of breakage or cleavage to form monomeric metallosandwich cations, and/or induce n-doping of the organic semiconductors.

Such bis-metallosandwich compounds are nevertheless typically relatively stable to air and water as solids, and are stable to oxygen or water to varying lesser degrees in solution, and can be readily synthesized and handled, sometimes in air for periods of hours to weeks. Such bis-metallosandwich compounds also show an unexpected ability to function as unexpectedly strong reducing agents and/or 'n-dopants when they are contacted with the organic semiconductor composition or organic semiconductor compounds, either in solution or in the solid phase. At least some of the bis-metallosandwich compounds are unexpectedly strong n-dopants as compared to similar monomeric metallosandwich dopants known in the prior art, and enable the n-doping of some difficult to dope semiconductor compositions or compounds that could not be successfully prepared with prior art monomeric metallosandwich dopants.

In many embodiments of the processes described herein, the carbon-carbon bond linking the rings of the two metallosandwich groups is broken during the n-doping reactions, and two monomeric metallosandwich cations are formed, and the formation of the metallosandwich cations is accompanied by at least partial reduction of the organic semiconductor composition or semiconductor compounds, so as to produce the n-doping effect. In such embodiments, the metallosandwich cations can have the structure However, despite the unexpected combination of high reductive strength coupled with the relative ease of handling and reasonably good air and water stability of the bis-metallosandwich compounds used as n-dopants, the n-doping reactions can vary significantly in rate, in both the solid and solution states, and with the structural details of the organic semiconductor compositions or compounds, and the structure of the bis-metallosandwich compounds. When the reaction rates or fast, the bis-metallosandwich compound may only be present for a short time before the progress of the n-doping reactions rapidly convert it into the metallosandwich cations.

When the rates of the n-doping reactions are suitably slow, or nearly zero at room temperature, it can be advantageous to prepare useful intermediate chemical compositions comprising at least one organic semiconductor compound that comprises at least two aryl or heteroaryl rings bonded to each other, and at least some of a bis-metallosandwich compound having one of the structures:

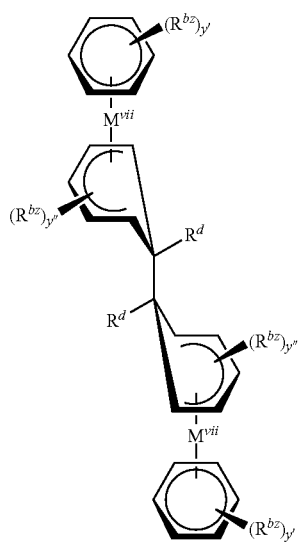

-continued

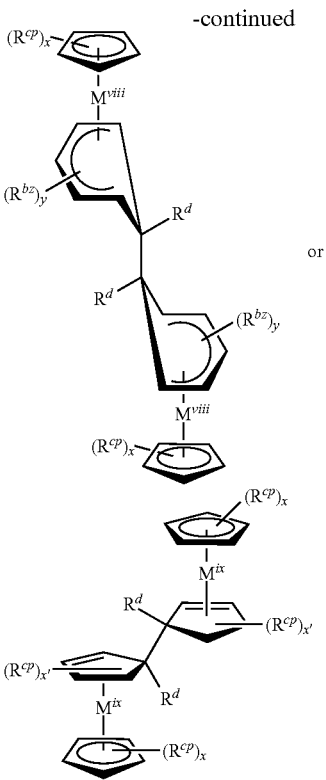

wherein
a) $M^{vii}$ is manganese or rhenium,
b) $M^{viii}$ is iron, ruthenium, or osmium,
c) $M^{ix}$ is rhodium or iridium,
d) each $R^{cp}$ and $R^{bz}$ is individually selected from hydrogen or an optionally substituted $C_1$-$C_{12}$ alkyl or $C_1$-$C_{12}$ phenyl.
e) x is an integer from 1-5,
t) x' is an integer from 1-5, and
g) y and y'' are an integer from 1-5
h) y' is an integer from 1-6.

In some such embodiments, the organic semiconductor compound does not comprise an allotrope of carbon, a fullerene, or a fullerene derivative.

Such n-doped semiconductor compositions are useful for the manufacture of a wide variety of n-doped electronic devices, such as organic field effect transistors ("OFETS"), organic photovoltaic devices ("OPVs"), and organic light emitting diodes ("OLEDs").

In view of the inherent difficulties of preparing n-doped organic semiconductor materials noted by Walzer et al and others. Applicants' new methods and compositions employ unexpected new n-dopant materials (i.e. bis-metallosandwich compounds) that allow the preparation of a wide variety of new n-doped organic semiconductor compositions and compounds that were not previously disclosed as compositions or available via prior art methods.

Further detailed description of preferred embodiments of the various inventions broadly outlined above will be provided below in the Detailed Description section provided. All references, patents, applications, tests, standards, documents, publications, brochures, texts, articles, etc. mentioned herein, either above or below, are incorporated herein by reference.

BRIEF DESCRIPTION OF THE FIGURES

FIG. 6b shows a schematic energy diagram derived from the results of the spectroscopic study of the device of FIG. 1a.

FIG. 7b shows a schematic energy diagram derived from the results of the spectroscopic study of the device of FIG. 2a. FIG. 7c shows the results of in situ I-V measurements on similar CuPc diode devices, either undoped (bottom two curves) and doped with $(Fe(C_5Me_5)(C_6H_5))_2$ (top two curves). Structures of the two diodes are illustrated on the right. See Example 8.

FIGS. 8a and 8b show the (a) Photoemission cutoff and (b) HOMO region of the UPS He I spectra acquired on undoped and 2 wt. % rhodocene dimer doped P(NDI$_2$OD-T$_2$) copolymer films on Au.

DETAILED DESCRIPTION

Figure 1A:
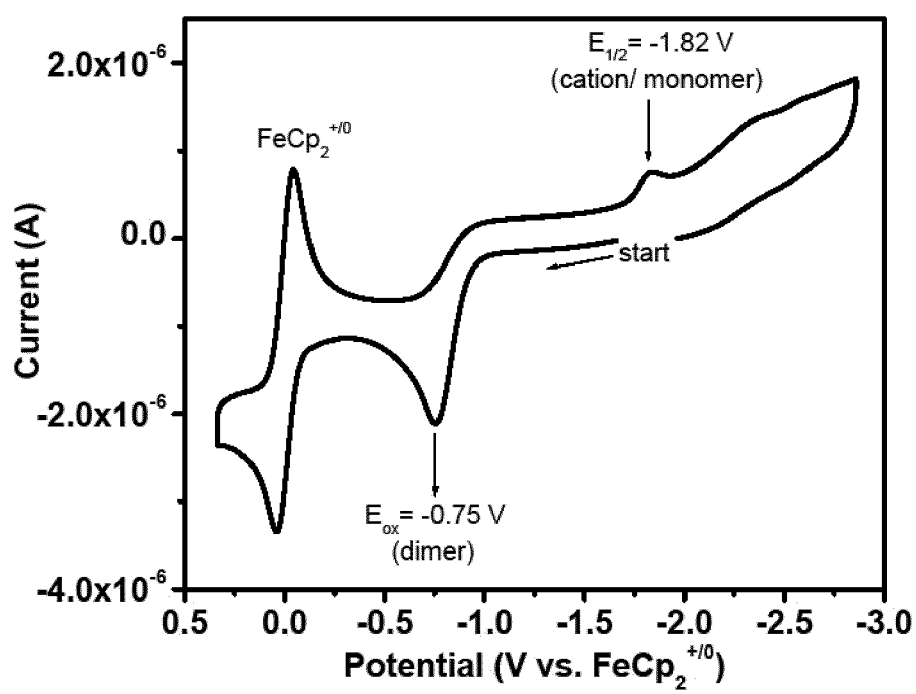
FIG. 1a shows cyclic voltammograms of the Rhodocene dimer. See Example 5.
Figure 1B:
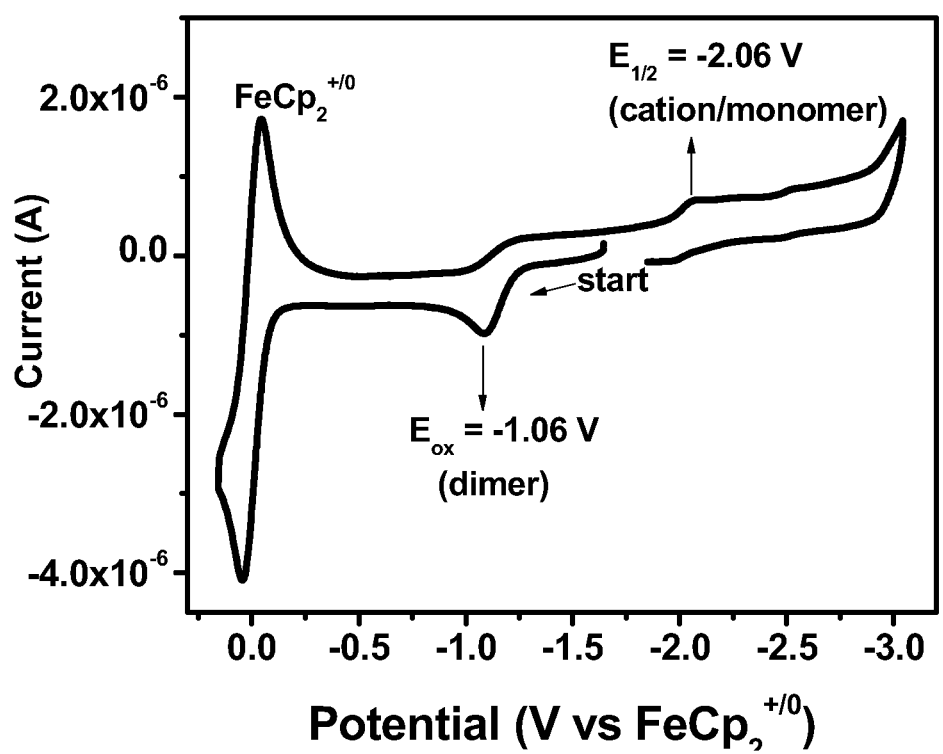
FIG. 1b shows cyclic voltammograms of the $[(C_5Me_5)Fe(C_6H_6)]_2$ dimer in THF containing 0.1 M $Bu_4NPF_6$ and ferrocene. See Example 5.
Figure 1C:
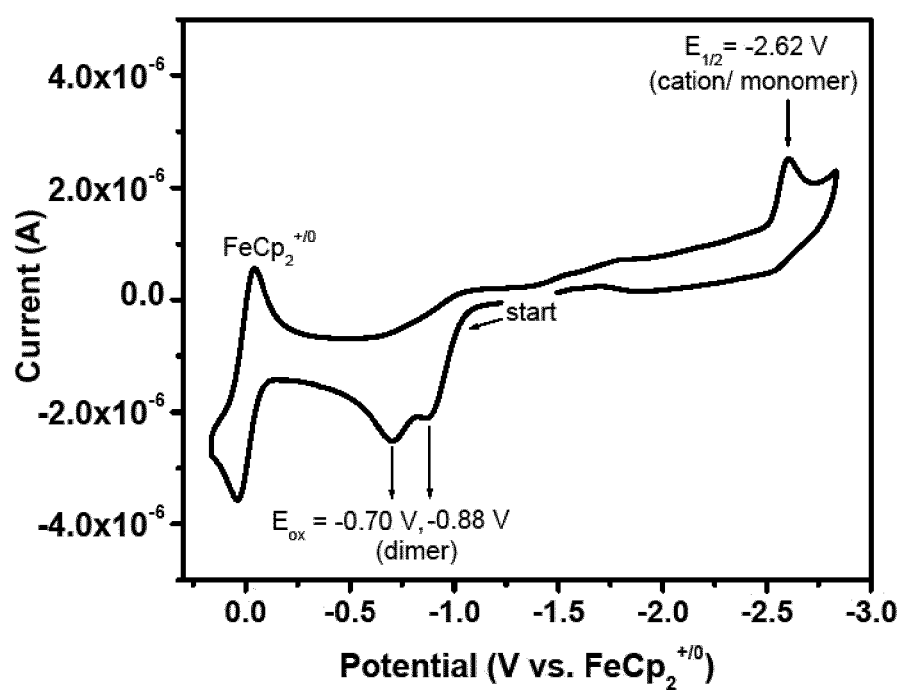
FIG. 1c shows cyclic voltammograms of a mixture of isomers of $[(C_5Me_5)Ir(CH_5H_5)]_2$ dimers in THF containing 0.1 M $Bu_4NPF_6$ and ferrocene. See Example 5.
Figure 1D:
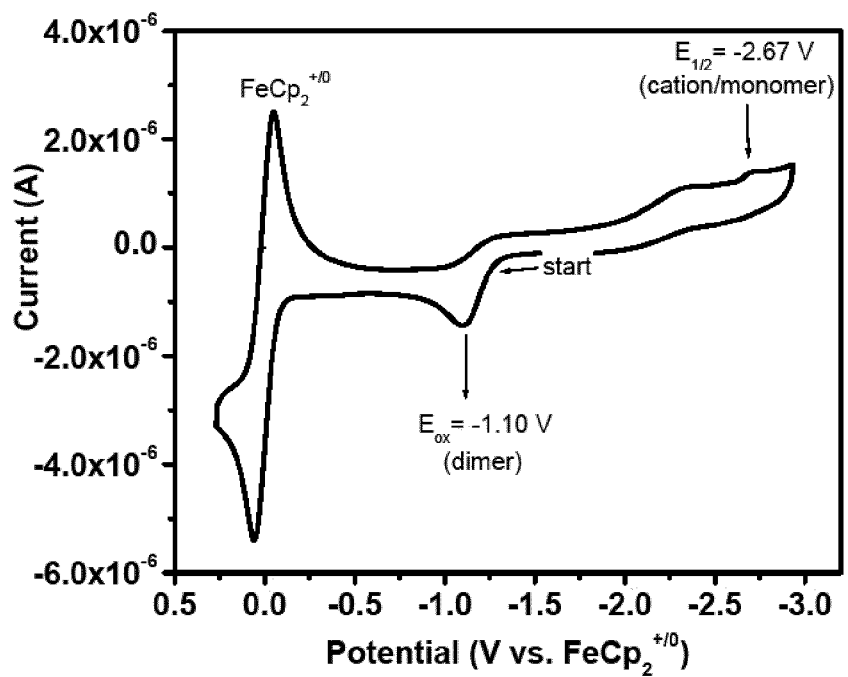
FIG. 1d shows cyclic voltammograms of $[(\eta^5-C_5Me_5)Ru(mesitylene)]_2$ dimer in THF; containing 0.1 M $Bu_4NPF_6$ and ferrocene. See Example 5.
Figure 1E:
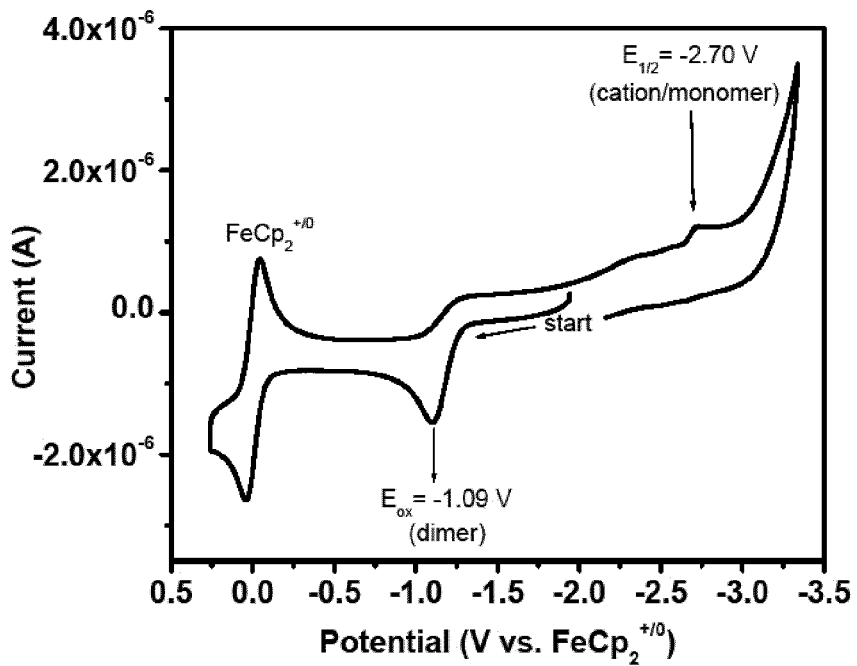
FIG. 1e shows cyclic voltammograms of the $[(n^5-C_5Me_5)Ru(1,3,5-triethylbenzene)]_2$ dimer in THF containing 0.1 $Bu_4NPF_6$ and ferrocene. See Example 5.

The following references, and references cited therein, facilitate enablement: (1) Guo et al., "n-Doping of Organic Electronic Materials Using Air-Stable Organometallics," *Advanced Materials*, 2012, 24, 699-703; (2) Qi et al., "Solution Doping of Organic Semiconductors Using Air-Stable n-Dopants," *Applied Physics Letters*, 100, 083305 (2012) describes embodiments.

Many aspects and other features or embodiments of the broad inventions initially disclosed and described above will now be set forth more fully in the detailed description that follows, as will become apparent to those having ordinary skill in the art upon examination of the following or may be learned from the background information and prior art, and practice of the present invention. The advantages of some aspects or embodiments of the inventions described herein can be realized and obtained as particularly pointed out in the appended claims. As will be realized, the present invention is capable of other and different embodiments, and its several details are capable of modifications in various obvious respects, all without departing from the present invention. The description below is to be regarded as illustrative in nature, and not as restrictive of the invention as claimed.

In the application, where an element or component is said to be included in and/or selected from a list of recited elements or components, it should be understood that in related embodiments explicitly contemplated here, the element or component can also be any one of the individual recited elements or components, or can also be selected from a group consisting of any two or more of the explicitly listed elements or components. Further, it should be understood that elements and/or features of a composition, an apparatus, or a method described herein can be combined in a variety of ways without departing from the scope and disclosures of the present teachings, whether explicit or implicit herein.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a +−10% variation from the nominal value.

As used herein, an "electron-transport semiconductor" refers to a semiconductor material that employs electrons as the majority current carriers. Preferably, electron-transport semiconductors effectively exclusively employ electrons as current carriers (i.e. the ratio of electron mobility to hole mobility for the material is at least. $10^4$). When an electron-transport semiconductor material is deposited on a substrate, it can provide an electron mobility in excess of about $10^{-6}$ cm$^2$/Vs. In the case of field-effect devices, an electron-transport semiconductor can also exhibit a field-effect electron mobility in excess of about $10^{-6}$ cm$^2$/Vs and/or a current on/off ratio of greater than about 10, or $10^2$, or $10^3$, or $10^4$. However, it should be understood that the experimentally measured values of field effect electron and hole mobility, current on/off ratios, and the like measured from OFETS can be very significantly dependent on the identity and physical arrangement of the other components in such an OFET.

As used herein, "solution-processable" refers to compounds, oligomers (e.g., bispolycyclic compounds), polymers materials, or compositions that can be used in various solution-phase processes including spin-coating, printing (e.g., inkjet printing, screen printing, pad printing, offset printing, gravure printing, flexographic printing, lithographic printing, and the like), spray coating, electrospray coating, drop casting, dip coating, and blade coating.

As used herein, "heteroaryl" refers to an aromatic monocyclic ring system containing at least one ring heteroatom selected from oxygen (O), nitrogen (N), sulfur (S), silicon (Si), and selenium (Se), or a polycyclic ring system wherein at least one of the rings present in the ring system is aromatic and contains at least one ring heteroatom. A heteroaryl group, as a whole, can have, for example, from 5 to 16 ring atoms and contain 1-5 ring heteroatoms (i.e., 5-16 membered heteroaryl groups). In some embodiments, heteroaryl groups can be substituted with one or more terminal R$^1$ groups, where R$^1$ is as defined herein. Both substituted and unsubstituted heteroaryl groups described herein can comprise between 1-30, or 1-20 carbon atoms, including the R$^1$ substituents.

Processes for Preparing N-Doped Semiconductors Using Bis-Metallosandwich Compounds as n-Dopants.

The various inventions and/or their many embodiments disclosed herein relate in some embodiments to a process for n-doping and/or increasing the current carrying capacity of an organic semiconductor composition or organic semiconductor compound, comprising the steps of a) obtaining or providing an organic semiconductor composition or organic semiconductor compound that comprises at least two aryl or heteroaryl rings bonded to each other;

b) obtaining or providing a bis-metallosandwich compound comprising two linked metallosandwich groups, wherein i) each metallosandwich group comprises a transition metal atom independently selected from manganese, rhenium, iron, ruthenium, osmium, cobalt, rhodium, and iridium, bonded to two aryl or heteroaryl rings that include at least one optionally substituted benzene or cyclopentadienyl ring, and ii) one benzene or cyclopentadienyl ring from each metallosandwich group is bonded to a benzene or cyclopentadienyl ring from the other metallosandwich group by a carbon-carbon bond;

c) contacting the organic semiconductor composition or organic semiconductor compound with at least some of the bis-metallosandwich compound.

Such processes of making n-doped organic semiconductor compositions or organic semiconductor compounds are novel and unobvious because of their use of bis-metallosandwich compounds comprising two linked metallosandwich groups as n-dopant materials, which allows for the preparation of new n-doped semiconductor compositions not previously available in the prior art, under processing conditions that can be more favorable and practical than those of the prior art.

Each of the two linked metallosandwich groups comprises a transition metal atom independently selected from manganese, rhenium, iron, ruthenium, osmium, cobalt, rhodium, and iridium, wherein the two metal atoms may be independently selected, each transition metal having been independently selected and bonded to optionally substituted benzene or cyclopentadienyl rings, so that unsymmetrical bis-metallosandwich compounds may be employed in the processes of the invention. In some embodiments, the transition metal atoms of the bis-metallosandwich compound are independently selected from iron, ruthenium, osmium, rhodium, and iridium, or mixtures thereof. In other embodiments, the transition metal atoms of the bis-metallosandwich compound are independently selected from ruthenium, osmium, rhodium, and iridium, or mixtures thereof.

The optional and independently selected one or more substituents for the benzene and cyclopentadienyl rings can include halo, cyano, $C_1$-$C_{12}$ alkyl, trifluoroalkyl, alkoxy, perfluoroalkoxy, cycloalkyl, heterocycle, or aryl or heteroaryl groups, either singly bonded to or fused to the benzene or cyclopentadienyl rings. Preferably, the optional and independently selected one or more substituents for the benzene and cyclopentadienyl rings can include cyano, alkyl, alkoxy, or aryl groups.

In many embodiments of the processes described herein, the two transition metals of the bis-metallosandwich compounds are the same, as are the associated optionally substituted benzene or cyclopentadienyl rings, so as to form bis-metallosandwich "dimers." In many embodiments, the bismetallosandwich compound has one of the generic structures:

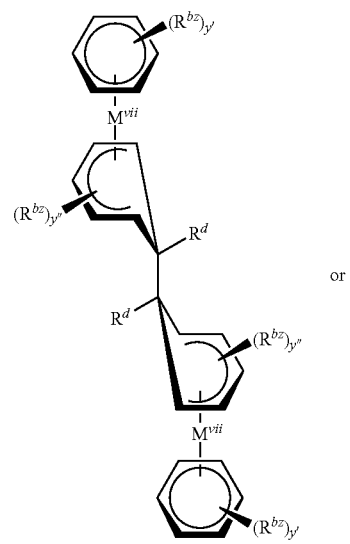

or

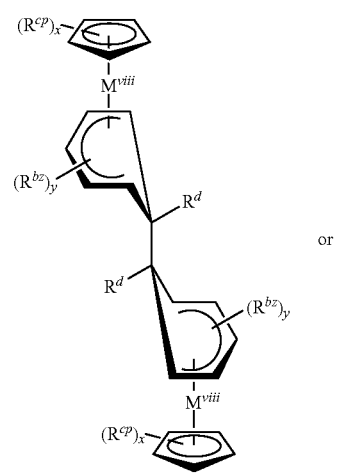

or

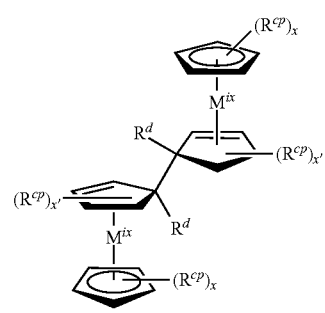

wherein
a) $M^{vii}$ is manganese or rhenium,
b) $M^{viii}$ is iron, ruthenium, or osmium,
c) $M^{ix}$ is rhodium or iridium,
d) each $R^{cp}$ and $R^{bz}$ is individually selected from hydrogen or an optionally substituted $C_1$-$C_{12}$ alkyl or $C_1$-$C_{12}$ phenyl,
e) x is an integer from 1-5,
f) x' is an integer from 1-5, and
g) y and y" are an integer from 1-5
h) y' is an integer from 1-6.

In many embodiments, Rcp, Rbz and Rd are independently selected from hydrogen, methyl, ethyl and phenyl groups.

Non-limiting examples of suitable rhenium bis-metallosandwich compounds include
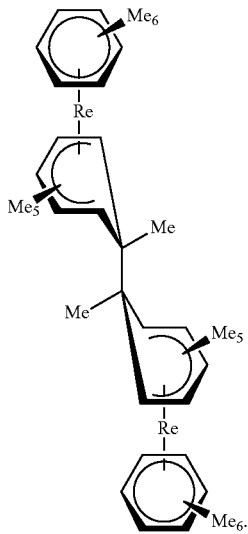
Non-limiting examples of suitable iron bis-metallosandwich compounds include
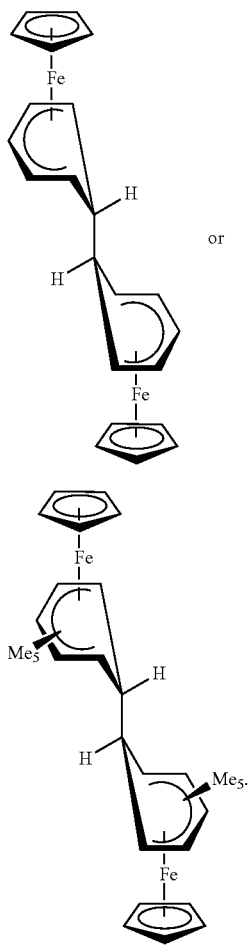
Non-limiting examples of suitable rhodium bis-metallosandwich compounds include
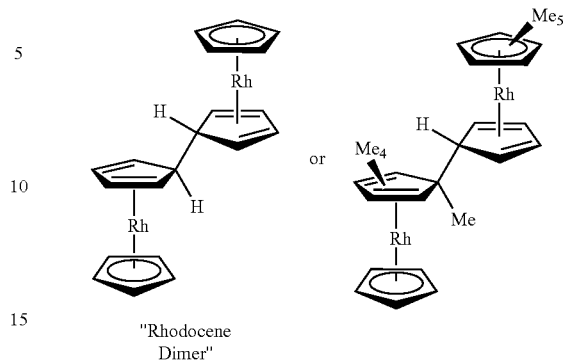
"Rhodocene Dimer"
Non-limiting examples of suitable iridium bis-metallosandwich compounds include
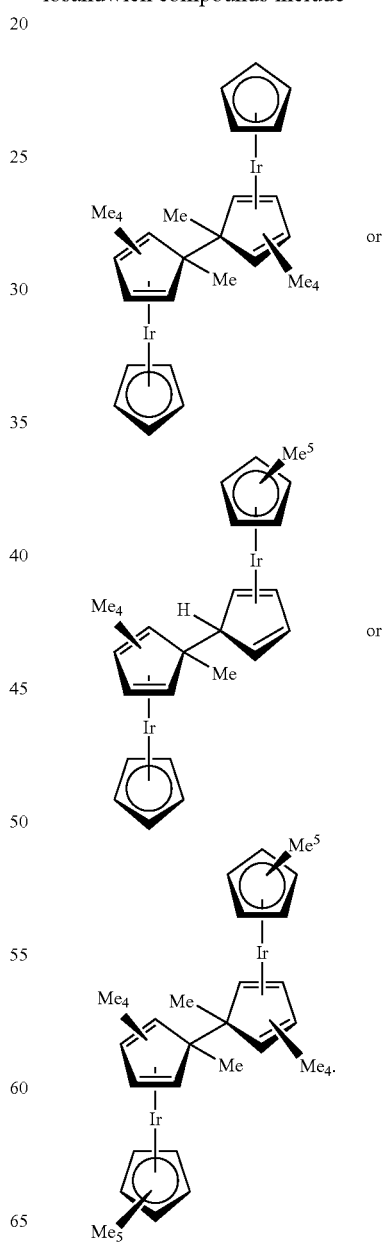

Non-limiting examples of suitable ruthenium bis-metallosandwich compounds include

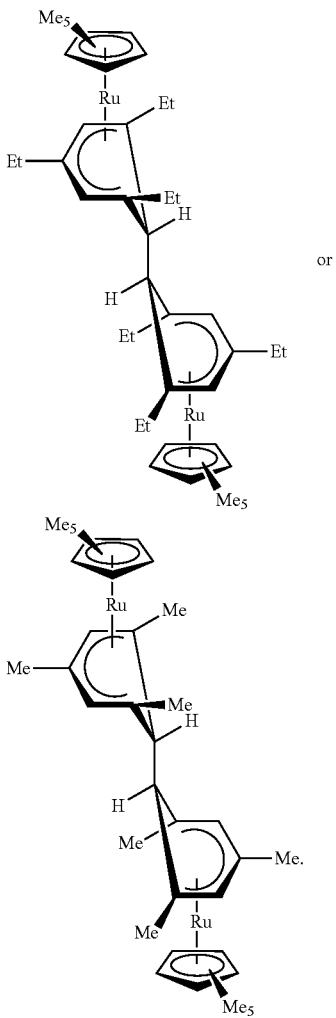

In each bis-metallosandwich compound, one benzene or cyclopentadienyl ring from each metallosandwich group is bonded to a benzene or cyclopentadienyl ring from the other metallosandwich group by a carbon-carbon bond. Such bis-metallosandwich compounds linked by a carbon-carbon bond can often be prepared by chemical or electrochemical reduction of a corresponding well known and stable 1 8 electron metallosandwich cation (such as for example rhodocenium cation) with an electron source. Without wishing to be bound by theory, it is likely that such reduction reactions produce a reduced, electrically neutral, and highly reactive 19 electron monomer radical as a reactive intermediate. The 19 electron metallosandwich radicals are then believed to "dimerize" to form a carbon carbon bond with the ring of another such 19 electron radical, to form the bis-metallosandwich compound having a carbon-carbon single bond between the benzene or cyclopentadienyl groups of the two metallosandwich groups. Accordingly, the bis-metallosandwich compounds, as a result of the formation of the new carbon-carbon bond between the metallosandwich groups and the attainment of an 18 electron configuration at each metal center, tend to be much more air and water stable than the corresponding 19 electron neutral metallosandwich groups. Surprisingly however, such bis-metallosandwich compounds still retain very significant and highly unexpected power to reduce and/or n-dope organic semiconductor compositions or organic semiconductor compounds.

Part of this unexpected reducing power of the bis-metallosandwich compounds to serve as reducing agents is probably at least indirectly derived from or related to the relatively highly reducing reduction potentials of their metallosandwich cation precursors. In many embodiments, the one or more metallosandwich cations produced by the methods of the invention or present in the compositions of the invention has a solution half-wave reduction potential equal to, or more cathodic than about −1.5, about −1.75, −2.0, or −2.35 Volts versus the solution half-wave potential of the ferrocenium/ferrocene couple, as measured by cyclic voltammetry on a solution of the hexafluorophosphate salt in an electrolyte comprised of 0.1 M tetra-n-butylammonium hexafluorophosphate in dry THF and containing ferrocene as an internal standard. By comparison, US 2007/029,941 reported that the reduction potential of the cobaltocene/cobaltocenium couple was only −1.33 volts, and the highest half-wave potential reported was for $Fe(C_5Me_5)(C_6Me_6)^+/Fe(C_5Me_5)(C_6Me_6)$, at −2.30 volts. As reported below in Example 5, the reduction potentials of certain iridium and ruthenium cations are larger than −2.6 volts, which is believed to lend at least those bis-metallosandwich dimers the thermodynamic ability to n-dope organic semiconductor compounds that could not be reduced with the prior art monomeric metallosandwich compounds.

However, the single bond between the benzene or cyclopentadienyl groups of the bis-metallosandwich compounds are unusually chemically and/or electrochemically reactive compared to most compounds comprising normal carbon-carbon single bonds, perhaps because of interactions of carbons on the ring groups with d orbitals on the transition metal atoms of the metallosandwich groups. The processes of the invention make use of the unusual reactivity of the carbon-carbon single bond linking the rings of the two metallosandwich groups.

In many embodiments of the processes of the invention, upon or subsequent to contact with suitable organic semiconductor composition or organic semiconductor compounds, either in solution or in solid state, the carbon-carbon bond linking the rings of the two metallosandwich groups is broken and two monomeric metallosandwich cations are formed. Without wishing to be bound by theory, it may be that a redox and/or electron transfer process is involved, in which the bis-metallosandwich compound and/or the carbon-carbon single bond linking the metallosandwich groups is oxidized to form and release a stable 18 electron monomeric metallosandwich cations and/or a 19 electron monomeric metallosandwich radical. Without wishing to be bound by theory, the two electrons are perhaps removed from the bis-metallosandwich compound, or perhaps from a small quantity of 19 electron monomeric metallosandwich radicals that may be present in equilibrium with the bis-metallosandwich compound, to at least partially reduce the organic semiconductor composition or semiconductor compounds, and thereby at least partially "n-dope" them. Accordingly, in many embodiments of the inventions described herein, the n-doped organic semiconductor composition or organic semiconductor compound produced by the process comprises at least some anions of the organic semiconductor composition or organic semiconductor compounds. In many embodiments of the inventions described herein, wherein the n-doped organic semiconductor composition or organic semiconductor compound produced by the process comprises at least some of the metallosandwich cations.

In many embodiments of the inventions described herein, the metallosandwich cations produced by the processes of the invention and which can be present in the n-doped compositions have the structure

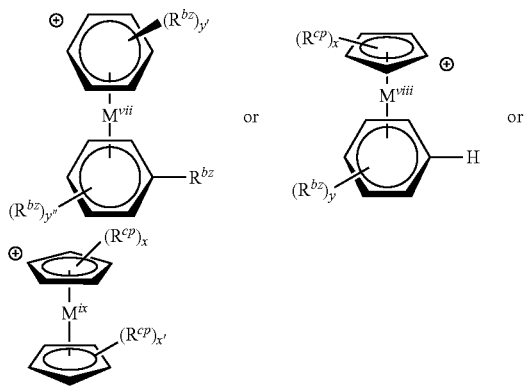

wherein
a) $M^{vii}$ is manganese or rhenium,
b) $M^{viii}$ is iron, ruthenium, or osmium,
c) $M^{ix}$ is rhodium or iridium,
d) each $R^{cp}$ and $R^{bz}$ is individually selected from hydrogen or an optionally substituted $C_1$-$C_{12}$ alkyl or $C_1$-$C_{12}$ phenyl,
e) x is an integer from 1-5.
f) x' is an integer from 1-5, and
g) y and y'' are an integer from 1-5
h) y' is an integer from 1-6.

In many embodiments of the processes or compositions described herein, the one or more metallosandwich cations can have the structure

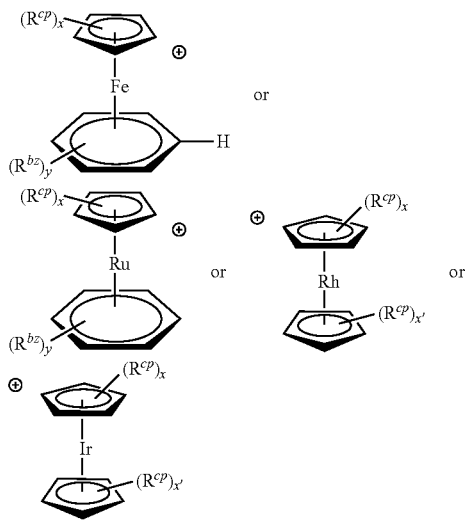

wherein each $R^{cp}$ and $R^{bz}$ is individually selected from hydrogen or an optionally substituted $C_1$-$C_{12}$ alkyl or $C_1$-$C_{12}$ phenyl, x and x' is an integer from 1-5, and y and y'' are an integer from 1-5. In many embodiments, $R^{cp}$ and $R^{bz}$ are individually selected from hydrogen, methyl, ethyl, and phenyl.

In the processes of the invention, the organic semiconductor composition or organic semiconductor compound can be contacted with at least some of the bis-metallosandwich compound in either the vapor phase, solution or in the solid state.

In some embodiments, the organic semiconductor composition or organic semiconductor compound and/or the bis-metallosandwich compound obtained or provided are individually deposited or co-deposited by a vapor phase process, often conducted at high vacuum, onto the surface of a substrate, electrode, or other precursor of an electrical device, to form a solid layer on the surface comprising at least some of the organic semiconductor composition or organic semiconductor compound, and at least some of the bis-metallosandwich compound or metallosandwich cations, or a mixture thereof. The areas of deposition or co-deposition on the surface can be readily controlled by the use of shadow masks as illustrated by Examples 8 and 9 below, or other methods or apparatus well known to those of ordinary skill in the art. As illustrated by Examples 8 and 9, n-doping of the organic semiconductor composition or organic semiconductor compound, reduction (i.e. "n-doping") is often observed in the solid layer deposited on the surface, though in some cases further activation (thermal, electrical, photochemical, sonication, microwave heating, etc) may be required to induce the actual reduction of the solid organic semiconductor composition or organic semiconductor compound by the bis-metallosandwich compound, which is accompanied by the formation of the metallosandwich cations.

In some embodiments of the processes of the invention, the organic semiconductor composition or organic semiconductor compound or mixture thereof is dispersed or dissolved in a liquid solvent during step c, to form a liquid solution or dispersion, which can be applied to the surface of a substrate, electrode, and/or precursor of an electrical device, then the solvent is removed, typically under reduced pressure, to form a solid layer on the surface comprising at least some of the organic semiconductor composition or organic semiconductor compound. The bis-metallosandwich compound can be contacted with the organic semiconductor composition or organic semiconductor compound in the solution (as illustrated by Examples 6, 9, 10, and 11), so that the reduction of the organic semiconductor composition or organic semiconductor compound by the bismetallosandwich solution occurs in solution, followed by application to the surface ("solution doping"), or the solution of organic semiconductor composition or organic semiconductor compound can be applied to the surface to form a solid film, then the solid film can be contacted with the bismetallosandwich dimer applied by any suitable means.

It is also to be understood that successful n-doping of a solid organic semiconductor composition or organic semiconductor compound can occur even if the bis-metallosandwich compound does not actually reduce the individual molecules of the solid organic semiconductor composition or organic semiconductor compound, provided the bis-metallosandwich compound successfully supplies electrons to fill deep traps in the solid state structure of the solid organic semiconductor composition or organic semiconductor compound.

It is to be understood that the desirable extent of reduction of the organic semiconductor composition or organic semiconductor compound can potentially vary over a wide range, especially in solution processes wherein the organic semiconductor composition or organic semiconductor compound can potentially be fully or even multiply reduced to form monoanions, dianions etc of the individual organic semiconductor molecules. However, in many embodiments of the process wherein the formation of an n-doped solid semiconductor is desired, doping is carried out only to a relatively small extent, so that the bulk solid organic semiconductor composition or organic semiconductor compound is only partially reduced and/or n-doped. In many embodiments, the bis-metallosandwich compound employed in the process comprises about 0.001% to about 30%, or about 0.1 to about 10%, or about 0.5 to about 5% by weight of the organic semiconductor composition or at least one organic semiconductor compound employed. After the n-doping process has occurred, the bis-metallosandwich compound may no longer be present, because it has been converted to metallosandwich cations during the n-doping process. Accordingly, in many embodiments, the metallosandwich cations comprise about 0.001% to about 30%, or from about 0.1 to about 10%, or from about 0.5 to about 5% by weight of the organic semiconductor composition or at least one organic semiconductor compound produced by the processes of the invention.

A wide variety of potentially n-dopable organic semiconductor compositions and/or organic semiconductor compounds are known in the art, and/or are useable in the processes of the invention. Suitable organ is semiconductor compounds typically comprise a combination of n-orbitals and/or bonds that are sufficiently conjugated so that the lowest unoccupied molecular orbitals ("LUMO") of the organic semiconductor compounds are at a sufficiently low energy (typically having an electron affinity between about 2.0-5.0 eV) so that an electron can be transferred from a higher energy HOMO from the n-dopant molecule.

In order to achieve such large electron affinities, most organic semiconductor compounds typically comprise at least two aryl or heteroaryl rings bonded to each other, which can be bonded to each other in any fashion that permits the high degree of electronic conjugation necessary to produce a suitably high electron affinity. Examples of the aryl rings that may be present in the organic semiconductor compounds are phenyl, 1-naphthyl, 2-naphthyl, anthracenyl, phenanthrenyl, and pentacenyl rings, fullerenes or fullerene derivatives, or mixtures of such ring compounds or fused compounds formed from such aryl compounds or others, or heteroaryl compounds. In some embodiments, organic semiconductor compounds or compositions do not comprise fullerenes or fullerene derivatives.

Examples of the heteroaryl rings that may be present in the organic semiconductor compounds are furyl, thienyl, pyridyl, pyrimidyl, pyridazinyl, pyrazinyl, phenanthrolinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzoisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl, phthalocyanine, perylenediimide, or napthalenediimide rings.

A few specific examples organic semiconductor compounds that comprise conjugated combinations of such aryl and heteroaryl rings are cited in the examples below, and more examples were disclosed by Shirota et al, *Chem Rev.* 2007, 107, 953-1010, hereby incorporated by reference herein for its disclosures relating to examples of charge transporting organic semiconductor compounds.

In preferred embodiments, the organic semiconductor composition or at least one organic semiconductor compound obtained or provided for use in the processes and n-doped compositions of the is, before they are n-doped, capable of conducting electrons with a mobility of at least $1\times10^{-6}$, or at least $1\times10^{-5}$, or at least $1\times10^{-4}$ cm$^2$/Vsec, as measured from a thin film transistor having a bottom gate, bottom contact geometry, employing doped silicon as a gate material, silicon dioxide as a gate dielectric, using gold source and drain electrodes with a chromium adhesive layer at a channel width of 400-800 μm and lengths of 20-40 μm, and employing the organic semiconductor composition or at least one organic semiconductor compound as the active semiconductor.

It should also be recognized that organic semiconductor compounds that may have only been recognized in the prior art as "p-type" semiconductors may nevertheless have energetically accessible LUMOs, and therefore may be able to actually function as n-dopable compounds, at least for the purposes of the current inventions. Accordingly, in some embodiments of the processes and compositions described here, the organic semiconductor composition or at least one organic semiconductor compound obtained or provided is (prior to n-doping) capable of conducting holes with a mobility of at least $1\times10^{-6}$ cm$^2$/Vsec, as measured from a thin film transistor having a bottom gate, bottom contact geometry, employing doped silicon as a gate material, silicon dioxide as a gate dielectric, using gold source and drain electrodes with a chromium adhesive layer at a channel width of 400-800 μm and lengths of 20-40 μm, and employing the organic semiconductor composition or at least one organic semiconductor compound as the active semiconductor.

Subsequent to the n-doping processes described herein, a solid layer formed from the n-doped organic semiconductor composition or organic semiconductor compound can preferably carry electrical current at a current density at least about 5 times, 10 times, 50 times, $10^2$, $10^3$, $10^4$, $10^5$, or $10^6$ times higher than that of a comparative layer prepared from the same organic semiconductor composition or organic semiconductor compound or mixture thereof formed without contact with the bis-metallosandwich compound, as measured in devices wherein the solid layers are disposed between two gold electrodes at a spacing between about 100 and about 200 nm, and an electrical field of about $10^4$ volts per cm is applied to the electrodes, and the current density is measured in milliamps per cm$^2$. Some embodiments of the inventions described herein relate to n-doped organic semiconductor compositions or an organic semiconductor compounds produced by the processes described herein, or to electronic devices comprising such n-doped organic semiconductor compositions or an organic semiconductor compounds. Such electronic devices can include organic field effect transistors ("OFETs"), organic photovoltaic devices ("OPVs"), and organic light emitting diodes (OLEDs).

Compositions Comprising Bis-metallosandwich Compounds and Organic Semiconductor Compounds As can be seen from Example 6, the n-doping reaction of the bis-metallosandwich compounds and organic semiconductor compositions or organic semiconductor compounds proceed at varying rates that depend on the structures of the bis-metallosandwich compounds and organic semiconductor compositions or organic semiconductor compounds, and the conditions of the reactions, but the n-doping reactions do not typically occur so rapidly that intermediate compositions that comprise both the bis-metallosandwich compounds and organic semiconductor compositions or organic semiconductor compounds cannot sometimes be isolated or utilized before the n-doping reaction starts or finishes. Accordingly, in some embodiments, the inventions described herein relate to an organic semiconductor composition comprising at least one organic semiconductor compound that comprises at least two aryl or heteroaryl rings bonded to each other, and at least some of a bis-metallosandwich compound having one of the structures:

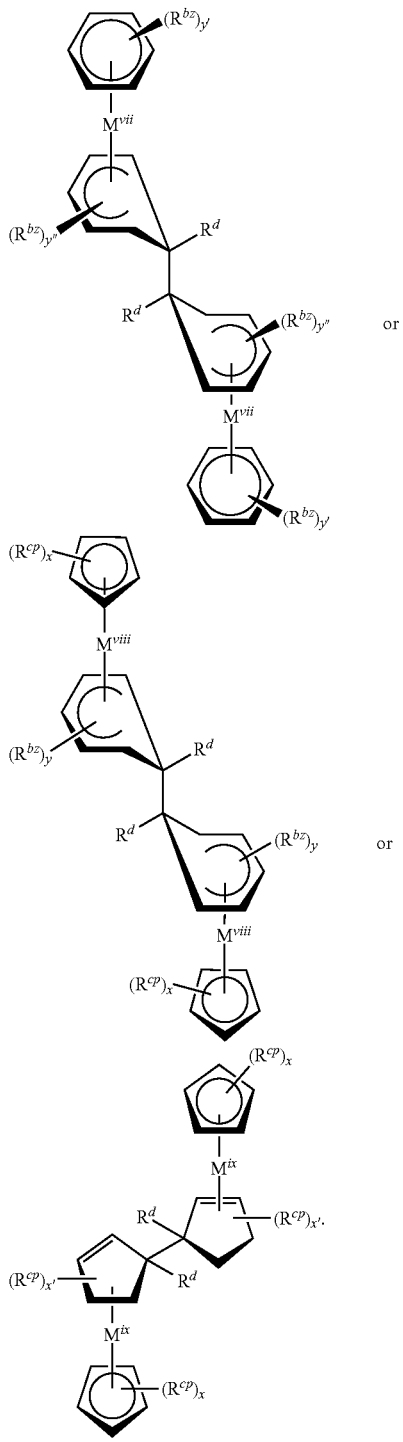

or or wherein
(i) $M^{vii}$ is manganese or rhenium,
(j) $M^{viii}$ is iron, ruthenium, or osmium,
(k) $M^{ix}$ is rhodium or iridium, (l) each $R^{cp}$ and $R^{bz}$ is individually selected from hydrogen or an optionally substituted $C_1$-$C_{12}$ alkyl or $C_1$-$C_{12}$ phenyl,
(m) x is an integer from 1-5,
(n) x' is an integer from 1-5, and
(o) y and y'' are an integer from 1-5
(p) y' is an integer from 1-6.

Such intermediate organic semiconductor compositions can be made or used in solid, liquid, solution, or liquid dispersion forms to make electronic devices, or n-doped organic semiconductor compositions. Such intermediate organic semiconductor compositions can comprise any of the genera or species of bis-metallosandwich compounds and/or organic semiconductor composition or organic semiconductor compounds described above or below.

N-Doped Semiconductor Compositions Comprising Metallosandwich Compounds and Organic Semiconductor Compounds Because of the reasonable air and/or water stability of the bis-metallosandwich compounds used in the novel processes disclosed above, and yet their unexpected power as reducing agents and/or n-dopants as compared to known similarly strong n-dopant compounds (such as the monomeric iron or cobalt 19 electron metallosandwich dopants known in the prior art) Applicants' processes can be used to prepare novel n-doped semiconductor compositions that would could not be prepared at all using the prior art dopants, including organic semi-conductor compositions or compounds that could not be effectively n-doped with the prior art dopants. Moreover, because of the comparative air and water stability of the bis-metallosandwich dopants as compared to prior art monomeric iron or cobalt 19 electron metallosandwich dopants, the n-doped organic semiconductor compositions and/or compounds can be prepared and/or handled under less rigorous and expensive conditions, including relatively inexpensive solution processing conditions.

Accordingly, in some embodiments, the inventions disclosed herein relate to an n-doped organic semiconductor composition comprising at least one organic semiconductor compound comprising at least two aryl or heteroaryl rings bonded to each other, and at least some of one or more metallosandwich cations having the structure

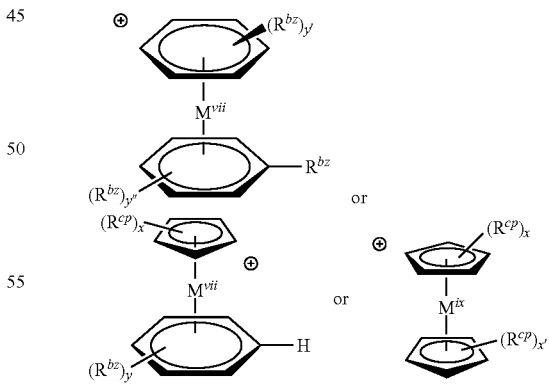

or or wherein
a) $M^{vii}$ is manganese or rhenium,
b) $M^{viii}$ is iron, ruthenium, or osmium,
c) $M^{ix}$ is rhodium or iridium,
d) each $R^{cp}$ and $R^{bz}$ is individually selected from hydrogen or an optionally substituted $C_1$-$C_{12}$ alkyl or $C_1$-$C_{12}$ phenyl,
e) x is an integer from 1-5, t) x' is an integer from 1-5, and
g) y and y" are an integer from 1-5
h) y' is an integer from 1-6.

The n-doped organic semiconductor composition described above comprises at least one organic semiconductor compound comprising at least two aryl or heteroaryl rings bonded to each other. The organic semiconductor compounds present can be any of the compounds described in the processes described above, except that when in n-doped form, at least some of the organic semiconductor compound present in the composition have been reduced to anionic radical form, so that the electron that produces the anionic charge can migrate between the LUMOs of the organic semiconductor compound molecules, or between deep traps in imperfections of the solid state structure. In some embodiments, the organic semiconductor compound does not comprise an allotrope of carbon, a fullerene, or a fullerene derivative.

Preferably, the n-doped composition can carry electrical current at a current density at least about 5 times, 10 times, 50 times, $10^2$, $10^3$, $10^4$, $10^5$, or $10^6$ times higher than that of a comparative composition prepared from a the same organic semiconductor composition or organic semiconductor compound without n-doping.

In many embodiments of the processes or compositions described herein, the one or more metallosandwich cations can have the structure

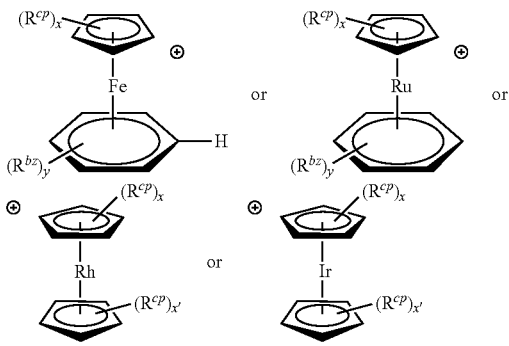

wherein each $R^{cp}$ and $R^{bz}$ is individually selected from hydrogen or an optionally substituted $C_1$-$C_{12}$ alkyl or $C_1$-$C_{12}$ phenyl, x and x' is an integer from 1-5, and y and y" are an integer from 1-5. In many embodiments, $R^{cp}$ and $R^{bz}$ are individually selected from hydrogen, methyl, ethyl, and phenyl.

In many embodiments, the metallosandwich cations comprise about 0.001% to about 30%, or from about 0.1 to about 10%, or from about 0.5 to about 5% by weight of the organic semiconductor composition or at least one organic semiconductor compound present in the n-doped composition.

PRIORITY PROVISIONAL EMBODIMENTS

Priority U.S. provisional application Ser. No. 61/496,667 filed Jun. 14, 2011 includes 48 claims which are incorporated hereinbelow in the following 48 embodiments:

A first embodiment ("embodiment 1") provides a process for n-doping and/or increasing the current carrying capacity of an organic semiconductor composition or organic semiconductor compound, comprising
  (a) obtaining or providing an organic semiconductor composition or organic semiconductor compound that comprises at least two aryl or hetereoaryl rings bonded to each other;
  (b) obtaining or providing a bis-metallosandwich compound comprising two linked metallosandwich groups, wherein
    (i) each metallosandwich group comprises a transition metal atom independently selected from manganese, rhenium, iron, ruthenium, osmium, cobalt, rhodium, and iridium, bonded to two aryl or heteroaryl rings that include at least one optionally substituted benzene or cyclopentadienyl ring, and
    (ii) one benzene or cyclopentadienyl ring from each metallosandwich group is bonded to a benzene or cyclopentadienyl ring from the other metallosandwich group by a carbon-carbon bond;
  (c) contacting the organic semiconductor composition or organic semiconductor compound with at least some of the bis-metallosandwich compound.

A second embodiment provides a process of embodiment 1 wherein the carbon-carbon bond linking the rings of the two metallosandwich groups is broken and two monomeric metallosandwich cations are formed.

A third embodiment provides the process of embodiment 2 wherein the formation of the metallosandwich cations is accompanied by at least partial reduction of the organic semiconductor composition or semiconductor compounds.

A fourth embodiment provides the process of embodiment 2, wherein the n-doped organic semiconductor composition or organic semiconductor compound produced by the process comprises at least some of the metallosandwich cat ions.

A fifth embodiment provides the process of embodiment 2, wherein the n-doped organic semiconductor composition or organic semiconductor compound produced by the process comprises at least some anions of the organic semiconductor composition or organic semiconductor compounds.

A sixth embodiment provides the process of embodiment 1, wherein the organic semiconductor composition or organic semiconductor compound and the bis-metallosandwich compound obtained or provided are individually deposited or co-deposited by a vapor phase process onto the surface of a substrate, electrode, or other precursor of an electrical device, to form a solid layer on the surface comprising at least some of the organic semiconductor composition or organic semiconductor compound, and at least some of the bis-metallosandwich compound or metallosandwich cations, or a mixture thereof.

A seventh embodiment provides the process of embodiment 1, wherein the organic semiconductor composition or organic semiconductor compound or mixture thereof is dispersed or dissolved in a liquid solvent during step c, to form a liquid solution or dispersion.

An eighth embodiment provides the process of embodiment 7, wherein the liquid solution or dispersion is applied to the surface of a substrate, electrode, and/or precursor of an electrical device, and the solvent is removed, to form a solid layer on the surface comprising at least some of the organic semiconductor composition or organic semiconductor compound.

A ninth embodiment provides the process of embodiments 6 or 8, wherein the solid layer formed carries electrical current at a current density at least 5 times higher than that of a comparative layer prepared from a comparative organic semiconductor composition or organic semiconductor compound or mixture thereof formed without contact with the bis-metallosandwich compound, as measured in devices wherein the solid layers are disposed between two gold electrodes at a spacing between about 100 and about 200 nm, and an electrical field of about 10⁴ volts per cm is applied to the electrodes, and the current density is measured in milliamps per cm².

A tenth embodiment provides the process of any one of embodiments 1-8, wherein the bis-metallosandwich compound employed in the process comprises about 0.001% to about 30% by weight of the organic semiconductor composition or at least one organic semiconductor compound employed.

An eleventh embodiment provides the process of any one of embodiments 2-5, wherein the metallosandwich cations comprise about 0.001% to about 30% by weight of the organic semiconductor composition or at least one organic semiconductor compound produced.

A twelfth embodiment provides the process of any one of embodiments 2-5, wherein the breakage of the carbon-carbon bond is initiated by thermolysis, photolysis, sonication, or microwave treatment.

A thirteenth embodiment provides the process of any one of embodiments 1-8, wherein the transition metal atoms of the bis-metallosandwich compound are independently selected from iron, ruthenium, osmium, rhodium, and iridium, or mixtures thereof.

A fourteenth embodiment provides the process of any one of embodiments 1-8, wherein the bismetallosandwich compound has one of the structures:

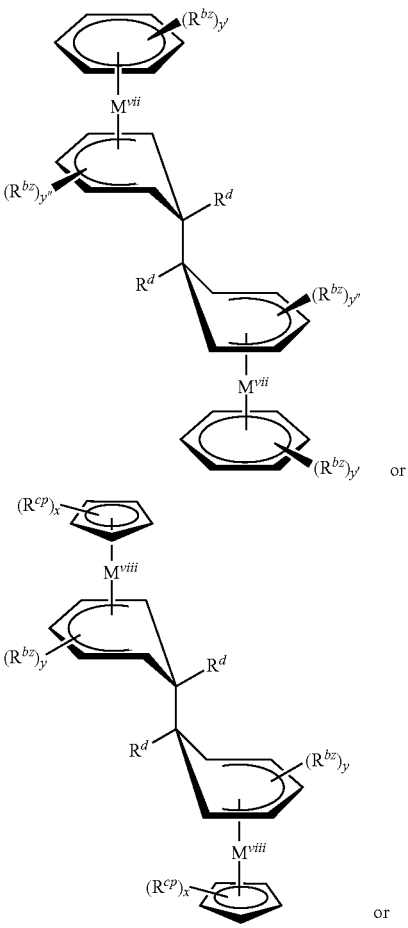

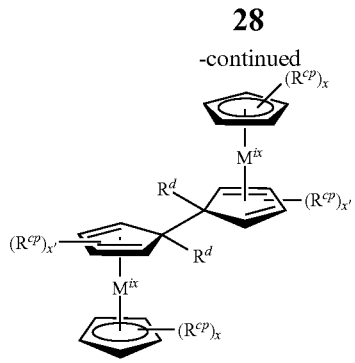

wherein a) $M^{vii}$ is manganese or rhenium, b) $M^{viii}$ is iron, ruthenium, or osmium, c) $M^{ix}$ is rhodium or iridium, d) each $R^{cp}$ and $R^{bz}$ is individually selected from hydrogen or an optionally substituted $C_1$-$C_{12}$ alkyl or $C_1$-$C_{12}$ phenyl, e) x is an integer from 1-5, f) x' is an integer from 1-5, and g) y and y" are an integer from 1-5 h) y' is an integer from 1-6.

A fifteenth embodiment provides the process any one of embodiments 1-8, wherein the bis-metallosandwich compound has one of the structures:

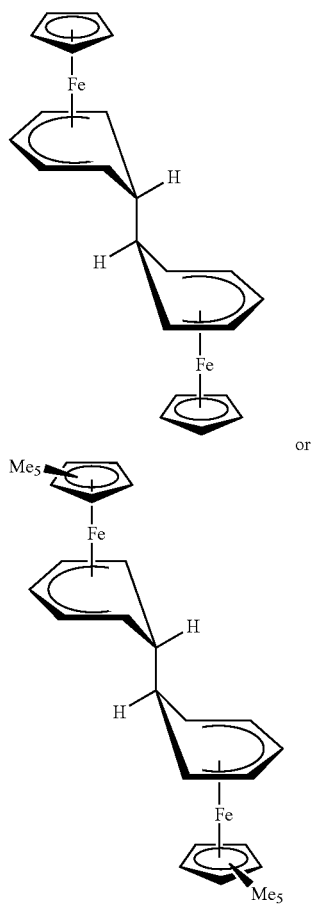

-continued

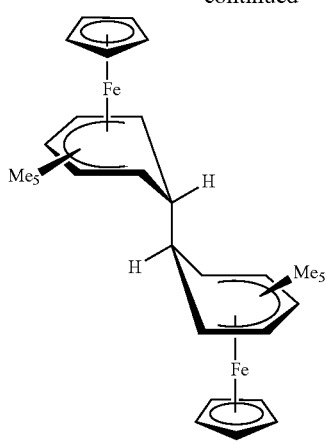

A sixteenth embodiment provides the process any one of embodiments 1-8, wherein the bis-metallosandwich compound has one of the structures:

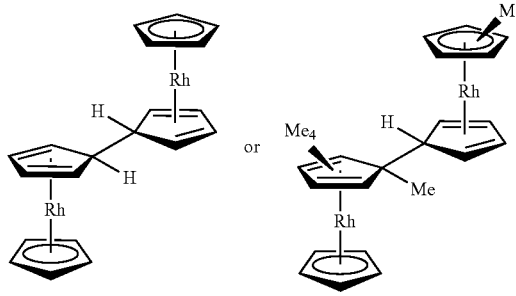

A seventeenth embodiment provides the process any one of embodiments 1-8, wherein the bis-metallosandwich compound has one of the structures:

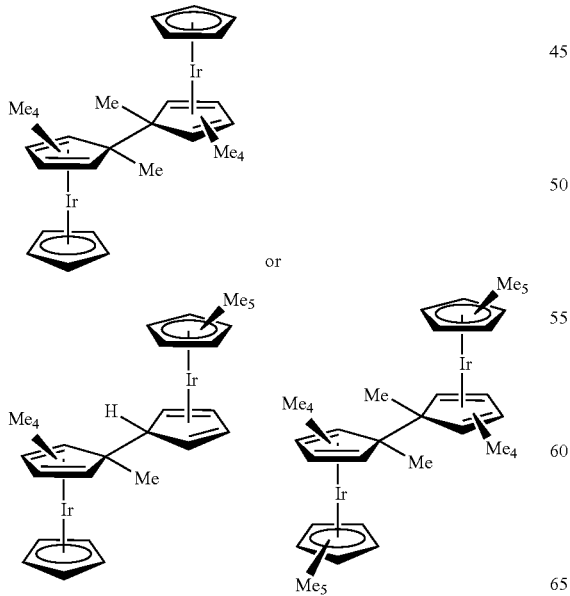

An eighteenth embodiment provides the process any one of embodiments 1-8, wherein—metallosandwich compound has the structure:

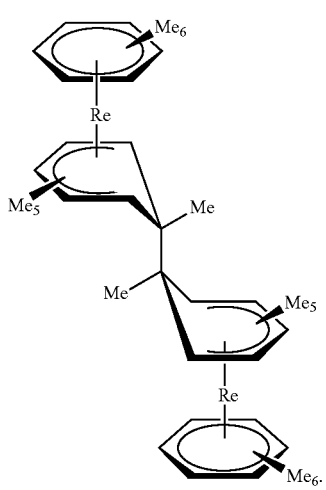

A nineteenth embodiment provides the process any one of embodiments 1-8, wherein—metallosandwich compound has the structure

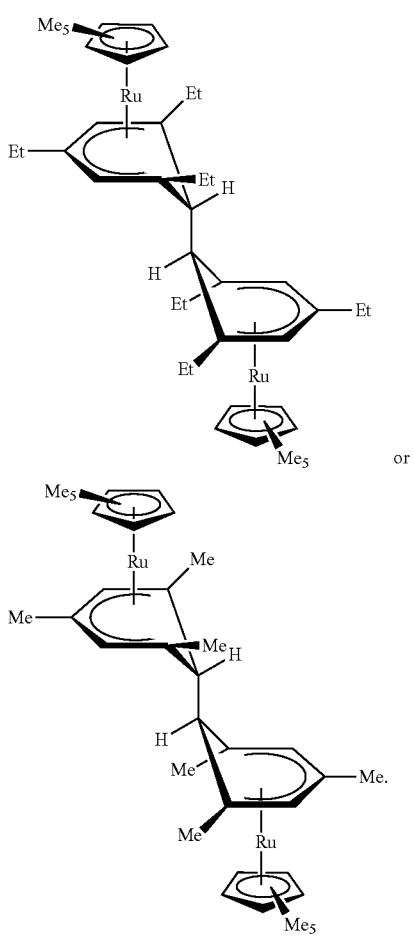

A twentieth embodiment provides the process of any one of embodiments 2-5, wherein the metallosandwich cations have the structure

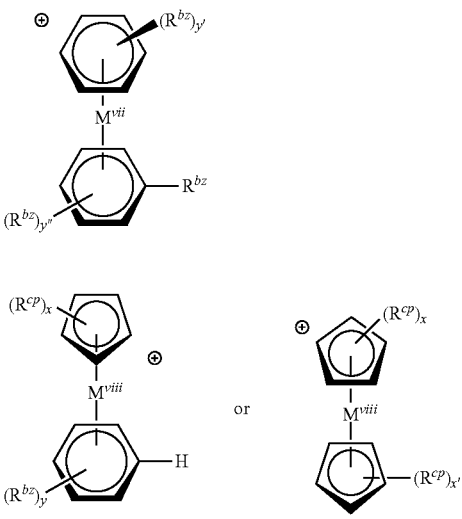

wherein
i) $M^{vii}$ is manganese or rhenium,
j) $M^{viii}$ is iron, ruthenium, or osmium,
k) $M^{ix}$ is rhodium or iridium,
l) each $R^{cp}$ and $R^{bz}$ is individually selected from hydrogen or an optionally substituted $C_1$-$C_{12}$ alkyl or $C_1$-$C_{12}$ phenyl,
m) x is an integer from 1-5,
n) x' is an integer from 1-5, and
o) y and y" are an integer from 1-5
p) y' is an integer from 1-6.

A twentyfirst embodiment provides the process of any one of embodiments 1-8, wherein the organic semiconductor composition or at least one organic semiconductor compound obtained or provided is capable of conducting electrons with a mobility of at least $1 \times 10^{-6}$ cm$^2$/Vsec, ($1 \times 10^{-5}$, $1 \times 10^{-4}$) as measured from a thin film transistor having a bottom gate, bottom contact geometry, employing doped silicon as a gate material, silicon dioxide as a gate dielectric, using gold source and drain electrodes with a chromium adhesive layer at a channel width of 400-800 μm and lengths of 20-40 μm, and, employing the organic semiconductor composition or at least one organic semiconductor compound as the active semiconductor.

A twentysecond embodiment provides the process of any one of embodiments 1-8, wherein the organic semiconductor composition or at least one organic semiconductor compound obtained or provided is capable of conducting holes with a mobility of at least $1 \times 10^{-6}$ cm$^2$/Vsec, as measured from a thin film transistor having a bottom gate, bottom contact geometry, employing doped silicon as a gate material, silicon dioxide as a gate dielectric, using gold source and drain electrodes with a chromium adhesive layer at a channel width of 400-800 μm and lengths of 20-40 μm, and employing the organic semiconductor composition or at least one organic semiconductor compound as the active semiconductor.

A twentythird embodiment provides the process of any one of embodiments 1-8, wherein the aryl rings of the organic semiconductor, composition or organic semiconductor compound obtained or provided are selected from phenyl, 1-naphthyl, 2-naphthyl, anthracenyl, phenanthrenyl, and pentacenyl rings, fullerenes or fullerene derivatives, or mixtures thereof.

A twenty fourth embodiment provides the process of any one of embodiments 1-8, wherein heteroaryl rings of the organ is semiconductor composition or organic semiconductor compound obtained or provided are selected from furyl, thienyl, pyridyl, pyrimidyl, pyridazinyl, pyrazinyl, phenanthrolinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzoisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoim idazolyl, phthalocyanine, perylenediimide, or napthalenediimide rings.

A twentyfifth embodiment provides an organic semiconductor composition or an organic semiconductor compound produced by the process of any of the preceding embodiments, 1-24.

A twentysixth embodiment provides an electronic device comprising the organic semiconductor composition or an organic semiconductor compound of embodiment 26.

A twentyseventh embodiment provides an organic semiconductor composition comprising at least one organic semiconductor compound that comprises at least two aryl or heteroaryl rings bonded to each other, and at least some of a bis-metallosandwich compound having one of the structures:

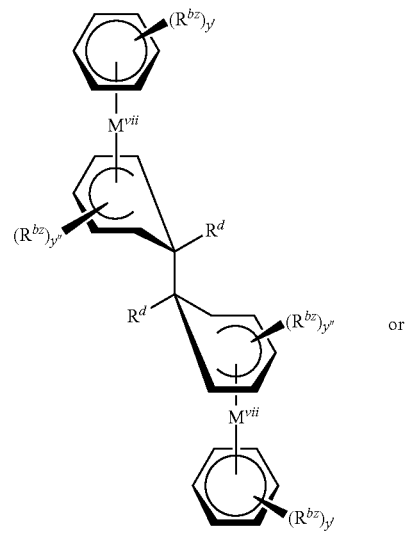

-continued

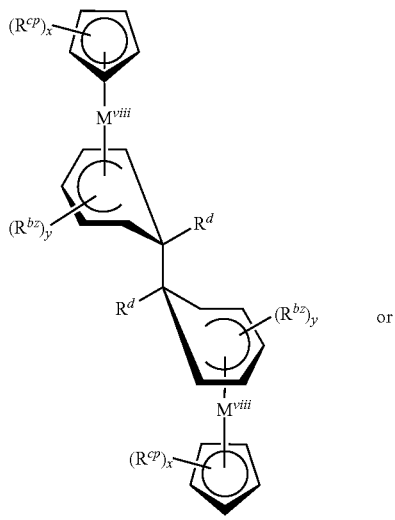

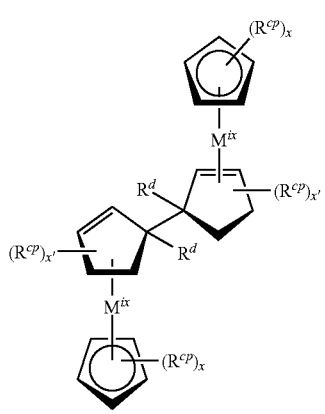

or

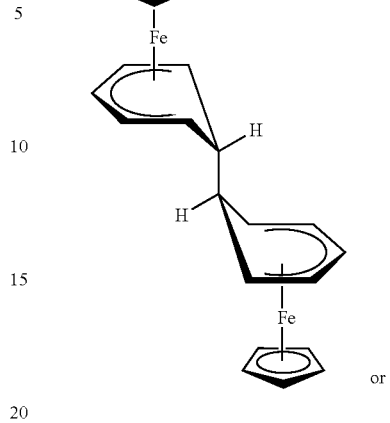

or

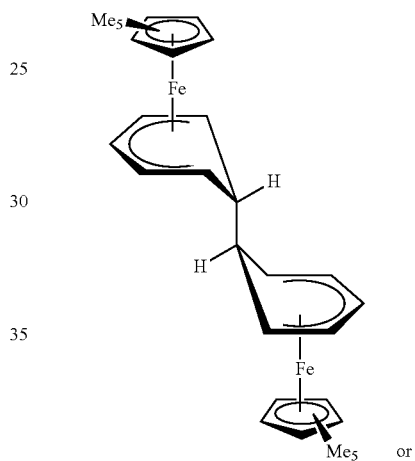

or

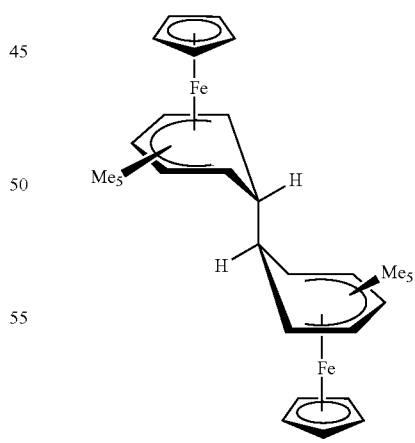

wherein q) $M^{vii}$ is manganese or rhenium,
r) $M^{viii}$ is iron, ruthenium, or osmium,
s) $M^{ix}$ is rhodium or iridium,
t) each $R^{cp}$, $R^{bz}$, and $R^d$ is individually selected from hydrogen or an optionally substituted $C_1$-$C_{12}$ alkyl or $C_1$-$C_{12}$ phenyl,
u) x is an integer from 1-5,
v) x' is an integer from 1-4, and
w) y and y" are an integer from 1-5
x) y' is an integer from 1-6.

A twentyeighth embodiment provides the organic semiconductor composition of embodiment 27 in solid form.

A twentyninth embodiment provides the organic semiconductor composition of embodiment 27 in liquid, solution, or liquid dispersion form.

A thirtieth embodiment provides the organic semiconductor composition of embodiment 27 wherein the bis-metallosandwich compound has one of the structures:

A thirty first embodiment provides the organic semiconductor composition of embodiment 27 wherein the bis-metallosandwich compound has one of the structures:

A thirtysecond embodiment provides the organic semiconductor composition of embodiment 27 wherein the bis-metallosandwich compound has one of the structures:

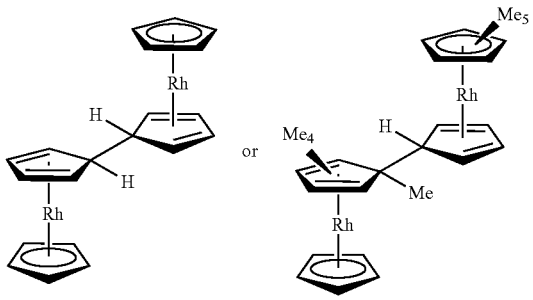

A thirtythird embodiment provides the organic semiconductor composition of embodiment 27 wherein the bis-metallosandwich compound has one of the structures:

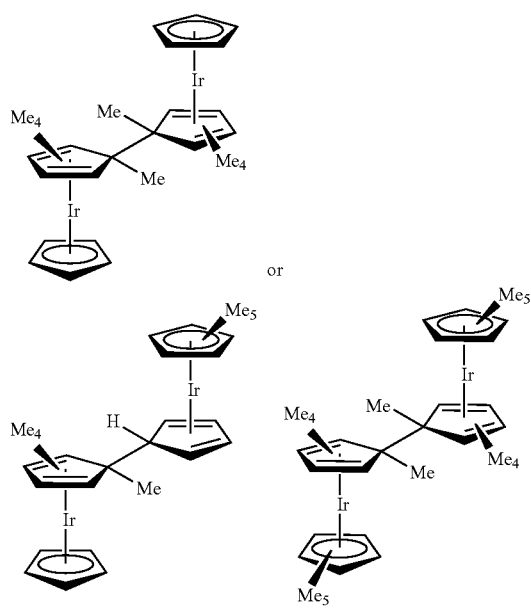

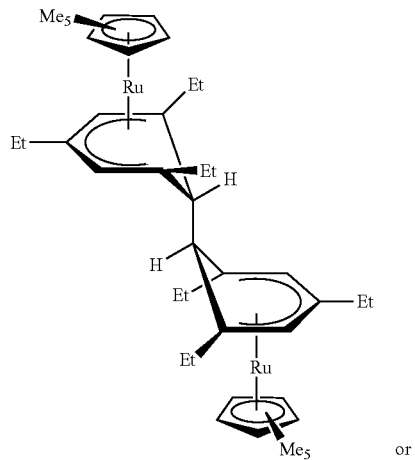

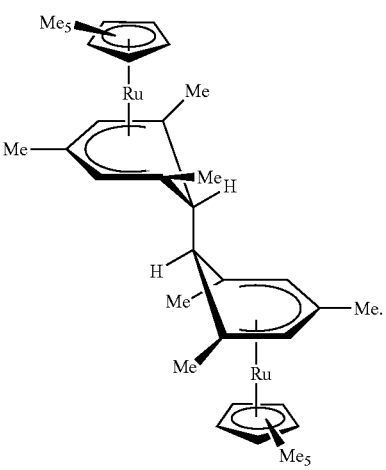

A thirty fourth embodiment provides the organic semiconductor composition of embodiment 27 wherein the aryl rings of the organic semiconductor composition or organic semiconductor compound obtained or provided are selected from phenyl, 1-naphthyl, 2-naphthyl, anthracenyl, phenanthrenyl, and pentacenyl rings, fullerenes or fullerene derivatives, or mixtures thereof.

A thirtyfifth embodiment provides the organic semiconductor composition of embodiment 27 wherein the heteroaryl rings of the organic semiconductor composition or organic semiconductor compound obtained or provided are selected from furyl, thienyl, pyridyl, pyrimidyl, pyridazinyl, pyrazinyl, phenanthrolinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzoisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl, phthalocyanine, perylenediimide, or napthalenediimide rings.

A thirtysixth embodiment provides an n-doped solid organic semiconductor composition comprising at least one organic semiconductor compound comprising at least two aryl or heteroaryl rings bonded to each other, and at least some of one or more metallosandwich cations having the structure

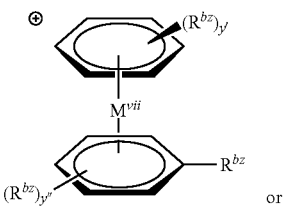

or

-continued

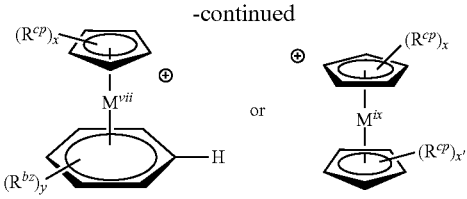
or
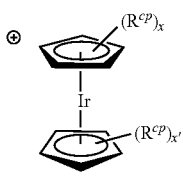

wherein
y) $M^{vii}$ is manganese or rhenium,
z) $M^{viii}$ is iron, ruthenium, or osmium,
aa) $M^{ix}$ is rhodium or iridium,
bb) each $R^{cp}$ and $R^{bz}$ is individually selected from hydrogen or an optionally substituted $C_1$-$C_{12}$ alkyl or $C_1$-$C_{12}$ phenyl.
cc) x is an integer from 1-5,
dd) x' is an integer from 1-5, and
ee) y and y" are an integer from 1-5
ff) y' is an integer from 1-6.

A thirtyseventh embodiment provides the organic semiconductor composition of embodiment 36 wherein one or more metallosandwich cations have the structure

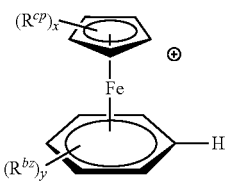

wherein each $R^{cp}$ and $R^{bz}$ is individually selected.

A thirtyeighth embodiment provides the organic semiconductor composition of embodiment 36 wherein one or more metallosandwich cations have the structure

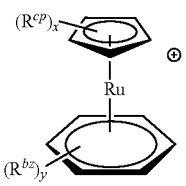

wherein each $R^{cp}$ and $R^{bz}$ is individually selected.

A thirtyninth embodiment provides the organic semiconductor composition of embodiment 36 wherein one or more metallosandwich cations have the structure

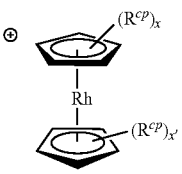

wherein each $R^{cp}$ and $R^{bz}$ is individually selected.

A fortieth embodiment provides the organic semiconductor composition of embodiment 36 wherein one or more metallosandwich cations have the structure wherein each $R^{cp}$ and $R^{bz}$ is individually selected.

A fortyfirst embodiment provides the organic semiconductor composition of embodiment 36 wherein at least some an ions of the at least one of the organic semiconductor compound are present in the composition.

A fortysecond embodiment provides the organic semiconductor composition of any one of embodiments 36-41 wherein each $R^{cp}$ and $R^{bz}$ is individually selected from hydrogen, methyl, ethyl, or phenyl.

A fortythird embodiment provides the organic semiconductor composition of any one of embodiments 36-41 wherein the one or more metallosandwich cations has a solution half-wave reduction potential equal to, or more cathodic than, −1.5 V versus the solution half-wave potential of the ferrocenenium/ferrocene couple, as measured by cyclic voltammetry on a solution of the hexafluorophosphate salt in an electrolye comprised of 0.1 M tetra-n-biitylammonium hexafluorophosphate in dry THF and containing ferrocene as an internal standard.

A fortyfourth embodiment provides the organic semiconductor composition of any one of embodiments 36-41, wherein a solid layer formed from the composition carries electrical current at a current density at least 5 times higher than that of a comparative layer prepared from a the organic semiconductor composition or organic semiconductor compound or mixture thereof prepared without contact with the bis-metallosandwich compound, wherein the current density is measured from devices wherein the solid layer is disposed on a silicon/silicon oxide substrate and between two gold electrodes at a spacing between about 1 00 and about 200 nm, and an electrical field of about $10^4$ volts per cm is applied to the electrodes.

A forty fifth embodiment provides the organic semiconductor composition of any one of embodiments 36-41, wherein the organic semiconductor composition or organic semiconductor compound comprises one or more aryl rings selected from phenyl, 1-naphthyl, 2-naphthyl, anthracenyl, phenanthrenyl, pentacenyl rings, or mixtures thereof.

A fortysixth embodiment provides the organic semiconductor composition of any one of embodiments 36-41, wherein the organic semiconductor compound comprises one or more heteroaryl rings selected from furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzotbiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl, phthalocyanine, diketopyrrolopyrrole, perylenediimide, or napthalenediimide rings.

A fortyseventh embodiment provides an electronic device comprising the organic semiconductor composition of any one of embodiments 36-46.

A fortyeighth embodiment provides the electronic device of embodiment 47 that is an organic light emitting diode, an organic photovoltaic device, or a transistor. This concludes the 48 embodiments.

EXAMPLES

The various inventions described above are further illustrated by the following specific examples, which are not intended to be construed in any way as imposing limitations upon the scope of the invention disclosures or claims attached herewith. On the contrary, it is to be clearly understood that resort may be had to various other embodiments, modifications, and equivalents thereof which, after reading the description herein, may suggest themselves to one of ordinary skill in the art without departing from the spirit of the present invention or the scope of the appended claims.

Example 1

Synthesis of "Rhodocene Dimer"

Part A) Synthesis of Rhodocenium PF6: [($\eta^5$-$C_5H_5$)Rh[($\eta_5$-$C_5H_5$)][$PF_6$]

A PF6 salt of the Rhodocenium cation was prepared as described previously (see Neto, et al, *Synth. Read. Inorg. Met.-Org. Chem.*, 1997, 27, 1299-1314.)).

Part B) Synthesis of [($\eta^5$-$C_5H_5$)Rh($\mu$-$\eta^4$-$C_5H_5$: $\eta^4$-$C_5H_5$)Rh($\eta_5$-$C_5H_5$)] (Rhodocene Dimer)

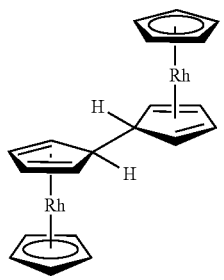

Rhodocene Dimer

To a freshly prepared 1% Na—Hg (3.5 gm, 15.8 mmol), [Rh($\eta_5$-$C_5H_5$)2]$PF_6$ (300 mg, 0.79 mmol) in dry THF (20 mL) was added under nitrogen. After stirring for 2 h at room temperature, the solution was removed and volatiles were removed under vacuum and the black-brown solid was extracted in dry toluene. The toluene solution was decanted and filtered through celite. The solution was dried under reduced pressure to isolate a yellow solid which was further washed with degassed pentane (2×3 mL) then dried under vacuum to yield 300 mg (54%) of the [($\eta^5$-$C_5H_5$)Rh($\mu^4$-$C_5H_5$: $\eta^4$-$C_5H_5$)Rh($\eta^5$-$C_5H_5$)] as an yellow solid. The product in solid state is reasonably stable to air and moisture, and can be stored in air for periods of at least days without significant decomposition.

$^1$H NMR (400 MHz, benzene-d6): δ 5.09 (d, JH.Rh=0.8 Hz, 5H), 4.90 (m, 2H), 3.26 (s, 2H), 2.19 ppm (s, 1H). $^1$H NMR (400 MHz, chlorobenzene-d5) δ 5.21 (d, $J_{H-Rh}$=0.7 Hz, 5H), 5.07 (m, 2H), 3.37 (s, 2H), 2.23 ppm (s, 1H). 13C NMR (100 MHz, chlorobenzene-d5) δ 82.2 (d, $J_{C-Rh}$=6.0 Hz, Cp), 73.8 (d, $J_{C-Rh}$=9.1 Hz, ˆ-C), 67.5 (d, JC-Rh=4.0 Hz, i-C), 44.4 ppm (d, $J_{C-Rh}$=12.1 Hz, α-C)

Example 2

Synthesis of [($C_5Me_5$)Fe($C_6H_6$)]$_2$ Dimer

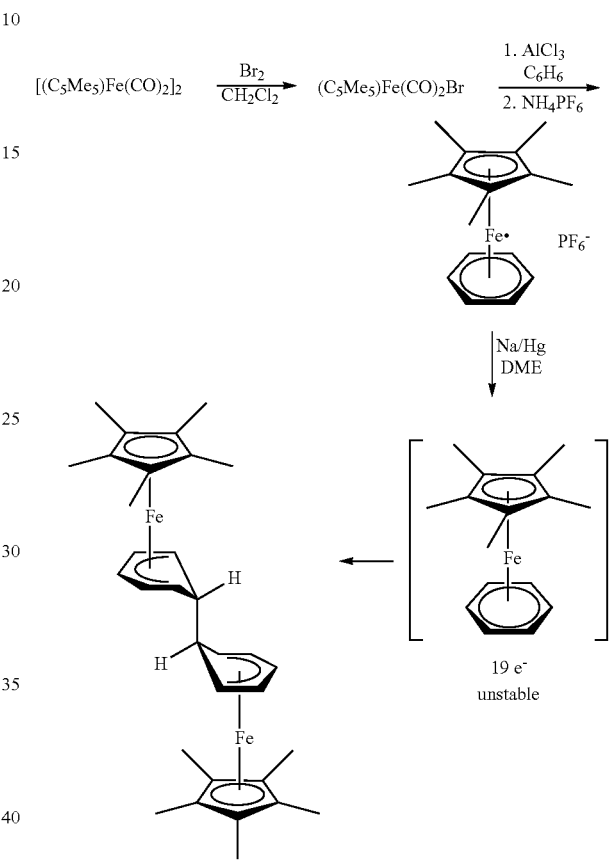

The synthesis shown above was followed as described previously (see Hamon, et al, *J. Am. Chem. Soc*, 1981, 103, 758-766.)

Example 3

Synthesis of [($\eta^5$-$C_5Me_5$)Ru(mesitylene)]$_2$ and [($\eta^5$-$C_5Me_5$)Ru(1,3,5-triethylbenzene)]$_2$ Dimers Part A—Synthesis of [($\eta^5$-$C_5Me_5$)Ru(NCMe)$_3$]$PF_6$

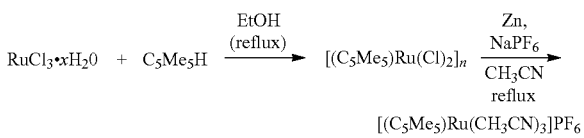

This preparation was carried out via the procedure of Steinmetz, et al, *Organometallics*, 1999, 18, 943.

5.8 g (22.18 mmol) of $RuCl_3 \times H_2O$ was added to a thoroughly N2 degassed solution of 4.5 g (33.2 mmol) pentamethylcyclopentadiene and 35 mL of ethanol. After refluxing for 4 h. the solution was filtered to obtain a red-brown solid. The solid was washed with ethanol in small portions (3×7 mL), then with diethyl ether and dried under vacuum, yielded 5.52 g (81%) of red-brown solid [($\eta^5$-C$_5$Me$_5$)RuCl$_2$]$_n$. The compound was used without any further characterization.

Zinc dust (2.23 g, 34.2 mmol) and NaPF$_6$ (3.92 g, 23.4 mmol) were added to a solution of [($\eta^5$-C$_5$Me$_5$)RuCl$_2$]$_n$ (5.52 g, 17.9 mmol) in acetonitrile (40 mL). After stirring for 4 h at room temperature, the mixture was filtered over Celite and the solution evaporated to dryness. The crude yellow residue was extracted with CH$_2$Cl$_2$ (30 mL), filtered over Celite, and evaporated again. The yellow solid, [($\eta^5$-C$_5$Me$_5$)Ru(NCMe)$_3$]PF$_6$ was washed with diethyl ether and dried under vacuum. Yield: 7.2 g (79.5%). The compound was used without any further characterization.

Part B—Synthesis of [($\eta^5$-C$_5$Me$_5$)Ru(arene]PF$_6$ Salts

[($\eta^5$-C$_5$Me$_5$)Ru(arene]PF$_6$ Salts with variously substituted arenes can be made as shown below, by reaction of [($\eta^5$-C$_5$Me$_5$)Ru(NCMe)$_3$]PF$_6$ with appropriately substituted arenes.

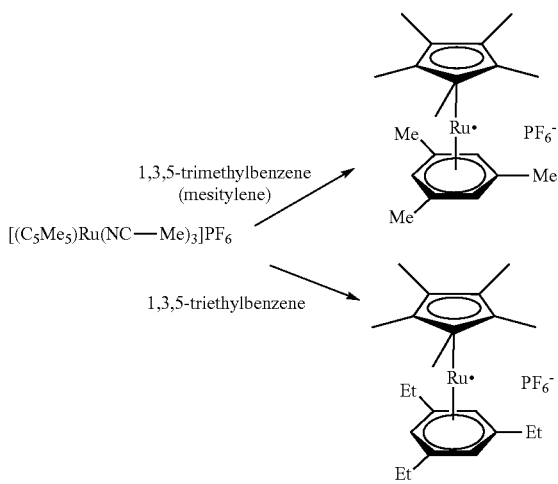

Synthesis of [$\eta^5$-C$_5$Me$_5$)Ru($\eta^6$-TEB)]PF$_6$ (TEB=1,3,5-triethylbenzene) Alternatively termed [(Cp*)Ru($\eta^6$-TEB)]PF$_6$ A freshly prepared [($\eta^5$-C$_5$Me$_5$)Ru(NCMe)$_3$]PF$_6$ (2.22 g, 4.4 mmol) (was added to a thoroughly N$_2$ degassed 1,3,5-triethylbenzene (5.0 g, 30.8 mmol) in dichloroethane (20 mL). The mixture was refluxed for 24 h. Evaporation of the solvent yielded a brown oily residue. The residue was dissolved in acetone and the solution passed through a neutral alumina column to remove the brown impurities. Evaporation of the solvent gave an off-white solid. The solid was further purified by recrystallization from CH$_2$Cl$_2$ and diethyl ether, obtained an off-white crystalline solid 1.376 g (58.3% yield). [($\eta^5$-C$_5$Me$_5$)Ru($\eta^6$-TEB)]PF$_6$: $^1$H NMR (400 MHz, acetone-d$_6$): δ 5.89 (s, 3H, Ar. TEB). 2.46 (q, $J_{H-H}$=7.6 Hz, 6H, CH$_2$, Et), 1.91 (s, 15H, C$_5$Me$_5$), 1.25 (t. $J_{H-H}$=7.2 Hz, 9H, CH$_3$, Et). $^{13}$C NMR (100 MHz, acetone-d$_6$, 297 K): δ=107.0 (s, C$_{TEB}$), 95.4 (s. C$_5$Me$_5$), 87.6 (s, C$_{TEB}$), 26.7 (s, CH$_2$, TEB), 15.9 (s, CH$_3$, TEB), 10.1 (s, C$_5$Me$_5$).

Part C—Synthesis of Cp*Ru(Benzene) Dimers

The previously known compound [($\eta^5$-C$_5$Me$_5$)Ru(μ-$\eta^4$:$\eta^4$-TMB-TMB)Ru($\eta^5$-C$_5$Me$_5$)], where TMB=1,3,5-trimethyl benzene=mestitylene, was prepared as described previously (see Gusev, et al, J. Organomet. Chem., 1997, 534, 57-66).

($\eta^5$-C$_5$Me$_5$)Ru(μ-$\eta^4$:$\eta^4$-TEB-TEB)Ru($\eta^5$-C$_5$Me$_5$)

Alternatively Termed the [(Cp*)Ru(TEB)]$_2$ Dimer

The [(Cp*)Ru(TEB)]$_2$ dimer, a novel compound, was prepared by the following procedure. [($\eta^5$-C$_5$Me$_5$)Ru($\eta^6$-TEB)]PF$_6$(0.931 g (1.714 mmol) was added to freshly prepared 1% Na—Hg (15.3 g, 68.57 mmol) in dry THF (20 mL). The reaction was stirred for 2 h at room temperature. The volatiles were removed under vacuum and the crude solid was extracted in dry toluene. The toluene solution was decanted and filtered over celite. Removal of the solvent yielded a light yellow solid. The solid was washed with cold pentane (1×3 mL) and dried under high vacuum to obtain the resultant dimer as a light yellow crystalline solid (238 mg, 34%). $^1$H NMR (400 MHz, benezene-d$_6$): δ 3.47 (s, 2H, CH, TEB), 2.18-2.08 [(m, 4H, (2H, o-CCH$_2$), (2H, p-CCH$_2$)], 1.76 (s, 1H, i-CH). 1.67 (s, 15H, C$_5$Me$_5$), 1.63-1.57 (m, 2H, o-CCH$_2$), 1.46 (t, $J_{HH}$=7.2 Hz, 3H, p-CCH$_3$), 1.23 ppm (t. $J_{H-H}$=7.2 Hz, 6H, o-CCH$_3$): $^{13}$C NMR (100 MHz, bezene-d$_6$): δ 92.42 (s, p-C$_{TEB}$), 87.43 (s, C$_5$Me$_5$), 79.64 (s, m-C$_{TEB}$), 48.49 (s, O—C$_{TEB}$), 48.36 (s, i-C$_{TFB}$), 28.36 (s, p-CCH$_2$), 28.02 (s, o-CCH$_2$), 17.41 (s, p-CCH$_3$). 12.91 (s, o-CCH$_3$), 10.78 ppm (s, C$_5$Me$_5$). MALDI-MS calcd for (M/2)$^+$ 399.1. found 399.1. Elemental analysis calcd (%) for C$_{44}$H$_{66}$Ru$_2$: C, 66.29; H, 8.34. found: C, 66.17; H, 8.27.

Air Stability of [($\eta^5$-C$_5$Me$_5$)Ru(μ-$\eta^4$:$\eta^4$-TEB-TEB)Ru($\eta^5$-C$_5$Me$_5$)] in Solution A solution of [($\eta^5$-C$_5$Me$_5$)Ru(μ-$\eta^4$:$\eta^4$-TEB-TEB)Ru($\eta^5$-C$_5$Me$_5$)] (2.0 mg) was prepared in air with commercially available C$_6$D$_6$(0.7 mL) in an NMR tube and capped. After 24 hrs, approximately 90% of the [($\eta^5$-C$_5$Me$_5$)Ru(μ-$\eta^4$:$\eta^4$-TEB-TEB)Ru($\eta^5$-C$_5$Me$_5$)] dimer remained and approximately 10% was the corresponding cation by $^1$H-NMR. The percentage ratio was calculated from the integrals of aromatic protons between the dimer and cation in the $^1$H-NMR. A total of 72 h after preparation of the solution, approximately 70% of the [($\eta^5$-C$_5$Me$_5$)Ru(μ-$\eta^4$:$\eta^4$-TEB-TEB)Ru($\eta^5$-C$_5$Me$_5$)] dimer remained.

A total of 2.5 mg of the [($\eta^5$-C$_5$Me$_5$)Ru(μ-$\eta^4$:$\eta^4$-TEB-TEB)Ru($\eta^5$-C$_5$Me$_5$)]-dimer was dissolved in 0.7 mL of commercially available THF-d$_8$ in air, but the NMR tube was not capped. After 10 hours, $^1$H-NMR as described above showed that approximately 90% of the dimer remained. After 72 h, approximately 50% of the dimer remained.

Example 4

Preparation of [(C$_5$Me$_5$)Ir(C$_5$Me$_5$)]$_2$ Dimers

[(C$_5$Me$_5$)Ir(C$_5$H$_5$)]$_2$ dimers are known in the art (see Gusev et al, J. Orgmet Chem 1997, 531, 95-100) to exist as a mixture of isomers as shown below.

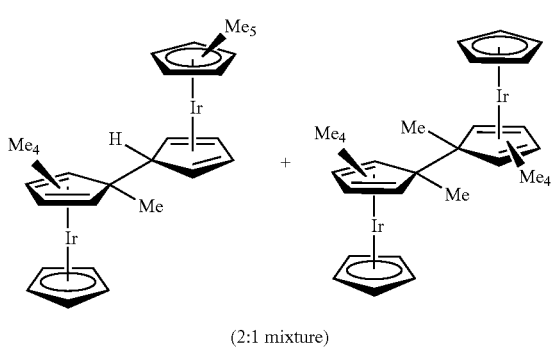

(2:1 mixture)

A sample of these mixed [(C$_5$Me$_5$)Ir(C$_5$H$_5$)]$_2$ dimers was prepared as described previously (see Gusev, et al, *J. Organomet. Chem.*, 1997, 531, 95-100).

Example 5

Electrochemical Characterizations of Bis-Metallosandwich Dimers and their Monomeric Cation Precursors The bis-metallosandwich dimers whose preparations are described in Examples 1-4, and the precursor monomeric metallocenium hexafluorophosphate salts were characterized electrochemically via cyclic voltametry, in THF and/or methylene chloride solvent with 0.1 M tetrabutylammonium hexafluorophosphate supporting electrolyte, a glassy carbon working electrode, a Pt wire auxiliary electrode, and a Ag wire anodized in aqueous KCl as a pseudo-reference electrode. Ferrocene was used as an internal reference. Exemplary cyclic voltammograms of several metallosandwich dimers are shown in FIGS. 1 *a-e*. The irreversible peaks seen in the oxidative scans correspond to oxidation of the dimers while the features seen at more reducing potential in reducing scans correspond to the cation/monomer couples and the reversible features centered at 0 V are due to the ferrocene standard.

The measured oxidation potentials of the bis-metallosandwich dimers and reduction potentials of the precursor metallocenium cation salts in THF are shown in the Table below, and compared to monomeric cobaltocenium or decamethylcobaltocenium hexafluorophosphate salts.

| Dimers | Dimer $E_{ox}$ (V vs. FeCp$_2^{+/0}$) | Cationic Monomer Metallocenium PF$_6$ salt | |
|---|---|---|---|
| | | $E_{1/2}^{+/0}$ (V vs. FeCp$_2^{+/0}$) | $I_{ox}/I_{red}$ at 50 mV/s |
| (C$_5$H$_5$)$_2$Co (monomer) | NA | −1.33# | 1 |
| (C$_5$Me$_5$)$_2$Co (monomer) | NA | −1.86 | 1 |
| [Cp$_2$Rh]$_2$ | −0.75 | −1.85 | 0.3 |
| [Cp*Ir(Cp)]$_2$ (2 Isomers) | −0.70, −0.88 | −2.62 | ~0 |
| [Cp*Fe(bz)]$_2$ | −1.06 | −2.06 | 1 |
| [Cp*Ru(mes)]$_2$ | −1.10 | −2.67 | ~0 |
| [Cp*Ru(TEB)]$_2$ | −1.09 | −2.70 | ~0 |

Data in dichloromethane from Connelly et al, *Chem Rev.* 96, 877

From this electrochemical data, it can be seen that the monomeric rhodocenium cation has a reduction potential much higher than that of the cobaltocenium cation, and comparable to that of the decamethylcobaltocenium cation. However, the iron, iridium, and ruthenium metallosandwich cations all have significantly more negative reduction potentials than cobaltocenium or decamethylcobaltocenium cations suggesting that the dimers or monomers could be potent reducing agents for organic semiconductors. The potentials at which the Rh, Fe, Ir, and Ru bis-metallosandwich dimers are oxidized are all significantly more positive than those for the monomers or for cobaltocene derivatives suggesting the possibility of air and water stability. However, all have significantly negative oxidation potentials relative to ferrocenes.

Example 6

Kinetics of Solution Doping of TIPS Pentacene with [Ru(Cp*)(TEB)]$_2$ Dimer

A preliminary investigation of the kinetics of solution n-doping of TIPS Pentacene with [Ru(Cp*)(TEB)]$_2$ dimer (see Example 4) was carried out. TIPS pentacene is well known in the art as a solution processable crystalline solid that can function as a highly efficient p-type semiconductor.

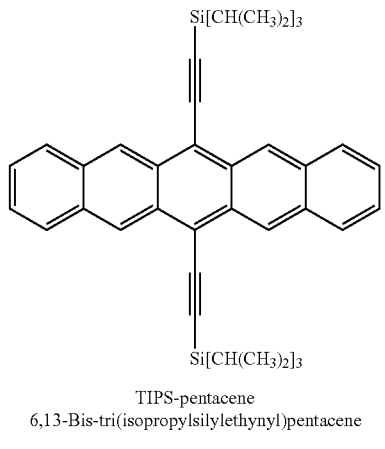

TIPS-pentacene
6,13-Bis-tri(isopropylsilylethynyl)pentacene

However, UPS/IPES studies of solid TIPS pentacene described below suggested that it has an energetically accessible LUMO having an electron affinity of 3.08 eV, which suggested that TIPS pentacene could be reduced and/or n-doped.

In a preliminary solution doping experiment, a 2:1 molar ratio solution of TIPS-pentacene (2 mg, 3.1×10 mmol) and [Cp*Ru(TEB)]$_2$ dimer (1.24 mg, 1.56×10$^{-3}$ mmol), respectively, was prepared in dry THF-d$_8$ (0.7 mL) in the glove box under nitrogen and placed in an NMR tube and sealed with teflon under nitrogen. There was an immediate color change of the solution from blue to green. The $^1$H-NMR spectra recorded (as quickly as possible after mixing) showed fast disappearance of the TIPS-pentacene peaks, suggesting that much of the neutral TIPS-pentacene was quickly converted (concurrent with the visible color changes) into its paramagnetic TIPS pentacene radical anion. The Cp*Ru(TEB)$^+$ cation produced by the process remained in solution, and peaks for Cp*Ru(TEB)$^+$ cation were detected in the NMR. After 30 min, approximately 30% of the unreacted Ru-dimer remained. After 93 minutes approximately 24% of the Ru-dimer remained. 12 hours after sample mixing, 11% of the unreacted Ru-dimer remained. Peaks attributable to TIPS-pentacene slowly reverted presumably due to side reactions of the TIPS pentacene anion with trace oxidants (such as adventitious air and water), and other side products were eventually observed.

Figure 2:
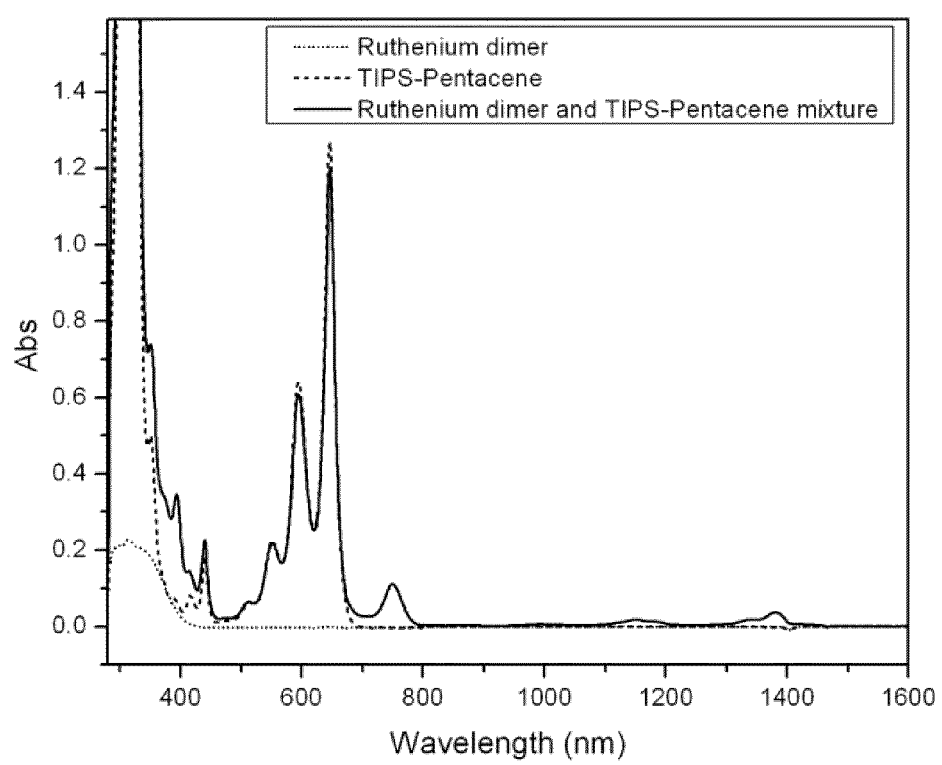
FIG. 2 shows the UV-Vis-NIR spectra in chlorobenzene of a $5.0\times10^{-5}$ M ruthenium dimer solution, a $1.0^\wedge10^{-4}$ M TIPS-Pentacene solution, and a mixture solution ($5.0\times10^{-5}$ M [Cp*Ru(TEB)]$_2$ dimer and $1.0\times10^{-4}$ M TIPS Pentacene) 60 minutes after mixing. See Example 6.

A similar preliminary solution doping experiment was conducted and monitored by UV-Vis-NIR spectroscopy. FIG. 2 shows the overlaid UV-Vis-NIR spectra of 1) a [Cp*Ru(TEB)]$_2$ dimer solution, 2) a TIPS-Pentacene solution, and 3) a chlorobenzene solution of a mixture of [Cp*Ru(TEB)]$_2$ and TIPS-Pentacene 60 min after the two reactants are mixed. Neither [Cp*Ru(TEB)]$_2$ dimer or TIPS-pentacene show absorptions in the 700-1600 nm range. The initial concentration of the ruthenium dimer in the mixture was 5.0×10$^{-5}$ M, and the initial concentration of TIPS-Pentacene was 1.0×10$^{-4}$ M. However, the mixture solution showed growing absorption peaks at 750 nm, 1152 nm, and 1381 nm over the first 120 min after mixing. These new absorption peaks in NIR range are attributable to the formation of TIPS-Pentacene anion, which is the expected direct product from solution n-doping reaction of TIPS-Pentacene by ruthenium dimer in chlorobenzene.

Kinetic Studies of Solution Doping of TIPS Pentacene by [Cp*Ru(TEB)]$_2$ Dimer

A preliminary kinetic study of solution doping of TIPS Pentacene by [Cp*Ru(TEB)]$_2$ dimer in chlorobenzene solvent was conducted, to determine the form of the rate law and reaction order in TIPS Pentacene and [Cp*Ru(TEB)]$_2$ dimer.

A chlorobenzene solution of 1.45×10$^{-3}$ M TIPS-Pentacene (obtained from Sigma-Aldrich St. Louis, Mo., and used as purchased) and 4.31×10$^{-5}$ M [Cp*Ru(TEB)]2 (prepared by the procedure of Example 4) was prepared under nitrogen. The excess of TIPS pentacene was used to determine the dependence of the rate on the concentration of the ruthenium dimer. The solutions were sealed in UHV-PTFE-stopcock 10 mm quartz cuvettes and then taken out of the glove box to a Varian Cary 5E UV-vis-NIR spectrometer for the UV-Vis-NIR absorption measurements. The UV-Vis-NIR absorption spectra of the solution were continuously taken at ambient temperatures for more than 3.5 hours. Three spectra, taken at 3.4 min, 60.4 min. and 210.4 min after the reaction starts are displayed in FIG. 3 $a$ to show the reaction progress over time.

Notably the main absorption peak of [Cp*Ru(TEB)]$_2$ dimer is at 330 nm where TIPS-Pentacene has much higher extinction coefficient. Accordingly it is not feasible to monitor the concentration change of ruthenium dimer by UV-vis-NIR absorption measurements. However, between 700-1600 nm, four new peaks grow smoothly in the mixture solutions. These four new peaks were attributed to the doping product. TIPS-Pentacene mono-anion. The strongest peak among them at 750 nm, was used to measure the formation of the doping product. The change of the 750 nm absorption over time is plotted in FIG. 3 $b$. The absorption at 750 nm was fitted to a first-order reaction fitting curve:

$$A_{750} = -3.38e^{-t/(59.6\,min)} + 3.54$$

Figure 3A:
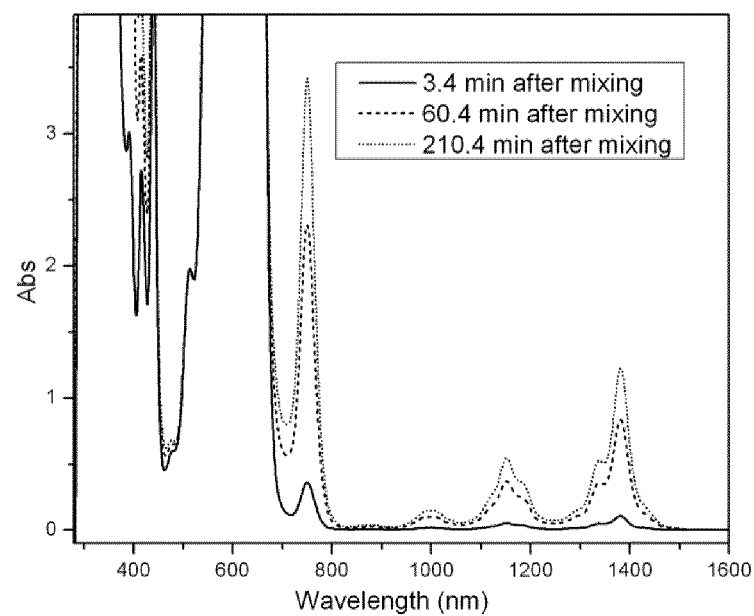
FIG. 3a shows the UV-Vis-NIR absorption spectra of [Cp*Ru(TEB)]2, TIPS Pentacene, and a reacting mixture solution of $1.45\times10^{-3}$M TIPS-Pentacene and $4.54\times10^{-5}$ M [Cp*Ru(TEB)]$_2$ at various reaction times.
Figure 3B:
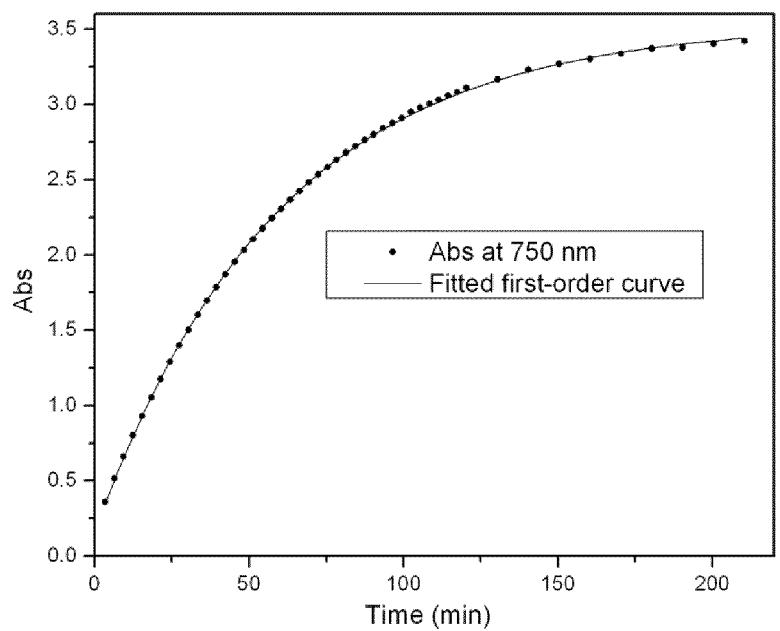
FIG. 3b shows the absorption at 750 nm vs. time, for the mixture solution. The solid line is the fitted first-order reaction curve. See Example 6.

The goodness of fit shown in FIG. 3 $b$ indicates that the n-doping reaction was first-order in the ruthenium dimer, [Cp*Ru(TEB)]$_2$.

Figure 4A:
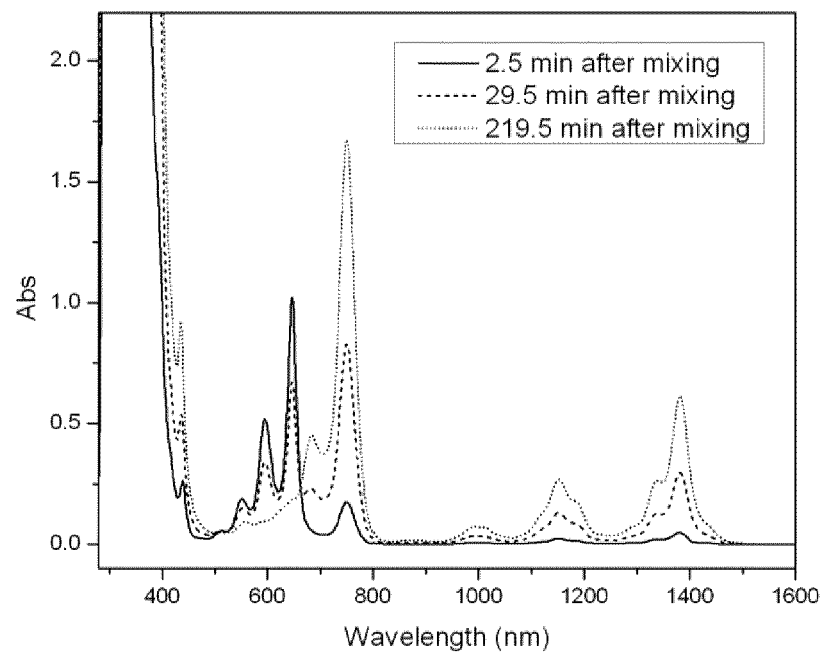
FIG. 4a shows the UV-Vis-NIR absorption spectra of a reacting mixture solution of $4.38\times10^{-5}$ TIPS-Pentacene and $8.82\times10^{-4}$ [Cp*Ru(TEB)]$_2$ at various reaction times.
Figure 4B:
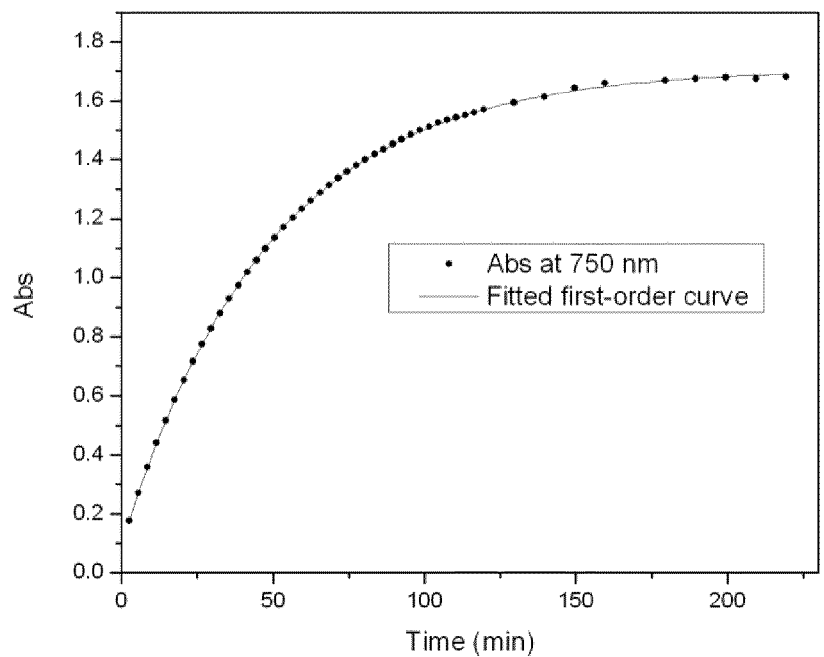
FIG. 4b shows the absorption at 750 nm vs. time for the mixture solution. The solid line is the fitted first-order reaction curve. See Example 6.

A similar mixture solution of 4.38×10$^{-5}$ M TIPS-Pentacene and 8.37×10$^{-4}$ M [Ru(Cp*)(TEB)]$_2$ was prepared under nitrogen. In this reaction, in the presence of the excess of [Ru(Cp*)(TEB)]$_2$, the TIPS-Pentacene is the limiting reagent. TIPS-Pentacene has its strongest absorption peak at 646 nm, where [Cp*Ru(TEB)]$_2$ dimer has no absorption at all. Accordingly it was very convenient to monitor the disappearance of the TIPS-Pentacene and the corresponding formation of the TIPS-Pentacene anion by its absorption at 750 nm during the reaction process simultaneously. The UV-Vis-NIR absorption spectra were continuously recorded for more than 3.5 hours. Three spectra, taken at 2.5 min, 29.5 min, and 219.5 min after the reaction starts are displayed in FIG. 4 $a$. The 750 nm peak grows and the 646 nm absorption keep drops with time. Eventually at around 220 min, the 646 nm peak disappears and the 750 nm stops growing. This indicates that TIPS-Pentacene has been n-doped to form TIPS-Pentacene anion. The kinetic data from 646 nm and 750 nm yield almost the same result, but only the 750 nm data for appearance of the TIPS Pentacene monoanion is shown in FIG. 4 $b$. The increase in absorption at 750 nm was fitted to a first-order reaction curve:

$$A_{750} = -1.61e^{-t/48.7\,min} + 1.71$$

The goodness of fit shown in FIG. 4 $b$ indicates that the rate limiting step of the reaction between TIPS pentacene and [Ru(Cp*)(TEB)]$_2$ is first-order in the TIPS-Pentacene.

Accordingly, the overall rate law for n-doping of TIPS Pentacene by [Cp*Ru(TEB)]$_2$ dimer in chlorobenzene solution can be expressed as:

Reaction rate=$k$·[TIPS-Pentacene]$^1$·[ruthenium dimer]$^1$, where
$k$=11.7 min$^{-1}$ M$^{-1}$ Without wishing to be bound by theory, such a rate law would be consistent with a rate limiting step for the reaction involving an electron transfer mechanism in which the [Cp*Ru(TEB)]$_2$ dimer reduces the TIPS Pentacene.

A similar study of the kinetics of the solution doping of TIPS Pentacene by the Rhodocene dimer in chlorobenzene was attempted. A solution mixture of 1.18×10$^{-3}$ M Rhodocene dimer and 3.90×10$^{-4}$ M TIPS-Pentacene was prepared and monitored at room temperature by UV-Vis-NIR spectra, via procedures similar to those described above. TIPS-Pentacene is the limiting reagent under these conditions.

Figure 5:
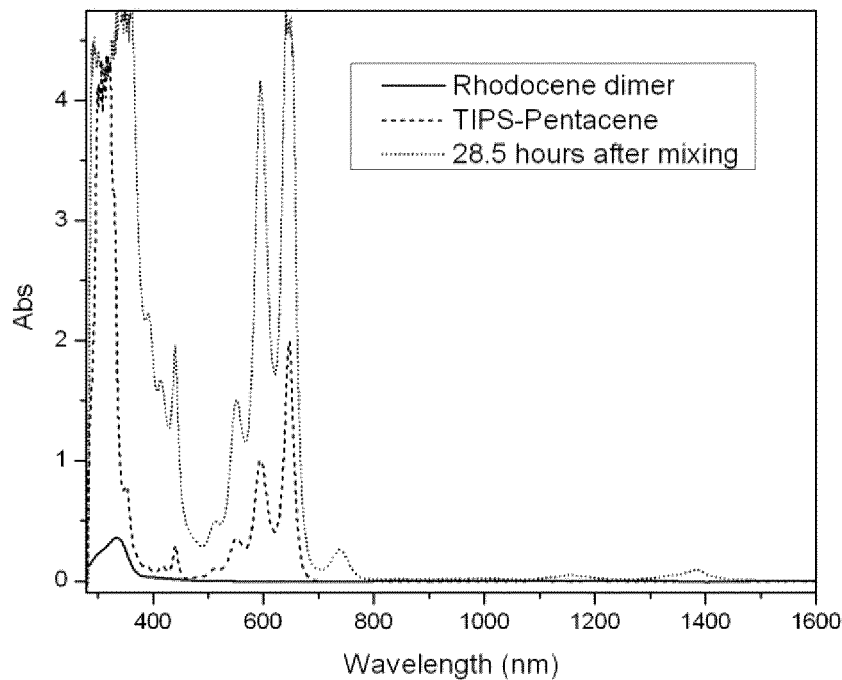
FIG. 5 shows the UV-Vis-NIR absorption spectra of a reacting mixture solution of $4.38\times10^{-5}$ M TIPS-Pentacene and $8.82\times10^{-4}$ M Rhodocene dimer in chlorobenzene at various reaction times. See Example 6.

The spectra of the mixture solution taken at 28.5 hours after the reaction starts are shown in FIG. 5. The absorption peaks of TIPS-Pentacene anion are clearly visible in the 700-1600 nm range, and this provides direct evidence that the TIPS-Pentacene is reduced and/or n-doped by rhodocene dimer in chlorobenzene. However, even after 28 hours, there was still a substantial amount of TIPS-Pentacene un-reacted. The Applicants concluded that the n-doping reaction of TIPS-Pentacene by the Rhodocene dimer [Rh(Cp)$_2$]$_2$ is considerably slower than the similar reaction of the ruthenium dimer [Ru(Cp*)(TEB)]$_2$, and discontinued the kinetic study.

Example 7

N-Doping of Copper Phthalocyanine by Vacuum Co-Deposition with Rhodocene Dimer

Copper phthalocyanine ("CuPc") was n-doped by vacuum co-deposition of CuPc and Rhodocene Dimer (see Example 1) onto substrates, and the doped material produced was studied by Ultra-Violet Photoemission Spectroscopy ("UPS") and Inverse Photoemission Spectroscopy ("IPES") studies demonstrated Fermi level shifting in the doped sample indicating that n-doping of the CuPc in fact occurred. Then a simple diode device comprising a film of the n-doped CuPc was subjected to current density measurements that demonstrated that the current carrying capacity of the n-doped CuPc film was increased by a factor of approximately 10$^6$ as compared to a similar undoped CuPc device/film.

UPS/IPES Studies of CuPc N-Doped by Rhodocene Dimer

CuPc, having the structure shown below, obtained from Sigma-Aldrich (St. Louis, Mo.) is typically described in the art as a hole transporting organic semiconducting material, but it has a relatively high electron affinity of 3.3 eV. Some of the Applicants have previously demonstrated n-doping of CuPc with decamethylcobaltocene, and that the electron transport characteristics of CuPc can be comparable in magnitude to its hole transport characteristics (see Chan et al, *Organic Electronics*, 9 (2008) 575-581).

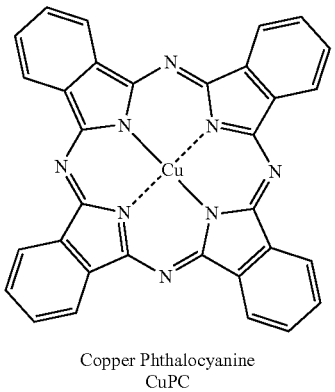

Copper Phthalocyanine
CuPC

The CuPc was purified by two cycles of gradient sublimation. Doped and undoped films of CuPc on Au substrates were prepared as follows. Silicon wafers having a pre-deposited Titanium adhesion layer (~5 nm thickness) were obtained from Alfa Aesar (Ward Hill, Mass. 01835) and a gold film of a thickness of ~100 nm was vacuum deposited on the wafer at a pressure of ~100 nm, then the Au coated wafer was cleaned by immersion in boiling acetone (20 minutes) and boiling methanol (20 minutes), then dried under a flow Of $N_2$ gas.

The cleaned Au substrates were transferred to an ultra-high vacuum (UHV) system for organic film deposition and spectroscopic analysis. The UHV system comprises three chambers: (i) a growth chamber, in which undoped organic semiconductor films are deposited (to prevent contamination with the dopants evaporated in the preparation chamber); (ii) the preparation chamber, for vacuum deposition of doped organic semiconductors and in-situ I-V measurements; and (iii) the analysis chamber, in which direct and inverse photoemission spectroscopy measurements are performed. Direct photoemission is done with a He discharge photon source from SPECS, and a double-pass cylindrical mirror analyzer electron detector (Perkin-Elmer PHI 15-255 GAR). The inverse photoemission set-up is home-made and described in Wu, et al., *Chem. Phys. Lett.* 272, 43 (1997). I-V measurements were made with a semiconductor parameter Analyzer HP 4155A.

An approximately 10 nm of undoped ("intrinsic") CuPc ("i-CuPc") was deposited on cleaned Au substrates at $10^{-6}$ Torr in the growth chamber by evaporation from a quartz crucible resistively heated by a tungsten coil. The rate of molecular evaporation and the film thickness are monitored by quartz crystal microbalance. The rate for i-CuPc deposition was ~1 Å/sec.

Separately, an Au substrate previously coated with i-PC was transferred to the preparation chamber, which contained two different quartz crucible/microbalance set-ups, one of which contained pre-sublimed CuPc, and the other contained rhodocene dimer. The CuPc (at a rate of ~1 Å/sec) and rhodocene dimer (at a rate of ~0.035 Å/sec, resulting from heating the quartz crystal at a temperature of 120° C.) were co-evaporated on top of the i-Pc film to a thickness of ~88 Å, to form a film comprising CuPc doped with ~3.5% rhodocene dimer, which will be termed "n-CuPc." The intermediate undoped i-CuPc layer produced in this diode device provides a buffer layer between the substrate and n-CuPc doped layer, to prevent n-dopants from reaching the Au interface and modifying the work function of the Au substrate).

Figure 6A:
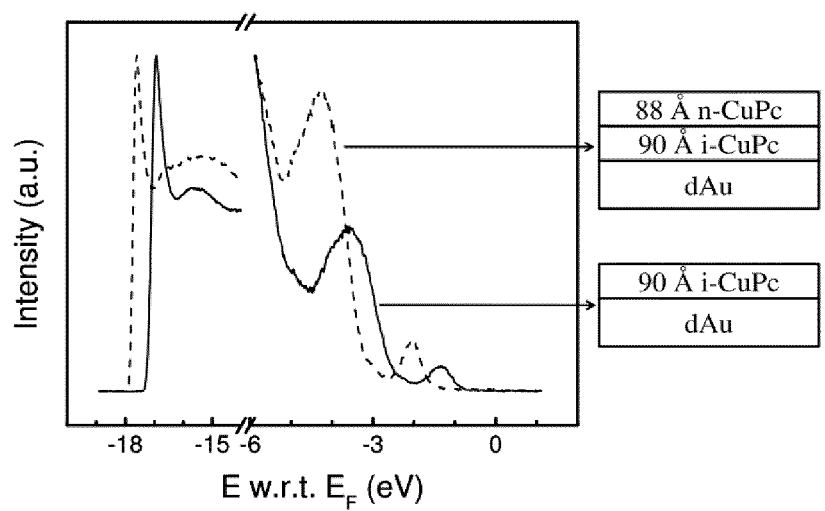
FIG. 6a shows UPS He I spectra of 90A undoped CuPc (solid line) and subsequently evaporated 88 Å CuPc doped with 3.5 wt. % rhodocene dimer (dashed line).
Figure 6B:
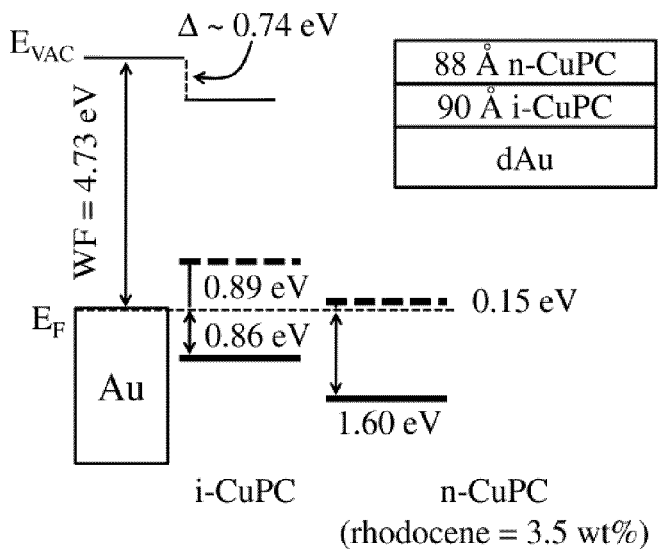
Figure 6C:
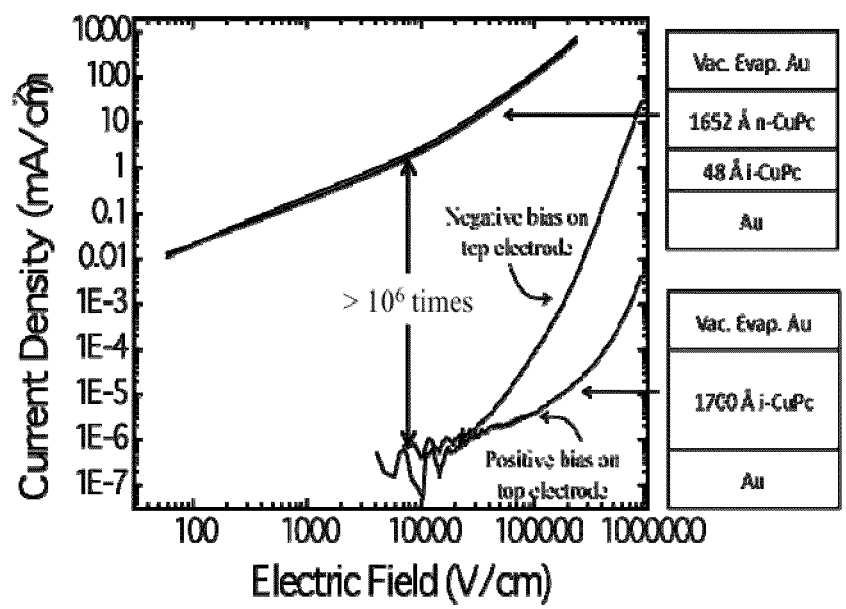
FIG. 6c shows the results of in situ current vs. voltage (I-V) measurements on similar CuPc diode devices, either undoped (bottom two curves) and doped with rhodocene dimer (top two curves). Structures of the two diodes are illustrated on the right. See Example 7.

The Au substrates coated with i-CuPc and/or n-CuPc films (whose structure are shown in FIG. 6 *a* were transferred to the analysis chamber and analyzed by UPS/IPES, and the resulting spectra are also shown in FIG. 6 *b*. The interpretation of these spectra is discussed in detail above results in the schematic energy diagram shown in FIG. 6 *c*.

I-V Studies of CuPc N-Doped by Rhodocene Dimer ("n-CuPc")

Diode devices comprising i-CuPc and/or n-CuPc layers deposited on Au similar to those described above, but having an additional Au electrode layer on top for establishing electrical contact, were prepared by procedures similar to those described above, and subjected to current-voltage ("I-V") analysis in the preparation chamber.

A 1700 Å layer of i-CuPc was evaporated onto a cleaned Au substrate via the procedure described above, then Au was deposited on top in the growth chamber in small $2\times10^{-4}$ cm$^2$ pads through a shadow mask to form a top contact on the resulting "i-CuPc device."

A similar "n-CuPc diode" device was made by similar procedures, by depositing a 48 Å buffer layer of "i-CuPc on a cleaned gold substrate (in order to provide a buffer layer between the substrate and doped layer, to prevent dopants from reaching the Au interface and modifying the work function of the Au substrate). A subsequent 1652 Å layer of "n-CuPc was then co-deposited on the i-CuPc surface via procedures described above, followed by deposition of an Au top contact electrode.

Figure 7A:
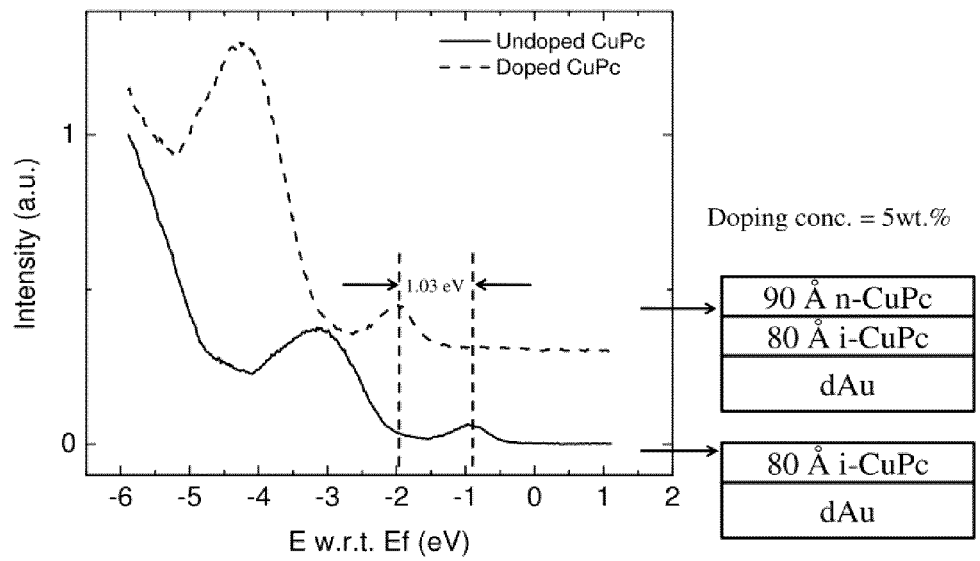
FIG. 7a shows UPS He I spectra of 90A undoped CuPc (solid line) and subsequently evaporated 88 Å CuPc doped with 5.0 wt. % $(Fe(C_5Me_5)(C_6H_6))_2$dimer.
Figure 7B:
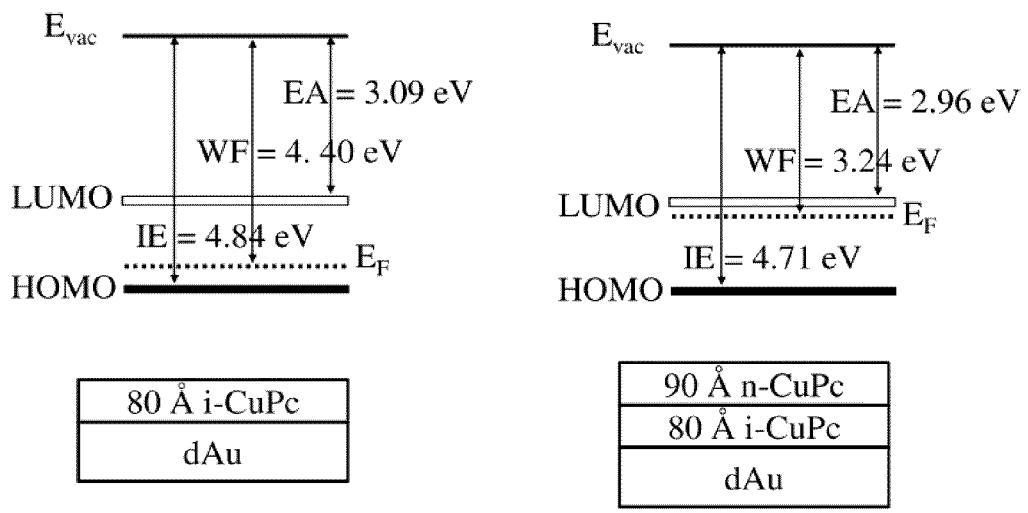

In situ I-V measurements of both of the i-CuPc and n-CuPc diode devices were performed in the preparation chamber using a thin gold wire to contact the Au pads. and I-V data were acquired with a semiconductor parameter analyzer (HP 4155A). The structures of both of the i-CuPc and n-CuPc diode devices are shown in FIGS. 7 *a* and 7 *b*.

Example 8

N-Doping of P(NDI$_2$OD-T$_2$) Copolymer by Solution Doping with the Rhodocene Dimer P(NDI$_2$OD-T$_2$) (see Yan et al, *Nature* 457, 679-686, 2009, and available commercially from Polyera of Skokie Ill. as N2200), is one of the best known and most efficient polymeric organic electron-transporting semiconductors known, and has the structure shown below, is solution processable, and has been reported to have electron mobilities between about 0.1-0.8 cm$^2$/Vs. The electron affinity of P(NDI$_2$OD-T$_2$) was measured by inverse photoemission spectroscopy (IPES) and found to be 3.92 eV.

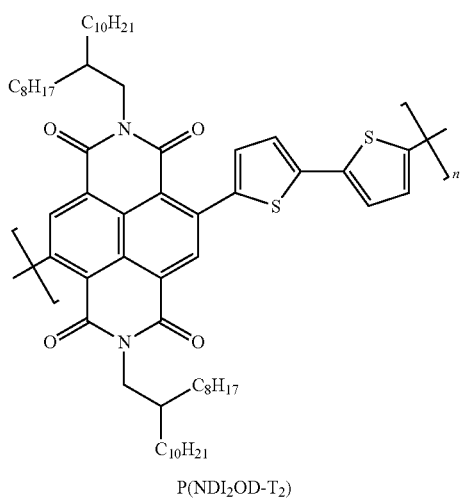

P(NDI$_2$OD-T$_2$)

For the spectroscopic studies, the substrates used were highly doped Si wafers covered with a 5 nm Ti adhesion layer, upon which ~100 nm Au layers were evaporated. The Au substrates were cleaned with sequential 10 min baths in acetone and methanol, and blown-dried with nitrogen.

Approximately 10 nm thick films of P(NDI$_2$OD-T$_2$), both undoped and doped with 1 wt % of rhodocene dimer, were coated on the Au substrates as follows. A chlorobenzene solution of P(NDI$_2$OD-T$_2$) containing 1 wt % rhodocene dimer was prepared in a N$_2$ glove-box and spin-coated at 4000 rpm for 30 s onto the Au substrates, and transferred with brief air exposure (<1 min) to a UHV analysis chamber for UPS measurements.

Figure 8C:
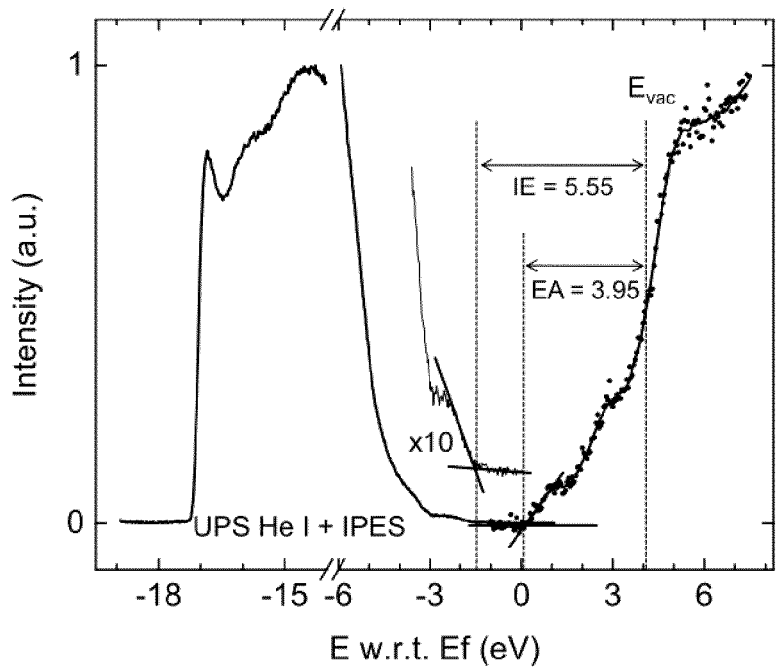
FIG. 8c shows combined UPS He I and IPES spectra acquired on the P(NDI$_2$OD-T$_2$) film doped with 2 wt. % Rhodocene dimer.
Figure 8D:
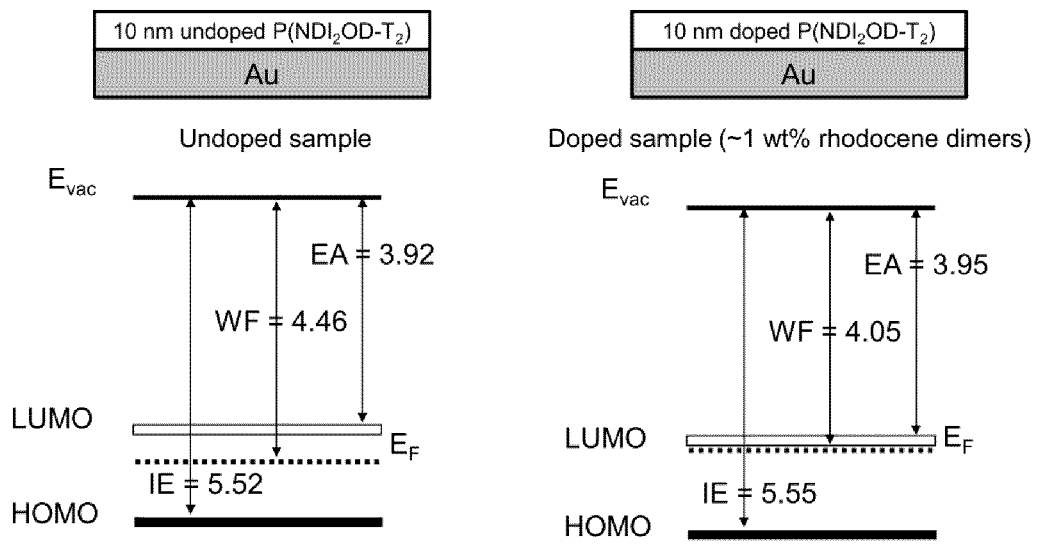
FIG. 8d shows a schematic energy level diagram for the undoped and doped P(NDI$_2$OD-T$_2$) films based on the spectral measurements. See Example 9.

FIGS. 8 a and 8 b show (a) the photoemission cutoff and (b) the HOMO region of the UPS He I spectra acquired on the undoped and 1 wt. % rhodocene doped P(NDI$_2$OD-T$_2$) samples. Upon doping with the rhodocene, both the photoemission cutoff edge and the HOMO edge of P(NDI$_2$OD-T$_2$) shift away from the Fermi level by 0.44 eV (as seen from the difference between the two intersection points of the top of the HOMO in FIG. 8 b, which is clear evidence of n-doping of the P(NDI$_2$OD-T$_2$) film by the rhodocene dimer.

To measure the energy difference between the Fermi level and LUMO in the doped sample and to also investigate the electronic structure of P(NDI$_2$OD-T$_2$), IPES spectra were also recorded on the rhodocene dimer doped P(NDI$_2$OD-T$_2$) film on Au. The ionization energy, electron affinity. HOMO-LUMO gap of the undoped P(NDI$_2$OD-T$_2$) film, were measured to be 5.52 eV, 3.92 eV, and 1.60 eV, respectively. FIG. 8 c shows the combined UPS He I and IPES spectra acquired on a P(NDI$_2$OD-T$_2$) film n-doped with 1 wt % rhodocene dimer, and shows an ionization energy of 5.55 eV, and electron affinity of 3.95 eV, and therefore a HOMO-LUMO gap of 1.6 eV.

FIG. 8 d shows a schematic energy level diagram for the undoped and doped P(NDI$_2$OD-T$_2$) films based on the spectral measurements. Upon doping, the Fermi level of the rhodocene dimer doped P(NDI$_2$OD-T$_2$) shifts upward in the gap and reaches a position of 4.05 eV, only 0.1 eV below the P(NDI$_2$OD-T$_2$) LUMO, which is evidence of n-doping of the P(NDI$_2$OD-T$_2$) LUMO.

Films of P(NDI$_2$OD-T$_2$), undoped or doped with rhodocene dimer were then prepared on ITO substrates for 1-V measurements of the semiconductor films. Substrates coated with Indium Tin Oxide ("ITO") were obtained from Delta Technologies, Limited, Intergalactic Headquarters, 13960 North 47th Street, Stillwater, Minn. 55082-1234 USA, and brushed with a detergent (Alconox) solution; sonicated in the detergent solution for 15 min; rinsed with copious DI water for 5 min; sonicated in DI water for 15 min; sonicated in acetone for 15 min and in methanol for 15 min: then dried with dry N2 and exposed to UV ozone for 30 min.

The P(NDI$_2$OD-T$_2$) films (~50 nm thick, either undoped or doped with rhodocene dimer) were spin coated onto the ITO substrates in a N$_2$ glove box, using a solution prepared from 15.8 mg P(NDI$_2$OD-T$_2$) and/or 0.3 mg of Rhodocene dimer dissolved in 1 ml chlorobenzene, at a spin speed of 2000 RPM for 40 sec. The film coated devices were transferred without ambient exposure to a N$_2$ glove box for mercury drop I-V measurements, using top contact with an Hg-electrode (mercury probe Model CGME 1105, Bioanalytical Systems Inc. W. Lafayette, Ind. 47906). Current was measured as a function of applied voltage with a semiconductor parameter analyzer (HP-4155A).

Figure 9:
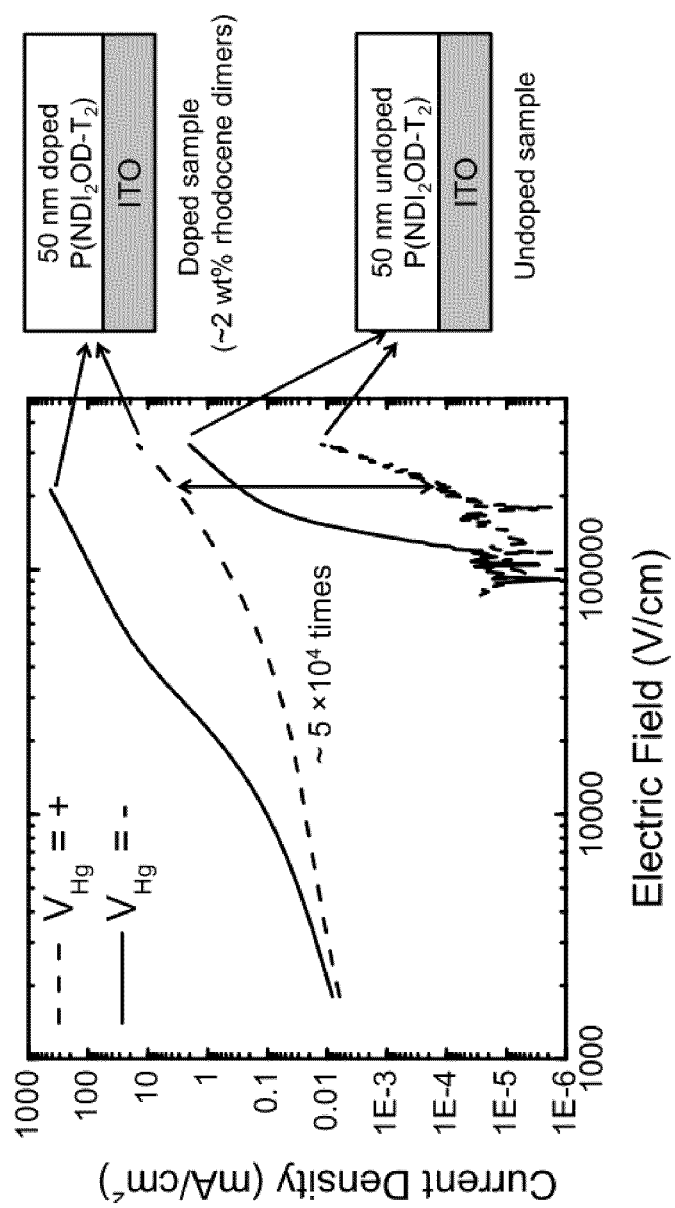
FIG. 9 shows the I-V characteristics of undoped and 2 wt. % rhodocene dimer doped P(NDI$_2$D-T$_2$) (film thickness~50 nm) spin coated onto an ITO substrate See Example 9.

FIG. 9 shows I-V characteristics measured with the Hg probe on the undoped and 2 wt. % rhodocene doped P(NDI$_2$OD-T$_2$) films spin-coated onto ITO. The current density carried observed in the rhodocene doped P(NDI$_2$OD-T$_2$) films is enhanced by several orders of magnitude (for both polarities of the electrodes relative to ITO), especially at low electric fields. For example, looking at the dashed curves, which correspond to electron injection from ITO into the n-doped P(NDI$_2$OD-T$_2$) films, the conductivity enhancement is about $5 \times 10^4$ times at a field of $2 \times 10^5$ V/cm as compared to an undoped P(NDI$_2$OD-T$_2$) film, which is strong evidence that the rhodocene dimer dopes P(NDI$_2$OD-T$_2$).

Variable temperature measurements of the conductivity of similar 50 nm thick P(NDI$_2$OD-T$_2$) films, solution doped with 2 wt. % rhodocene dimer, deposited on a quartz substrate pre-patterned with interdigitated gold electrodes were then carried out. Quartz substrates were boiled in acetone for 10 min; sonicated in acetone for 10 min; boiled in methanol for 10 min; sonicated in methanol for 10 min; and dried under N$_2$. Interdigitated electrodes (FIG. 10 a) were evaporated onto the quartz substrates, using a shadow masks: first with 10 nm Ti as an adhesion layer on the quartz, followed by a 100 nm Au layer, to form 5 mm interdigitated electrodes separated by a gap of 150 p.m. On top of the electrodes, a doped P(NDI$_2$OD-T$_2$) film was spin coated under N$_2$ from a solution of 15.8 mg NDI in 1 ml chlorobenzene, at a speed of 2000 RPM for 40 sec. without post annealing.

VT-IV measurements were performed in a UI-1V system equipped with a temperature-controlled sample stage. Samples were transferred to the UM/system with a brief air exposure (<1 min). A temperature controller (Lakeshore 325; Lake Shore Cryotronics, Inc. 575 McCorkle Blvd, Westerville, Ohio 43082, USA) was used to control the sample temperature during measuring. I-V curves were recorded from −50 V to +50 V using a source meter (Keithley 2400, Keithley Instruments, Inc. 28775 Aurora Road, Cleveland, Ohio 44139). Because of the electrode separation (150 μm), the electric field in the measurement is small and the current is dominated by ohmic conduction, and the I-V curves are linear. Conductivity measurements were carried out in the temperature range between 170K and 300K (below 170K the measured current is dominated by noise).

Figure 10A:
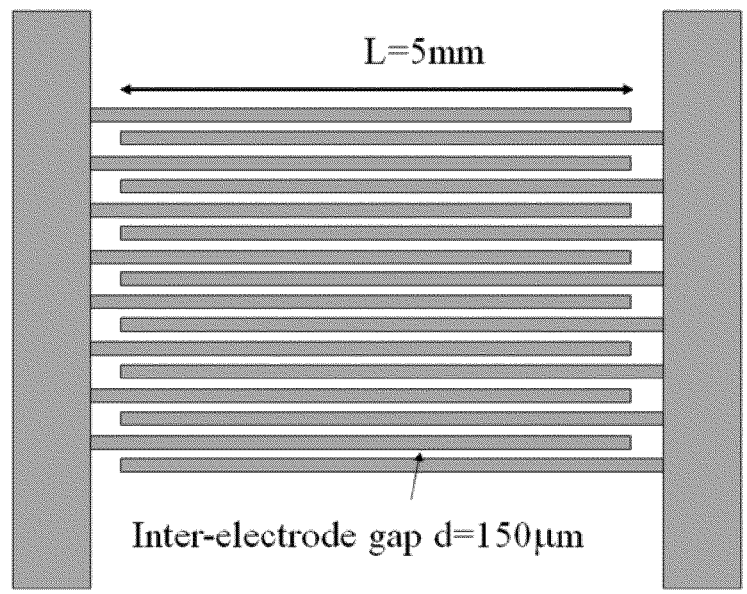
FIG. 10a shows a diagram of the quartz substrate with interdigitated Au electrodes used for variable temperature conductivity measurements of Rhodocene dimer doped films of P(NDI$_2$OD-T$_2$).
Figure 10B:
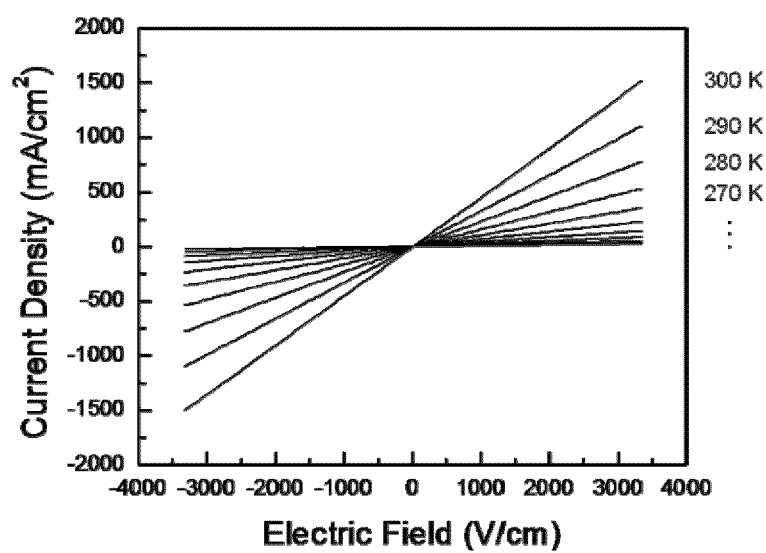
FIG. 10b shows current density vs. electric field (J-F) results at a range of temperatures between 170 K and 300K.
Figure 10C:
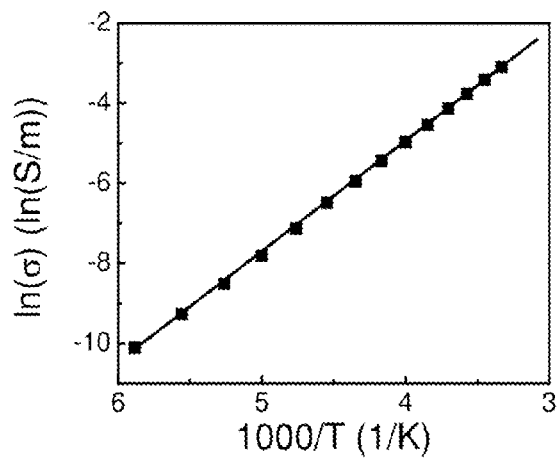
FIG. 10c shows conductivity as a function of 1000/T for 50 nm thick P(NDI$_2$OD-T$_2$). film doped with 2 wt. % rhodocene dimer.

Between 170 K and 300 K, the J-F curves were linear over the entire field range (FIG. 5 b). The conductivity (σ) at different temperatures was extracted from the linear fit to the J-F curves, and In(σ) was plotted as a function of 1000/T as can be seen in FIG. 10 b As can be seen from FIG. 10 c, the conductivity of the rhodocene dimer doped P(NDI$_2$OD-T$_2$) film follows a simple Arrhenius dependence on temperature with activation energy $E_a=0.23$ eV. While such a low activation energy presumably results from an initial filing of deep trap states by electrons released by the rhodocene dimer dopant, followed by electron transport then occurring in/from states closer to the mobility edge. The 0.23 eV activation energy is lower than that obtained for holes in p-doped α-NPD:Mo(tfd)$_3$ (see Qi et al, *Chem. Mat.* 22, 524 (2010)) and approaching that obtained for p-doped pentacene:F$_4$-TCNQ (which is likely a significantly more ordered solid). Conductivity at room temperature was $3.7\times10^{-4}$ S/cm, indicating that electron mobility in the rhodocene n-doped P(NDI$_2$OD-T$_2$) is likely high.

Example 9

N-Doping of TIPS-Pentacene by Solution Co-Deposition with Rhodocene Dimer

TIPS-Pentacene, having the structure shown below, obtained from Sigma-Aldrich (St. Louis, Mo.), is well known as a hole transporting organic semiconducting material that is solution processable, but readily forms crystalline or semi-crystalline films and/or phases when cast from solutions that can exhibit hole mobilities of about 1 cm$^2$/Vsec. [Hamilton et al, *Adv. Mater.* 21, 1166 (2009)].

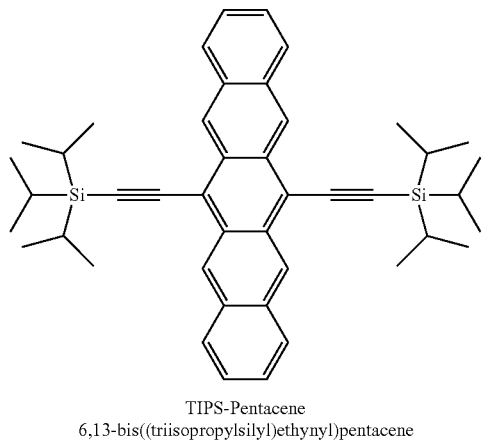 [SMILES: CC(C)[Si](C#Cc1c2cc3ccccc3cc2c(C#C[Si](C(C)C)(C(C)C)C(C)C)c2cc3ccccc3cc12)(C(C)C)C(C)C]

TIPS-Pentacene
6,13-bis((triisopropylsilyl)ethynyl)pentacene

This example documents n-doping of TIPS-Pentacene by solution co-deposition of TIPS-Pentacene and rhodocene dimer onto substrates, and spectroscopic study of the n-doped material by Ultra-Violet Photoemission Spectroscopy ("UPS") and Inverse Photoemission Spectroscopy ("IPES") to demonstrate Fermi level shifting in the doped sample, providing evidence that doping of the TIPS-Pentacene in fact occurred. Then a simple diode device comprising a film of the n-doped TIPS-Pentacene was subjected to measurements that demonstrated that the current carrying capacity of the n-doped TIPS-Pentacene film was increased by a factor of approximately 100 as compared to a similar undoped TIPS-Pentacene device/film.

UPS/IPES Studies of TIPS-Pentacene N-Doped by Rhodocene Dimer

Indium-tin oxide ("ITO") substrates were obtained from Delta Technologies and cleaned by procedures described above. 10 mg samples of undoped TIPS-pentacene were dissolved in 1 ml chloroform solutions in air, and taken into an N$_2$ glove box. 0.4 mg of rhodocene dimer was added to a 1 ml solution of chlorobenzene containing the TIPS-pentacene. The solution was then sonicated for 5 min to completely dissolve the materials. Thin films of undoped and doped TIPS-pentacene were spin-coated onto cleaned ITO substrates in a N$_2$ box at 4000 RPM for 30 sec. No post-annealing was performed. The thin films were transferred to an ultra-high vacuum (UHV) system for UPS/IPES measurements. AFM imaging was performed on these TIPS-pentacene films to determine the average film thickness.

Figures 11A, 11B:
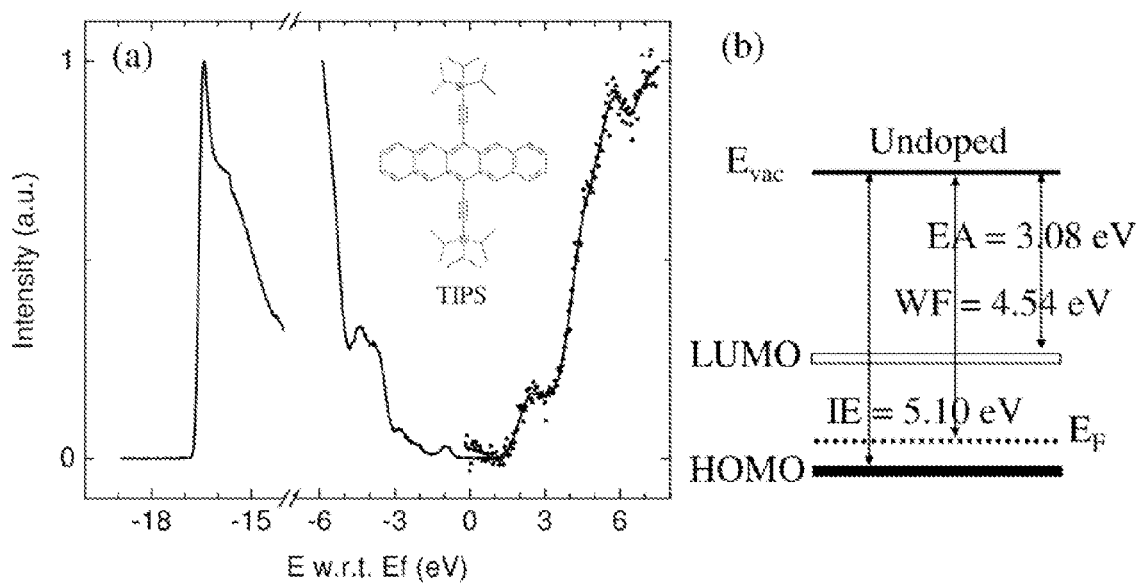
FIG. 11a shows the combined UPS/IPES spectra acquired on a thin film (14 nm) of undoped TIPS-pentacene on ITO.
FIG. 11b shows an energy level diagram based on the spectroscopic data shown in FIG. 11a. See Example 10.

FIG. 11 *a* shows the combined UPS He I and IPES spectra acquired from the 14 nm thick undoped TIPS-pentacene films. From those spectra, the Ionization energy (IE) and electron affinity (EA) of TIPS-pentacene was determined to be 5.10 eV and 3.08 eV, respectively. FIG. 11 *b* shows an energy level diagram illustrating the relative energetic relationships relative to the undoped TIPS-pentacene HOMO and LUMO.

Figures 12A, 12B:
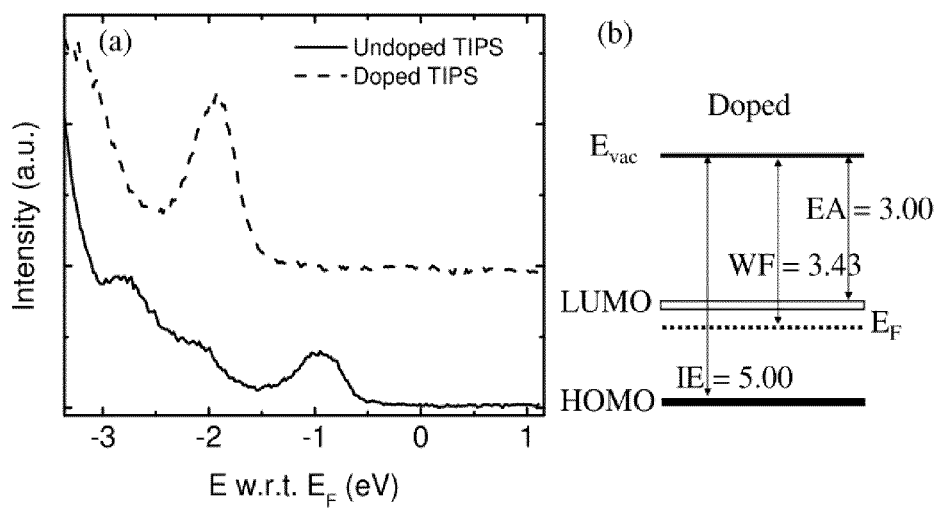
FIG. 12a shows the expanded HOMO regions of the UPS He I spectra acquired on the undoped TIPS-Pentacene film (solid line) and on the TIPS-pentacene film doped with 4 wt. % rhodocene dimer (dash line).
FIG. 12b shows the energy level diagram of the n-doped TIPS-Pentacene film, with the Fermi level raised below the TIPS LUMO (FIG. 9b).

FIG. 12 *a* compares the expanded HOMO regions of the UPS He I spectra acquired on undoped the undoped TIPS-Pentacene film (solid line) and on the TIPS-pentacene film doped with 4 wt. % rhodocene dimer (dash line). The UPS spectrum for the rhodium n-doped film shifts towards toward higher binding energies by 1.01 eV with respect to that of the undoped film, i.e. the Fermi level ($E_F$) of the doped film shifts upwards towards the TIPS-pentacene LUMO. As shown in the energy level diagram of FIG. 12 *b*, the final Fermi Level ("$E_F$") position of the n-doped TIPS-Pentacene film is raised to 0.43 eV below the TIPS LUMO (FIG. 9 *b*), a clear indication of n-type doping of the TIPS Pentacene by the Rhodocene.

Film Conductivity Studies of TIPS-Pentacene N-Doped by Rhodocene Dimer

Film conductivity studies of rhodocene doped TIPS-pentacene were carried out as follows. 0.5 mg of rhodocene dimer and 11 mg TIPS-pentacene were mixed in 0.6 ml of chlorobenzene in an N$_2$ glove box, and thoroughly stirred at room temperature for 2 hours to completely dissolve the materials, to produce a 5 wt % solution of the rhodocene/TIPS-pentacene in chlorobenzene. Quartz glass substrates patterned with inter-digitated Au electrodes with 150 [tin spacings (see description above]), The undoped and doped films were formed by drop-casting the solution of pure TIPS-pentacene or the co-solution (with dopant) in a N$_2$ box onto the substrates that were heated to 90° C., followed by post-annealing at the same temperature for 5 min. Electrical characteristics of the resulting simple devices were measured in the glove box by connecting a two point probe station to the gold electrodes of the devices.

Figure 13:
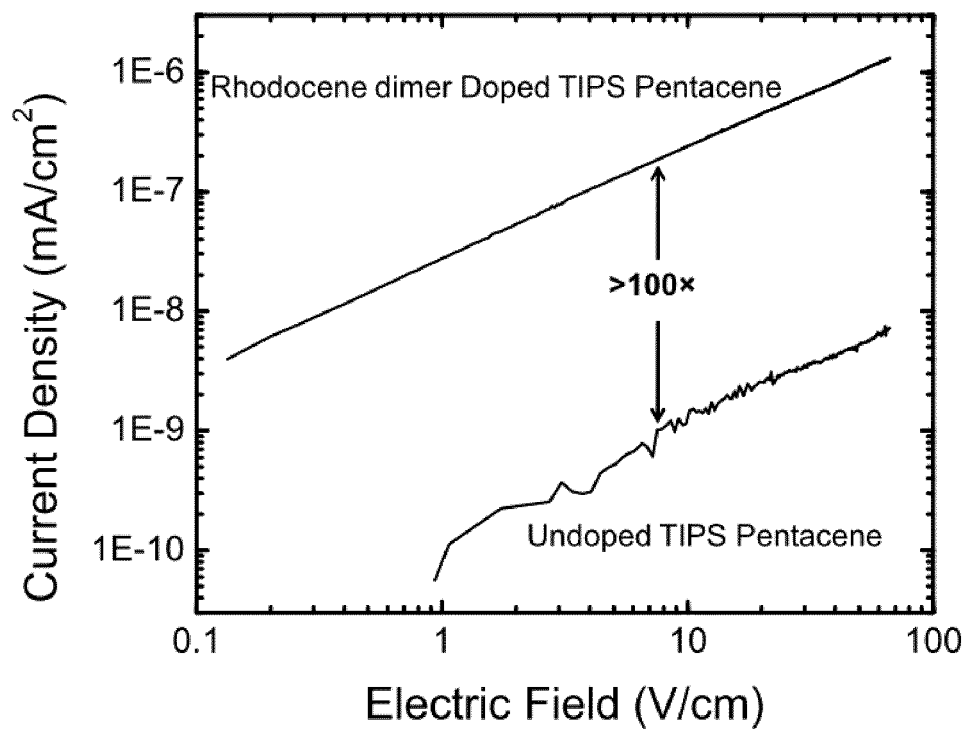
FIG. 13 discloses a graph of the conductivity characteristics of both undoped TIPS Pentacene films and TIPS Pentacene films doped with 5 wt % Rhodocene dimer. See Example 9.

FIG. 13 shows the current density electric field (J-F) curves measured from both undoped and 5 wt. % RhCp dimer doped TIPS-pentacene films. Given the 150 μm spacing between Au electrodes and the applied voltage that was limited to 50 V, the electric field in these J-V measurements is very low ($E=0.1^{\sim}100$ V/cm). It should be noted that TIPS-pentacene is typically known as a hole conducting material, not an electron conducting material, and the lower curve for the undoped TIPS Pentacene is a hole current.

The measured current densities for the n-doped TIPS Pentacene film devices was an electron current, and linear relation between log(J) and log(F) with a slope of 1, as shown in FIG. 13, and was therefore dominated by ohmic conduction. The measured current densities of the n-doped TIPS-pentacene film was over two orders of magnitude larger than that of the undoped TIPS Pentacene film. These results indicate that the Rhodocene was able to n-dope TIPS Pentacene film. It seems that Rhodocene was clearly able to dope TIPS Pentacene, with an electron affinity of 3.1 eV. The conductivity enhancement was significantly less than the factor $10^6$ observed with other materials, but the electron (rather than

Example 12

N-Doping of PDTP-BT Copolymer by Solution Co-Deposition with Rhodocene Dimer PDTP-BT, (Poly-Dithienopyrrole-co-Benzothiadiazole) a low band gap hole conducting copolymer having the structure shown below, was prepared by a procedure analogous to that reported by Yue et al, *J. Mater. Chem* 2009, 19, 2199-2206.

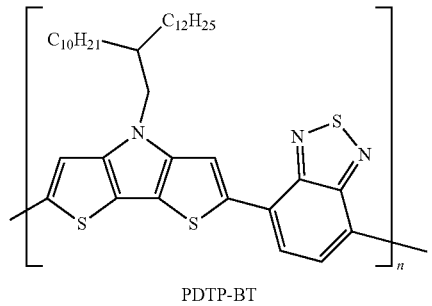

PDTP-BT

Spectroscopy: Fermi Level Shift Upon Rhodocene Dimer Doping of PDTP-BT

Undoped and doped PDTP-BT films were spin-coated onto Au/Ti/Si substrates (previously described above]) for spectroscopic studies. To prepare undoped PDTP-BT solutions, 2.7 mg of PDTP-BT was dissolved in 1 ml chlorobenzene in an N2 glove box. To prepare Rhodocene dimer doped PDTP-BT solutions, 2.7 mg of PDTP-BT and 0.16 mg of rhodocene dimer were dissolved together in 1 ml chlorobenzene and sonicated for 5 min in a $N_2$ glove box. Spin-coating of the solutions on the substrates was done in $N_2$ at 3000 RPM for 40 sec, followed by a 2 hour, 60° C. annealing. The films on the substrates were transferred with short ambient exposure to a UI-1 V system for UPS/IPES measurements.

Figures 14A, 14B:
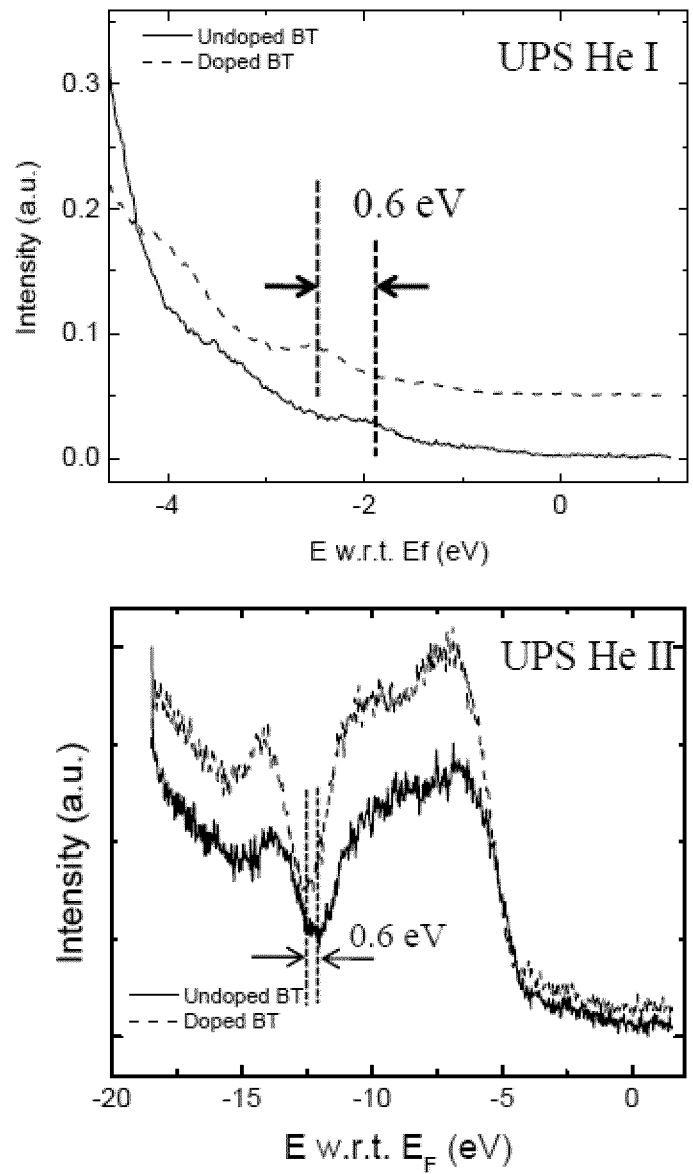
FIGS. 14a and 14b show the He I and He II UPS spectra, respectively, of undoped BT (full line) and BT doped with Rhodocene dimers (dashed line).
Figure 14C:
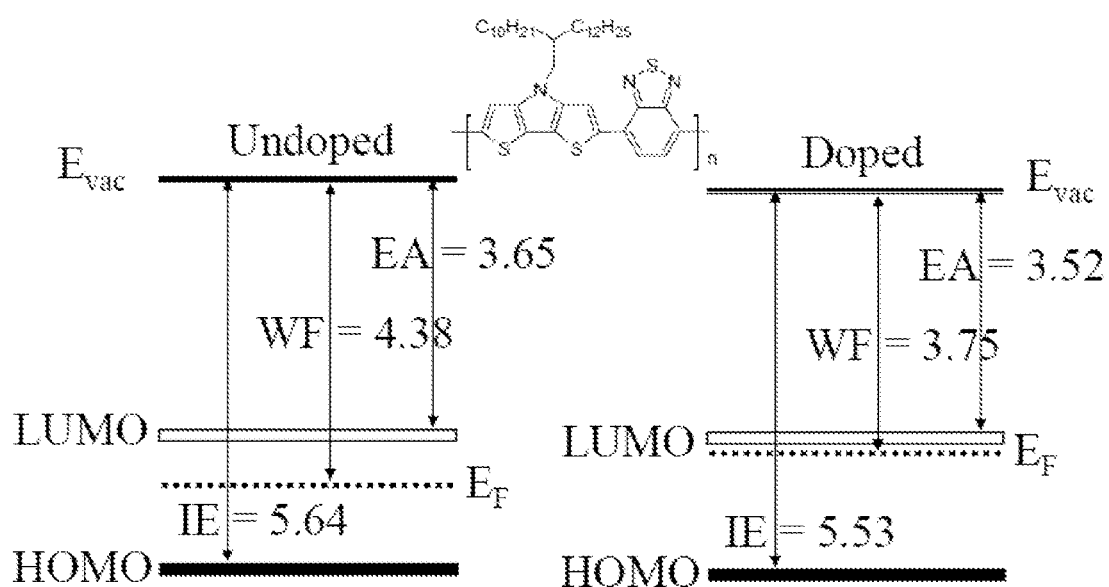
FIG. 14c shows the energy diagram of BT, with the Fermi level shift toward the LUMO upon doping. See Example 9.

The analysis of the UPS and IPES data give an ionization energy (IE) of ~5.64 eV, and a relatively large electron affinity (EA) of ~3.65 eV for PDTP-BT, as reported in the energy level diagram in FIG. 14 c. IE and EA vary slightly between the undoped and doped film, however these variations are within the experimental uncertainties.

The primary difference between undoped and doped films is the Fermi level shift upon doping. The shift of the molecular levels toward higher binding energy upon doping in both He I (FIG. 14 a) and He II (FIG. 14 b) spectra is a clear indication of Fermi level movement upward in the energy gap by approximately 0.6 eV, to within about 0.2 eV of the PDTP-BT LUMO (deduced from the shift of the valence features, the position of the HOMO and the gap of the material. The rhodocene dimer successfully n-dopes the PDTP-BT copolymer. However, no measurable electron current was obtained, either from the undoped or the doped films. Although not wishing to be bound by theory, the Applicants speculate that the PDTP-BT copolymer was successfully n-doped, but theorize that the electron transport properties of the n-doped PDTP-BT copolymer are likely sufficiently poor that no actual electron transport was measurable.

Example 11

Attempted N-Doping of TFB Copolymer by Solution Co-Deposition with Rhodocene Dimer TFB, poly(9,9'-dioctylfluorene-co-bis-N,N'-(4-butylphenyl)diphenylamine) a known low band gap hole conducting copolymer having the structure shown below, was obtained from Sigma-Aldrich (St. Louis, Mo.), can exhibit hole mobilities above $10^{-2}$ cm$^2$/Vs. [Fong, et al., *Adv. Funct. Mater.* 19, 304 (2009)].

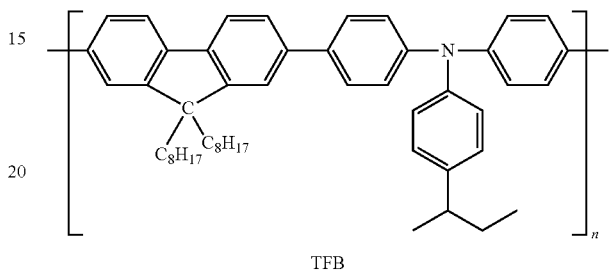

TFB

Spectroscopy of Rhodocene Dimer Doping TFB

To prepare an undoped TFB solution, 2.7 mg TFB was dissolved in 1 ml chlorobenzene in an N2 glove box. To prepare a doped TFB solution, 2.7 mg TFB and 0.16 mg rhodocene dimer (6 wt %) were dissolved together in 1 ml chlorobenzene in a glove box, and both samples were sonicated for 30 min, which appeared to completely dissolve the materials. Thin films (~10 nm) of undoped and doped TFB were prepared on aluminum substrates covered with their native oxide (Al$_2$O$_x$) by spin-coating in N$_2$ at 3000 RPM for 40 sec. No post-annealing was performed. The films were transferred without ambient exposure to a UHV system for UPS measurements.

Figure 15A:
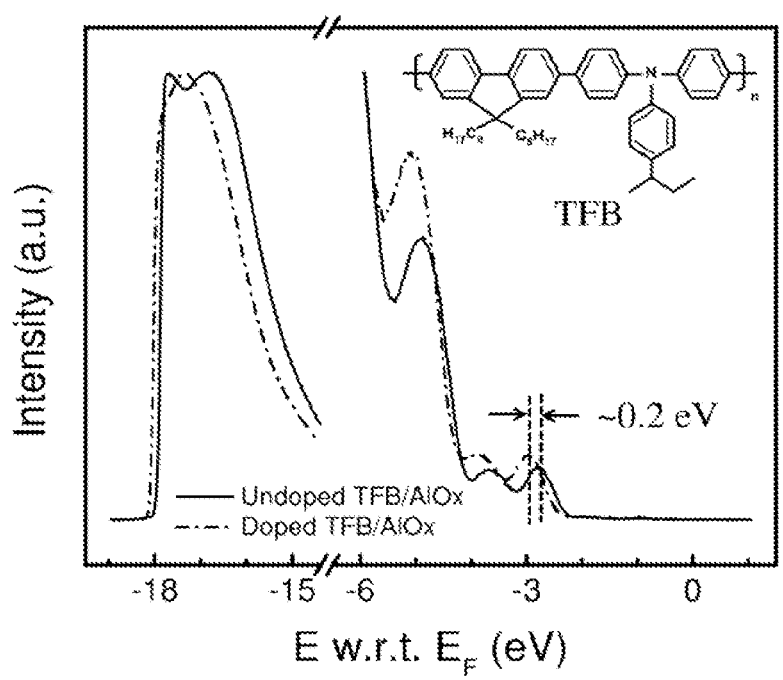
FIG. 15a shows UPS He I spectra acquired on undoped and 6 wt. % Rhodocene dimer-doped TFB films.
Figure 15B:
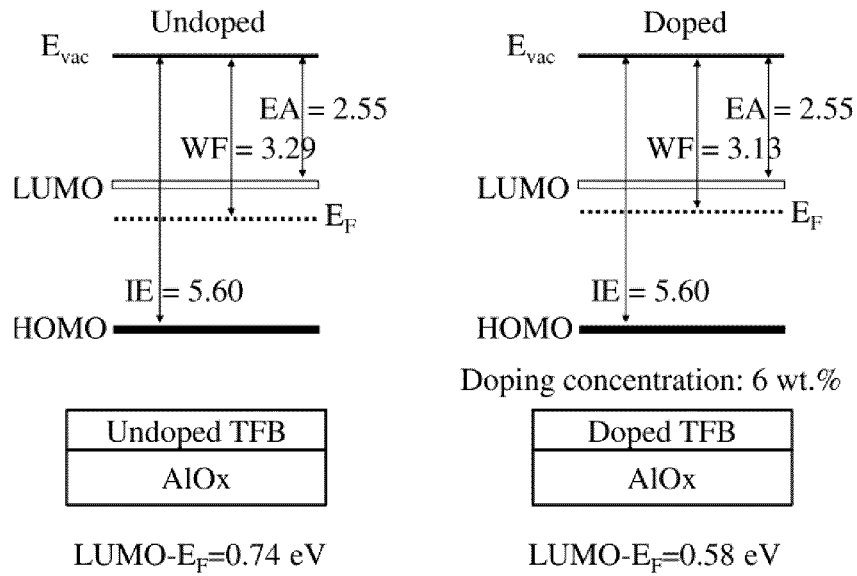
FIG. 15b shows corresponding energy level diagrams.
Figure 15C:
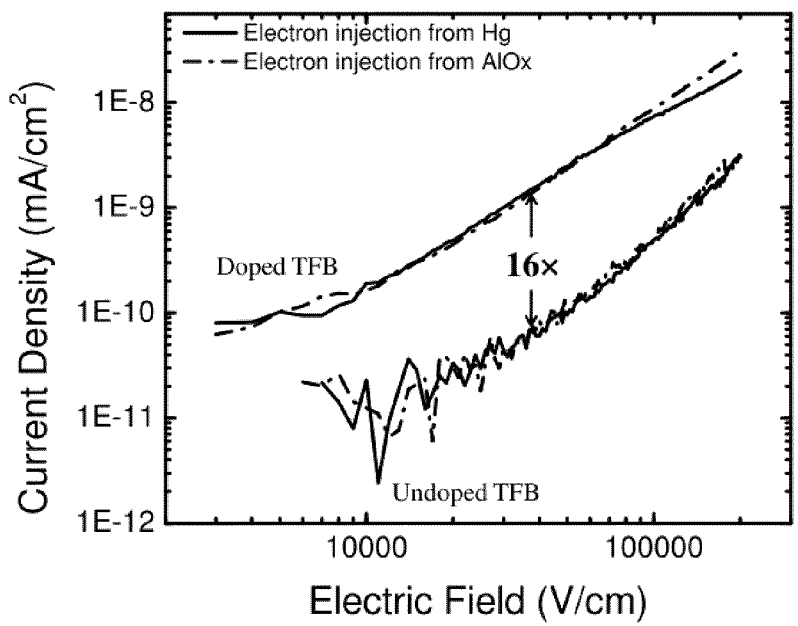
FIG. 15c shows the current density vs. electric field (J-F) curves acquired on the undoped and "rhodocene dimer doped" TFB films. See Example 10.

FIG. 15 a shows the UPS He I spectra acquired on the undoped and 6 wt. % RhCp dimer-doped TFB films. The ionization energy (IE) of TFB was found to be 5.60 eV for both films, in good agreement with earlier measurements by Hwang et al, [*J. Phys. Chem. C* 111, 1378 (2007)] and the electron affinity of both films was measured to be a relatively small 2.55 eV, indicating that the TFB LUMO is relatively high in energy compared to the other organic semiconductor materials examined. The whole spectrum of the "rhodocene dimer-doped" TFB film shifted towards higher binding energies (i.e. an upward Fermi level shift) by only a modest 0.2 eV upon doping. Annealing the rhodocene doped film in vacuum at 100° C. for 15 minutes did not produce additional shift in the Fermi level of the rhodocene dimer doped sample, raising doubts as to whether or not rhodocene dimer effectively n-dopes the LUMO of TFB. FIG. 15 b illustrates the only very small changes in energetic relationships between the electronic states of TFB induced by the attempted rhodocene dimer doping of TFB.

Film Conductivity of Undoped and "Rhodocene Dimer Doped" TFB Films

To prepare an undoped TFB solution, 27 mg TFB was dissolved in 1 ml chlorobenzene. To prepare a "rhodocene dinner doped" TFB solution, 27 mg TFB and 2 mg rhodocene dimer were mixed in 1 ml chlorobenzene and sonicated for 30 min, but there appeared to be undissolved rhodocene dimer left undissolved on the bottom of the bottle after sonication. Both solutions were prepared in an N$_2$ glove box. Films of undoped and doped TFB films (thickness ~100 nm) were prepared on AlO$_x$ substrates by spin casting in N$_2$ at 3000 RPM for 40 sec, and no post-annealing was performed. The AlOx substrates were obtained by vacuum deposition of Al (100 nm) on silicon (covered with a 5 nm Ti adhesion layer, followed by exposure to ambient. Under these conditions, Al develops a native oxide layer about 1-2 nm thick. [Vaynzof, J et al, Appl. Phys. Lett. 93, 103305 (2008)] I-V characteristics of the samples were measured with a Hg drop electrode setup in a N$_2$ glove box.

FIG. 15 *c* shows the current density vs. electric field (J-F) curves acquired on the undoped and "rhodocene dimer doped" TFB films. For both relatively polarities of the aluminum versus Hg electrodes, the conductivity of the "rhodocene dimer doped" TFB film was only approximately 16 times greater than that of the undoped TFB film.

While not wishing to be bound by theory, the spectroscopic and conductivity results could be rationalized to result from some limited reduction of deep trap states in the TFB film by rhodocene dimer, but that the rhodocene dimer may not be a sufficiently strong reductant to effectively n-dope the relatively high energy LUMO of TFB (EA=2.55 eV).

Film Conductivity of Undoped and "Rhodocene Dimer Doped" C60 Films

Figure 16:
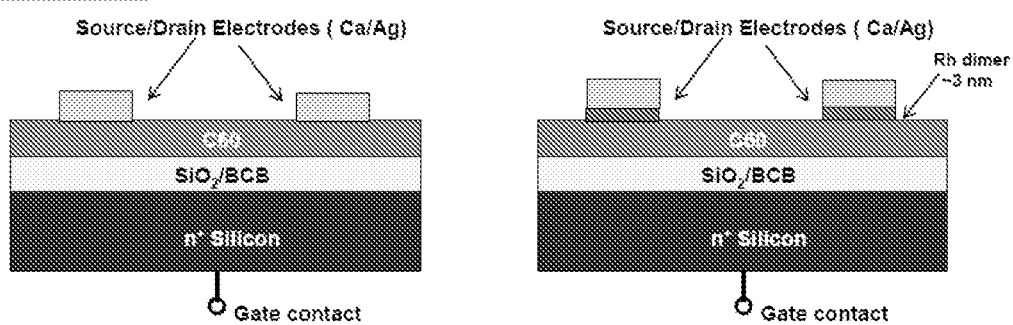
FIG. 16 shows an embodiment of a device with C60 as the n-type organic semiconducting material involving the local doping of source/drain contact electrodes.
Figure 16:
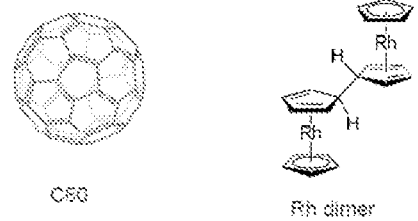
Figure 17A:
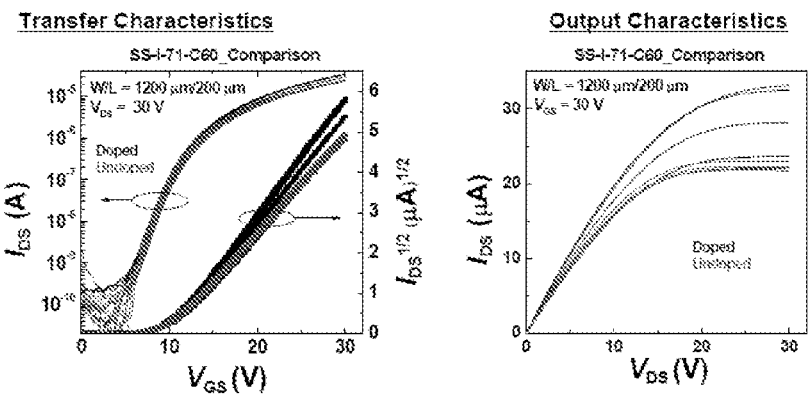
FIGS. 17a, 17b, 17c and 17d show embodiments of the transfer and output characteristics of various devices, as shown in FIG. 16, of doped versus undoped OFETs.
Figure 17B:
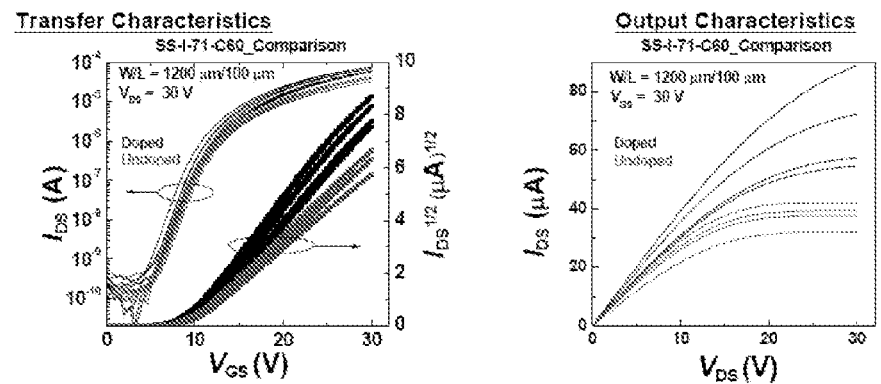
Figure 17C:
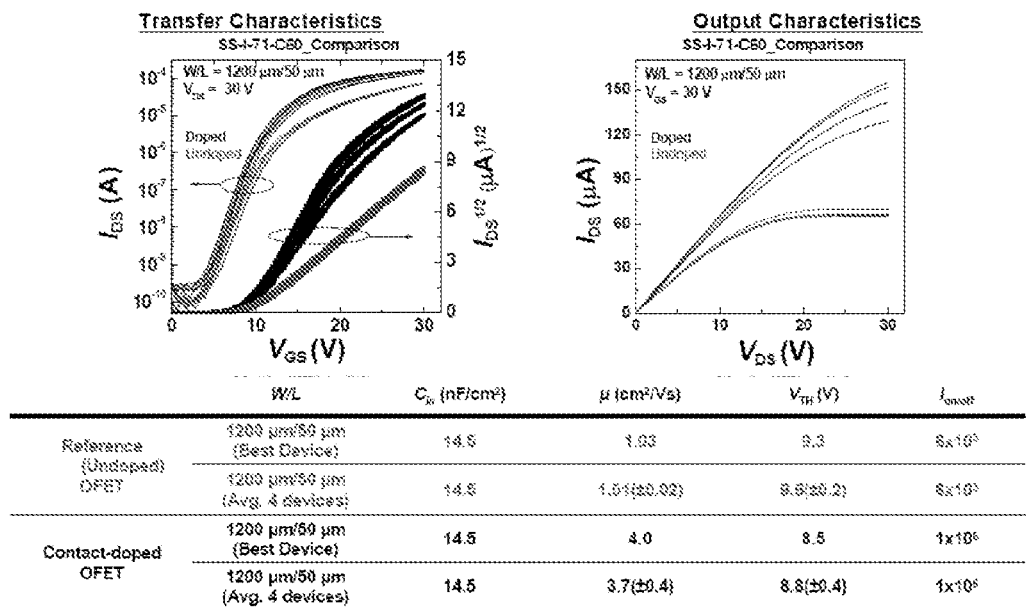
Figure 17D:
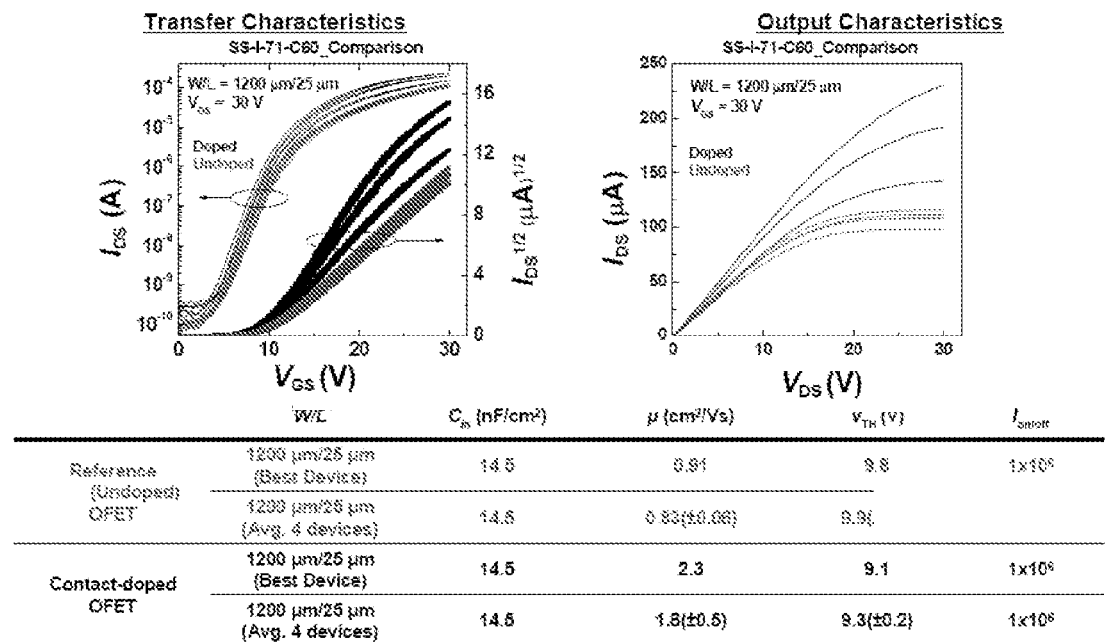

Devices were manufactured with C60 as a organic semiconducting material and a configuration as shown in FIG. 16. Various W/L configurations were tested, the results of which are shown in FIGS. 17 *a-d*, and summarized in the following table:

|  | W/L | C$_{in}$ (nF/cm$^2$) | μ (cm$^2$/Vs) | V$_{TH}$(V) | I$_{on/off}$ |
|---|---|---|---|---|---|
| Reference (Undoped) OFET | 1200 μm/25 μm (Avg. 4 devices) | 14.5 | 0.83(±0.06) | 9.9(±0.1) | 1 × 106 |
|  | 1200 μm/50 μm (Avg. 4 devices) | 14.5 | 1.01(±0.02) | 9.6(±0.2) | 6 × 105 |
|  | 1200 μm/100 μm (Avg. 4 devices) | 14.5 | 1.1(±0.1) | 9.7(±0.3) | 5 × 105 |
|  | 1200 μm/200 μm (Avg. 4 devices) | 14.5 | 1.34(±0.01) | 9.6(±0.1) | 1 × 106 |
| Contact-doped OFET | 1200 μm/25 μm (Avg. 4 devices) | 14.5 | 1.8(±0.5) | 9.3(±0.2) | 1 × 106 |
|  | 1200 μm/50 μm (Avg. 4 devices) | 14.5 | 3.7(±0.4) | 8.8(±0.4) | 1 × 106 |
|  | 1200 μm/100 μm (Avg. 4 devices) | 14.5 | 2.0(±0.3) | 8.0(±1.8) | 2 × 106 |
|  | 1200 μm/200 μm (Avg. 4 devices) | 14.5 | 1.8(±0.3) | 10.1(±0.1) | 2 × 106 |

CONCLUSIONS

The above specification, examples and data provide exemplary description of the manufacture and use of the various compositions and devices of the inventions, and methods for their manufacture and use. In view of those disclosures, one of ordinary skill in the art will be able to envision many additional embodiments of the inventions disclosed and claimed herein to be obvious, and that they can be made without departing from the scope of the inventions and disclosures. The claims hereinafter appended define some of those embodiments.

What is claimed is:

1. A process for n-doping and/or increasing the current carrying capacity of an organic semiconductor composition or organic semiconductor compound, comprising
    a) obtaining or providing an organic semiconductor composition or organic semiconductor compound that comprises at least two aryl or heteroaryl rings bonded to each other;
    b) obtaining or providing a bis-metallosandwich compound comprising two linked metallosandwich groups, wherein
        i) each metallosandwich group comprises a transition metal atom independently selected from manganese, rhenium, iron, ruthenium, osmium, cobalt, rhodium, and iridium, bonded to two aryl or heteroaryl rings that include at least one optionally substituted benzene or cyclopentadienyl ring, and
        ii) one benzene or cyclopentadienyl ring from each metallosandwich group is bonded to a benzene or cyclopentadienyl ring from the other metallosandwich group by a carbon-carbon bond; and
    c) contacting the organic semiconductor composition or organic semiconductor compound with at least some of the bis-metallosandwich compound,
    wherein upon or subsequent to contact with the organic semiconductor composition or organic semiconductor compound the carbon-carbon bond linking the rings or the two metallosandwich groups is broken and at least some monomeric metallosandwich cations are formed.

2. The process of claim 1, wherein the formation of the metallosandwich cations is accompanied by at least partial reduction of the organic semiconductor composition or semiconductor compounds, and optionally, wherein the n-doped organic semiconductor composition or organic semiconductor compound produced by the process comprises at least some of the metallosandwich cations and/or wherein the n-doped organic semiconductor composition or organic semiconductor compound produced by the process comprises at least some anions or the organic semiconductor composition or organic semiconductor compounds.

3. The process of claim 1, wherein the organic semiconductor composition or organic semiconductor compound and the bis-metallosandwich compound obtained or provided are individually deposited or co-deposited by a vapor phase process onto the surface of a substrate, electrode, or other precursor of an electrical device, to form a solid layer on the surface comprising at least some of the organic semiconductor composition or organic semiconductor compound, and at least some of the bis-metallosandwich compound or metallosandwich cations, or a mixture thereof.

4. The process of claim 1, wherein the organic semiconductor composition or organic semiconductor compound or mixture thereof is dispersed or dissolved in a liquid solvent during step c, to form a liquid solution or dispersion, and optionally, wherein the liquid solution or dispersion is applied to the surface of a substrate, electrode, and/or precursor of an electrical device, and the solvent is removed, to form a solid layer on the surface comprising at least some of the organic semiconductor composition or organic semiconductor compound.

5. The process of claim 1, wherein the bis-metallosandwich compound employed in the process comprises about 0.001% to about 30% by weight of the organic semiconductor composition or at least one organic semiconductor compound employed, and/or wherein the metallosandwich cations comprise about 0.001% to about 30% by weight of the organic semiconductor composition or at least one organic semiconductor compound produced.

6. The process of claim 1, wherein the transition metal atoms of the bis-metallosandwich compound are independently selected from iron, ruthenium, osmium, rhodium, and iridium, or mixtures thereof.

7. The process of claim 1, wherein the bis-metallosandwich compound has one of the structures:

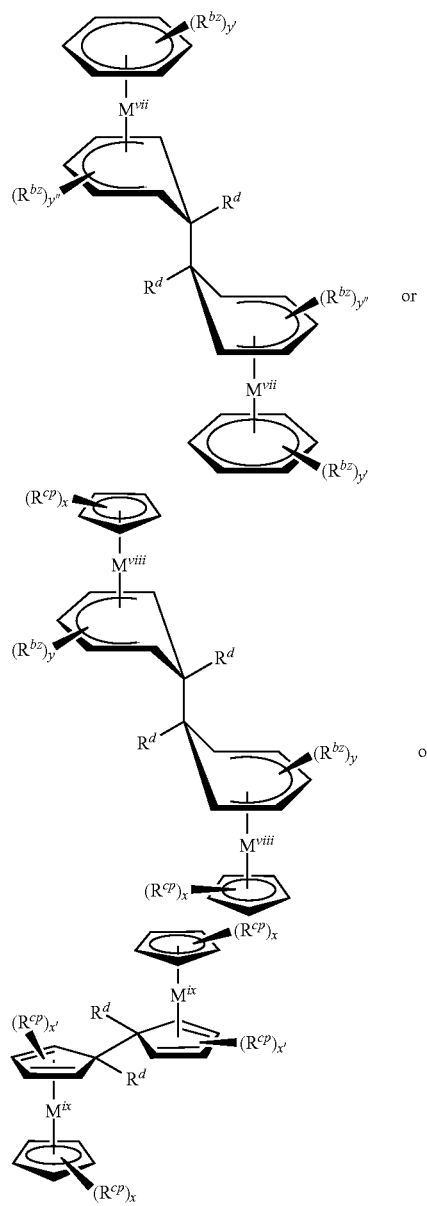

wherein a) $M^{vii}$ is manganese or rhenium, b) $M^{viii}$ is iron, ruthenium, or osmium, c) $M^{ix}$ is rhodium or iridium, d) each $R^{cp}$, $R^{bz}$, and $R^d$ is individually selected from hydrogen or an optionally substituted $C_1$-$C_{12}$ alkyl or $C_1$-$C_{12}$ phenyl, e) x' is an integer from 1-5, f) x" is an integer from 1-4, and g) y and y" are an integer from 1-5 h) y' is an integer from 1-6.

8. The process of claim 1, wherein the bis-metallosandwich compound has one of the structures:

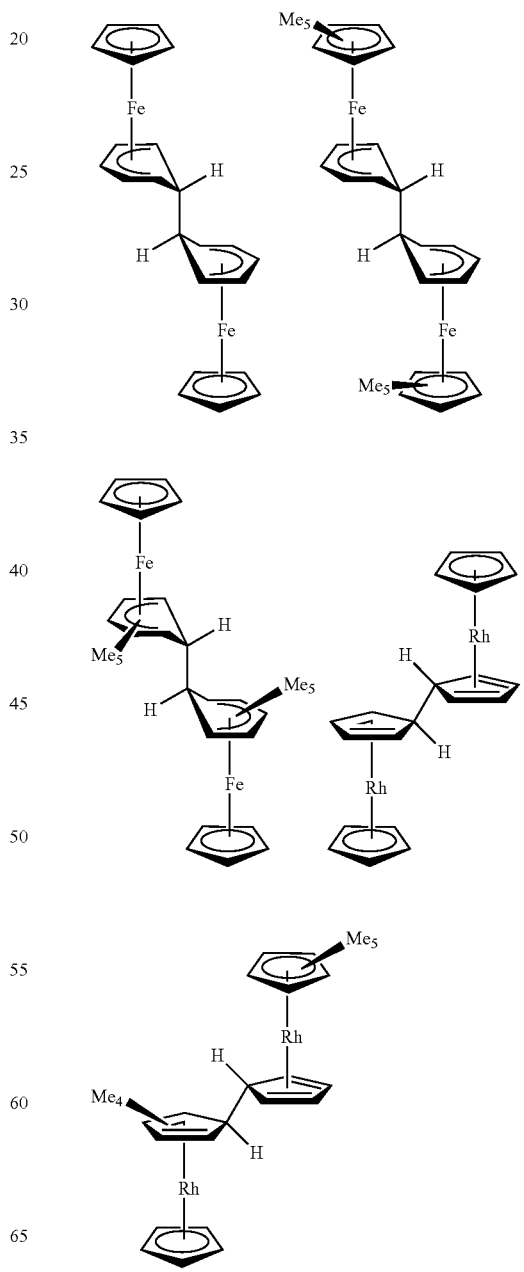

-continued

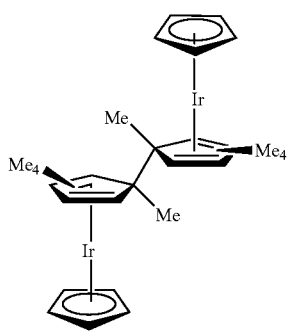
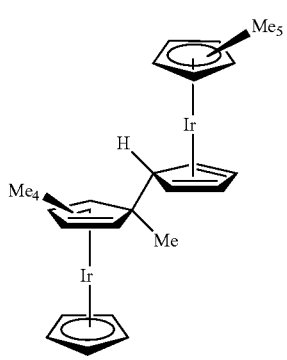
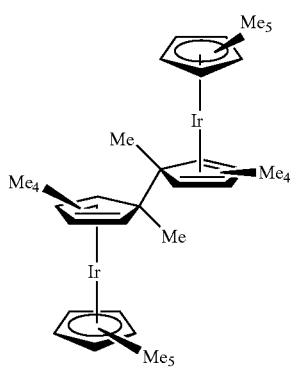
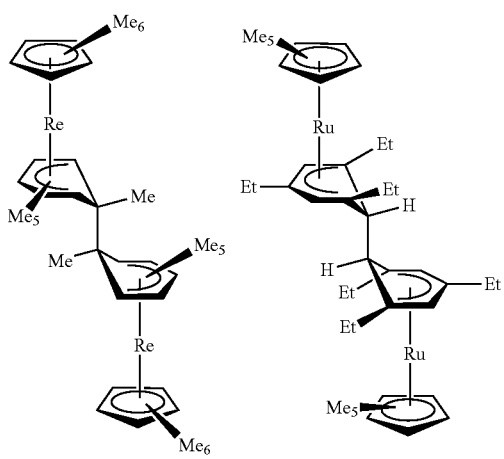

-continued

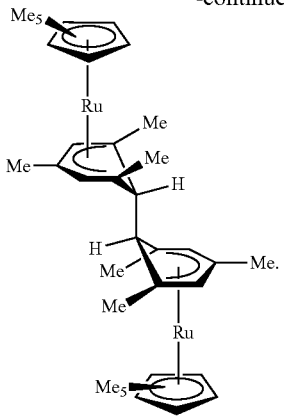

9. The process of claim 1, wherein the metallosandwich cations have the structure

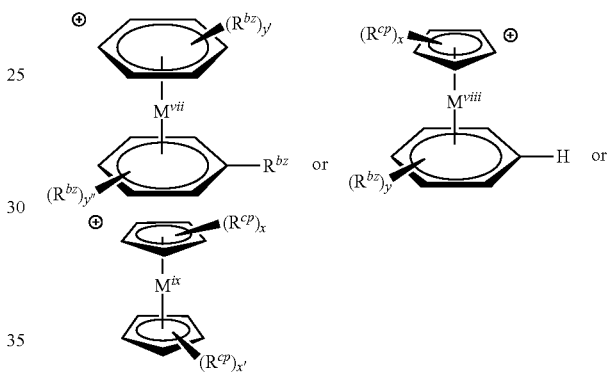

wherein
a) $M^{vii}$ is manganese or rhenium,
b) $M^{vii}$ is iron, ruthenium, or osmium,
c) $M^{ix}$ is rhodium or iridium,
d) each $R^{cp}$ and $R^{bz}$ is individually selected from hydrogen or an optionally substituted $C_1$-$C_{12}$ alkyl group or $C_1$-$C_{12}$ phenyl group,
e) x is an integer from 1-5,
f) x' is an integer from 1-5, and
g) y and y'' are an integer from 1-5
h) y' is an integer from 1-6.

10. The process of claim 1, wherein the organic semiconductor composition or at least one organic semiconductor compound obtained or provided is capable of conducting electrons or holes with a mobility of at least $1 \times 10^{-6}$ cm$^2$/V_sec, as measured from a thin film transistor having a bottom gate, bottom contact geometry, employing doped silicon as a gate material, silicon dioxide as a gate dielectric, using gold source and drain electrodes with a chromium adhesive layer at a channel width of 400-800 μm and lengths of 20-40 μm, and employing the organic semiconductor composition or at least one organic semiconductor compound as the active semiconductor.

11. The process of claim 1, wherein the aryl rings of the organic semiconductor composition or organic semiconductor compound obtained or provided are selected from phenyl, 1-naphthyl, 2-naphthyl, anthracenyl, phenanthrenyl, and pentacenyl rings, fullerenes or fullerene derivatives, or mixtures thereof, and wherein the heteroaryl rings of the organic semiconductor composition or organic semiconductor compound obtained or provided are selected from furyl, thienyl, pyridyl, pyrimidyl, pyridazinyl, pyrazinyl, phenanthrolinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzoisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl, phthalocyanine, perylenediimide, or napthalenediimide rings.

12. An organic semiconductor composition or an organic semiconductor compound produced by the process of claim 1.

13. An electronic device comprising the organic semiconductor composition of claim 1, wherein the electronic device is optionally an organic light emitting diode, an organic photovoltaic device, or a transistor.

\* \* \* \* \*